United States Patent
Choi et al.

(10) Patent No.: US 12,557,453 B2
(45) Date of Patent: Feb. 17, 2026

(54) ELECTRONIC DEVICE

(71) Applicant: Samsung Display Co., Ltd., Yongin-si (KR)

(72) Inventors: Kyung Hyun Choi, Yongin-si (KR); Donghyun Son, Yongin-si (KR); Sola Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 286 days.

(21) Appl. No.: 18/361,994

(22) Filed: Jul. 31, 2023

(65) Prior Publication Data
US 2024/0055572 A1    Feb. 15, 2024

(30) Foreign Application Priority Data

Aug. 10, 2022    (KR) ........................ 10-2022-0099736

(51) Int. Cl.
| | |
|---|---|
| *H10H 20/857* | (2025.01) |
| *G06F 1/16* | (2006.01) |
| *H01L 25/075* | (2006.01) |
| *H01L 25/16* | (2023.01) |
| *H04M 1/02* | (2006.01) |
| *H10W 90/00* | (2026.01) |

(52) U.S. Cl.
CPC ......... *H10H 20/857* (2025.01); *G06F 1/1616* (2013.01); *H04M 1/0216* (2013.01); *H10W 90/00* (2026.01)

(58) Field of Classification Search
CPC .. H10H 20/857; H10H 29/142; G06F 1/1616; H01L 25/0753; H01L 25/167; H04M 1/0216; H10K 59/126; H10K 59/352; H10K 59/353; H10K 59/131; H10K 59/121; H10K 59/30; H10K 50/11; H10K 59/123
See application file for complete search history.

(56) References Cited

U.S. PATENT DOCUMENTS

| | | |
|---|---|---|
| 2021/0202588 A1 | 7/2021 | Cho et al. |
| 2021/0335920 A1 | 10/2021 | Hong et al. |
| 2022/0352280 A1* | 11/2022 | Park .................... H10K 59/1213 |

(Continued)

FOREIGN PATENT DOCUMENTS

| | | |
|---|---|---|
| CN | 110047897 | 7/2019 |
| CN | 113178537 | 7/2021 |

*Primary Examiner* — Victor A Mandala
(74) *Attorney, Agent, or Firm* — PHARNESS, DICKEY & PIERCE, P.L.C.

(57) ABSTRACT

An electronic device includes a display panel with a first area including a transmissive area, an element area, and connection areas extending from the element area, and a second area. The display panel includes a first light emitting unit in the element area and including first, second, and third light emitting elements, and a first copy light emitting unit in the connection areas, including copy light emitting elements, and operating in synchronization with the first light emitting unit. The connection areas include a first connection area adjacent to the first light emitting element, a second connection area adjacent to the second light emitting element, and third and fourth connection areas adjacent to the third light emitting element. An emission color of the first light emitting element is different from an emission color of a first copy light emitting element of the copy light emitting elements in the first connection area.

32 Claims, 30 Drawing Sheets

(56) References Cited

U.S. PATENT DOCUMENTS

| | | | |
|---|---|---|---|
| 2022/0376017 A1* | 11/2022 | Choi | H10K 59/131 |
| 2023/0067816 A1* | 3/2023 | Bok | H10K 59/1213 |
| 2023/0108247 A1* | 4/2023 | Choi | H10K 59/40 |
| | | | 345/174 |
| 2023/0157069 A1* | 5/2023 | Ma | H10K 59/124 |
| | | | 257/40 |
| 2023/0209891 A1* | 6/2023 | Ma | H10K 59/8051 |
| | | | 257/40 |
| 2024/0023401 A1* | 1/2024 | Choi | H10D 86/60 |
| 2024/0023404 A1* | 1/2024 | Choi | H10K 59/8792 |
| 2025/0097328 A1* | 3/2025 | Son | H10H 20/857 |

* cited by examiner

ELECTRONIC DEVICE

CROSS-REFERENCE TO RELATED APPLICATION(S)

This application claims priority to and benefits of Korean Patent Application No. 10-2022-0099736 under 35 U.S.C. § 119, filed on Aug. 10, 2022, the entire contents of which are incorporated hereby by reference.

BACKGROUND

1. Technical Field

Embodiments relate to an electronic device including a display panel with a component area having a high transmittance.

2. Description of the Related Art

The electronic device may be a device with various electronic components such as a display panel and an electronic module. The electronic module may include a camera, an infrared sensor, or a proximity sensor. The electronic module may be disposed under the display panel. Transmittance of some areas of the display panel may be higher than transmittance of other partial areas of the display panel. The electronic module may receive an external input through a partial area of the display panel or provide an output through a partial area of the display panel.

SUMMARY

Embodiments provide an electronic device including a display panel with improved display quality.

However, embodiments of the disclosure are not limited to those set forth herein. The above and other embodiments will become more apparent to one of ordinary skill in the art to which the disclosure pertains by referencing the detailed description of the disclosure given below.

In an embodiment, an electronic device may include a display panel including a first area including a transmissive area, an element area, and a plurality of connection areas extending from the element area, and a second area spaced apart from the first area, wherein the display panel may include: a first light emitting unit disposed in the element area and including a first light emitting element, a second light emitting element, and a third light emitting element; and a first copy light emitting unit disposed in the plurality of connection areas, including a plurality of copy light emitting elements, and operating in synchronization with the first light emitting unit, wherein the plurality of connection areas may include a first connection area adjacent to the first light emitting element, a second connection area adjacent to the second light emitting element, and third and fourth connection areas adjacent to the third light emitting element, and wherein an emission color of the first light emitting element may be different from an emission color of a first copy light emitting element of the plurality of copy light emitting elements disposed in the first connection area.

In an embodiment, the first copy light emitting element may be electrically connected to the third light emitting element, and the first copy light emitting element and the third light emitting element may be configured to emit light simultaneously.

In an embodiment, the plurality of copy light emitting elements may further include a second copy light emitting element disposed in the second connection area, a third copy light emitting element disposed in the third connection area, and a fourth copy light emitting element disposed in the fourth connection area.

In an embodiment, the second copy light emitting element may be electrically connected to the first light emitting element, and the second copy light emitting element and the first light emitting element may be configured to emit light simultaneously.

In an embodiment, the third copy light emitting element and the fourth copy light emitting element may be electrically connected to the second light emitting element, and the second light emitting element, the third copy light emitting element and the fourth copy light emitting element may be configured to emit light simultaneously.

In an embodiment, the second copy light emitting element, the third copy light emitting element and the fourth copy light emitting element may be electrically connected to the second light emitting element, and the second light emitting element, the second copy light emitting element, the third copy light emitting element and the fourth copy light emitting element may be configured to emit light simultaneously.

In an embodiment, the second light emitting element, the second copy light emitting element, the third copy light emitting element and the fourth copy light emitting element may be configured to emit green light.

In an embodiment, the plurality of copy light emitting elements may further include a second copy light emitting element disposed in the second connection area, and a third copy light emitting element disposed in one of the third connection area and the fourth connection area.

In an embodiment, the display panel may further include: a second light emitting unit disposed in another element area of the first area; and a second copy light emitting unit that operates in synchronization with the second light emitting unit, wherein the second copy light emitting unit may include an adjacent copy light emitting element disposed in another one of the third connection area and the fourth connection area.

In an embodiment, an emission color of the adjacent copy light emitting element and the emission color of the first light emitting element may be same as each other.

In an embodiment, an emission color of the adjacent copy light emitting element and an emission color of the third light emitting element may be same as each other.

In an embodiment, a connection line connecting the second light emitting element and the third copy light emitting element may be disposed between the adjacent copy light emitting element and the third light emitting element.

In an embodiment, the display panel may further include a plurality of adjacent copy light emitting elements disposed adjacent to the first copy light emitting unit; wherein at least one of the plurality of copy light emitting elements and at least one of the plurality of adjacent copy light emitting elements may be disposed in each of the first to fourth connection areas.

In an embodiment, the display panel may further include a plurality of adjacent copy light emitting elements disposed adjacent to the first copy light emitting unit, wherein one of the plurality of copy light emitting elements and one of the plurality of adjacent copy light emitting elements may be disposed in two connection areas of the first to fourth connection areas, another one of the plurality of copy light emitting elements may be disposed in another connection area of the first to fourth connection areas, and another one of the plurality of adjacent copy light emitting elements may be disposed in the other connection area of the first to fourth connection areas.

In an embodiment, an emission color of the another one of the plurality of copy light emitting elements disposed in the another connection area and an emission color of the another one of the plurality of adjacent copy light emitting elements disposed in the other connection area may be same as each other.

In an embodiment, a maximum width of an emission area defined in the another one of the plurality of copy light emitting elements disposed in the another connection area may be greater than a maximum width of an emission area defined in the one of the plurality of copy light emitting elements disposed in the two connection areas.

In an embodiment, the display panel may further include: a base layer; a barrier layer disposed on the base layer and including a first lower light blocking layer disposed in the first area and a second lower light blocking layer disposed in the second area; and a circuit layer disposed on the barrier layer and disposed in the element area, the circuit layer including a first pixel circuit, a second pixel circuit, and a third pixel circuit, wherein the first light emitting unit and the first copy light emitting unit may be disposed on the circuit layer, the first light emitting element may be electrically connected to the first pixel circuit, the second light emitting element may be electrically connected to the second pixel circuit, and the third light emitting element may be electrically connected to the third pixel circuit, and an opening overlapping the transmissive area is formed in the first lower light blocking layer.

In an embodiment, when viewed in a plan view, a sidewall of the first lower light blocking layer defining the opening may have a rounded shape.

In an embodiment, when viewed in a plan view, the opening may be circular.

In an embodiment, when viewed in a plan view, the opening may have a straight edge portion and a curved edge portion, and a center of curvature of the curved edge portion may overlap the opening.

In an embodiment, when viewed in a plan view, the opening may have a curved edge portion, and a center of curvature of the curved edge portion may not overlap the opening.

In an embodiment, an emission area defined in each of the plurality of copy light emitting elements may have a curved edge portion.

In an embodiment, an emission area defined in each of the plurality of copy light emitting elements may include straight edge portions and curved edge portions connected to the straight edge portions.

In an embodiment, an electronic device may include a display panel including a first area including a transmissive area, an element area, and a plurality of connection areas extending from the element area, and a second area spaced apart from the first area, wherein the display panel may include: a first light emitting unit disposed in the element area and including a first light emitting element, a second light emitting element, and a third light emitting element; and a first copy light emitting unit including a plurality of copy light emitting elements disposed in the plurality of connection areas, and operating in synchronization with the first light emitting unit, the plurality of connection areas may include a first connection area adjacent to the first light emitting element, a second connection area adjacent to the second light emitting element, and third and fourth connection areas adjacent to the third light emitting element, the plurality of copy light emitting elements may include a first copy light emitting element disposed in the first connection area, a second copy light emitting element disposed in the second connection area, and a third copy light emitting element disposed in one of the third connection area and the fourth connection area, and the third copy light emitting element may be electrically connected to the second light emitting element.

In an embodiment, the first copy light emitting element and the second copy light emitting element may be electrically connected to the second light emitting element.

In an embodiment, the first copy light emitting element may be electrically connected to the third light emitting element, and the second copy light emitting element may be electrically connected to the first light emitting element.

In an embodiment, the plurality of copy light emitting elements may further include a fourth copy light emitting element disposed in another one of the third connection area and the fourth connection area.

In an embodiment, when viewed in a plan view, the transmissive area may be circular.

In an embodiment, when viewed in a plan view, an edge portion of the transmissive area may include a straight edge portion and a curved edge portion, and a center of curvature of the curved edge portion may overlap the transmissive area.

In an embodiment, when viewed in a plan view, an edge portion of the transmissive area may include a plurality of curved edge portions, and a center of curvature of each of the plurality of curved edge portions may not overlap the transmissive area.

In an embodiment, an emission area defined in each of the plurality of copy light emitting elements may have a curved edge portion.

In an embodiment, an emission area defined in each of the plurality of copy light emitting elements may include straight edge portions and curved edge portions connected to the straight edge portions.

BRIEF DESCRIPTION OF THE DRAWINGS

The accompanying drawings are included to provide a further understanding of the invention, and are incorporated in and constitute a part of the description. The drawings illustrate embodiments and, together with the description, serve to explain principles of the invention. In the drawings.

DETAILED DESCRIPTION OF THE EMBODIMENTS

Figure 1A:
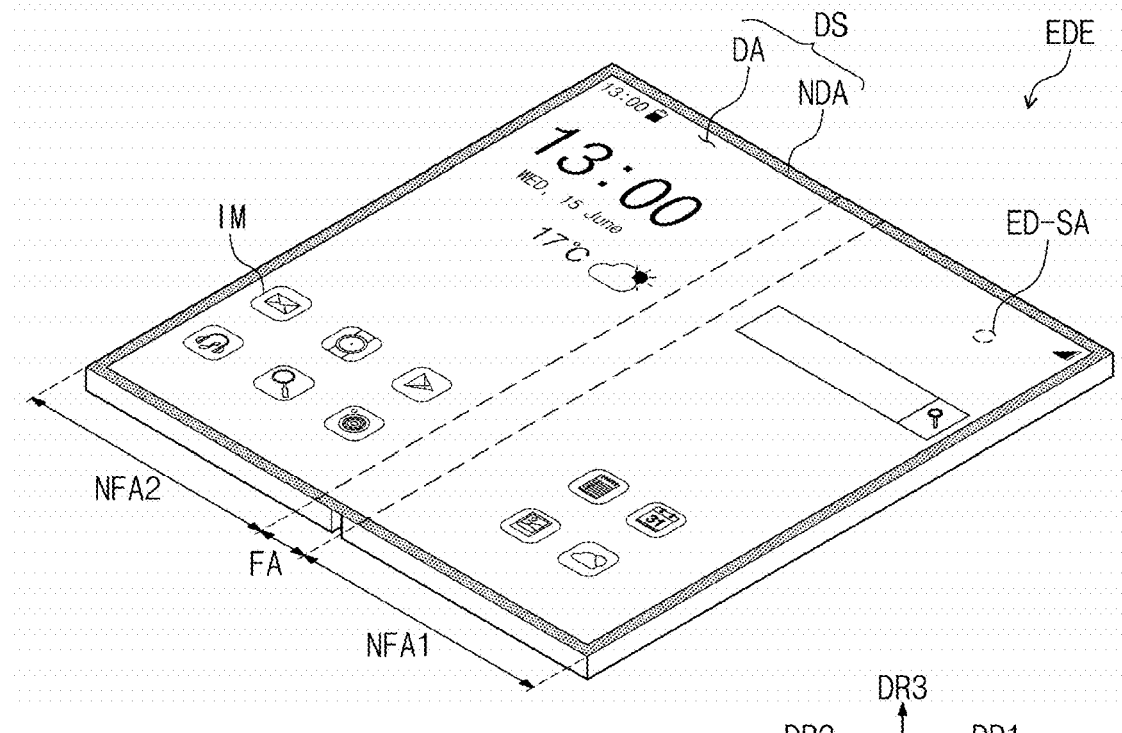
FIGS. 1A and 1B are schematic perspective views of an electronic device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the drawings.

Figure 1B:
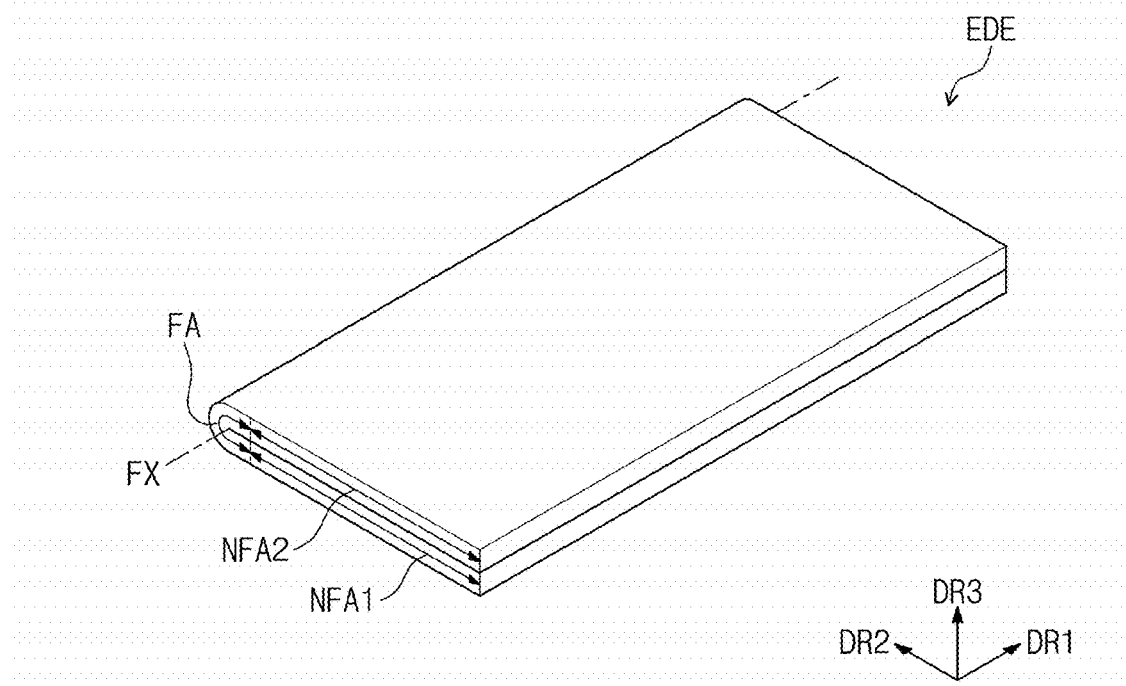

FIGS. 1A and 1B are schematic perspective views of an electronic device EDE according to an embodiment. FIG. 1A illustrates an unfolded state (or an unfolding state) of the electronic device EDE, and FIG. 1B illustrates a folded state of the electronic device EDE.

Referring to FIGS. 1A and 1B, the electronic device EDE according to an embodiment may include a display surface DS defined by a first direction DR1 and a second direction DR2 crossing the first direction DR1. The electronic device EDE may provide the image IM to the user through the display surface DS.

The display surface DS may include a display area DA and a non-display area NDA around the display area DA. The display area DA may display the image IM, and the non-display area NDA may not display the image IM. The non-display area NDA may surround the display area DA. However, embodiments are not limited thereto, and the shape of the display area DA and the shape of the non-display area NDA may be modified.

Hereinafter, the direction substantially perpendicular to the plane defined by the first direction DR1 and the second direction DR2 is defined as the third direction DR3. In the description, "in a plan view" may be defined as a state viewed from the third direction DR3.

A sensor area ED-SA may be defined within the display area DA of the electronic device EDE. Although one sensor area ED-SA is illustrated in FIG. 1A, the number of sensor areas ED-SA is not limited thereto. The sensor area ED-SA may be a part of the display area DA. Accordingly, the electronic device EDE may display an image through the sensor area ED-SA.

An electronic module may be disposed in an area overlapping the sensor area ED-SA. The electronic module may receive an external input transmitted through the sensor area ED-SA or may provide an output through the sensor area ED-SA. For example, the electronic module may be a camera module, a sensor that measures distance, such as a proximity sensor, a sensor that recognizes a part of the user's body (e.g., fingerprint, iris, or face), or a small lamp that outputs light, but embodiments are not limited thereto. Hereinafter, as an example, an electronic module overlapping the sensor area ED-SA will be described a camera module.

The electronic device EDE may include a folding area FA and non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA may be referred to as a foldable area, and the first and second non-folding areas NFA1 and NFA2 may be referred to as first and second non-foldable areas, respectively.

As illustrated in FIG. 1B, the folding area FA may be folded based on a folding axis FX parallel to the first direction DR1. In a state in which the electronic device EDE is folded, the folding area FA may have a certain curvature and a radius of curvature. The first non-folding area NFA1 and the second non-folding area NFA2 may face each other, and the electronic device EDE may be inner folded such that the display surface DS may not be exposed to the outside.

In an embodiment, the electronic device EDE may be outer folded so that the display surface DS may be exposed to the outside. In an embodiment, the electronic device EDE may be inner folded or outer folded through an unfolding operation, but embodiments are not limited thereto. In an embodiment, the electronic device EDE may select one of an unfolding operation, an inner folding operation, and an outer folding operation. In an embodiment, folding axes are defined in the electronic device EDE, and inner folding or outer folding may be performed based on each of the folding axes by an unfolding operation.

Although a foldable electronic device EDE is described as an example in FIGS. 1A and 1B, embodiments are not limited to the foldable electronic device EDE. For example, the electronic device EDE may include a rigid electronic device, for example, an electronic device that does not include a folding area FA.

Figure 2A:
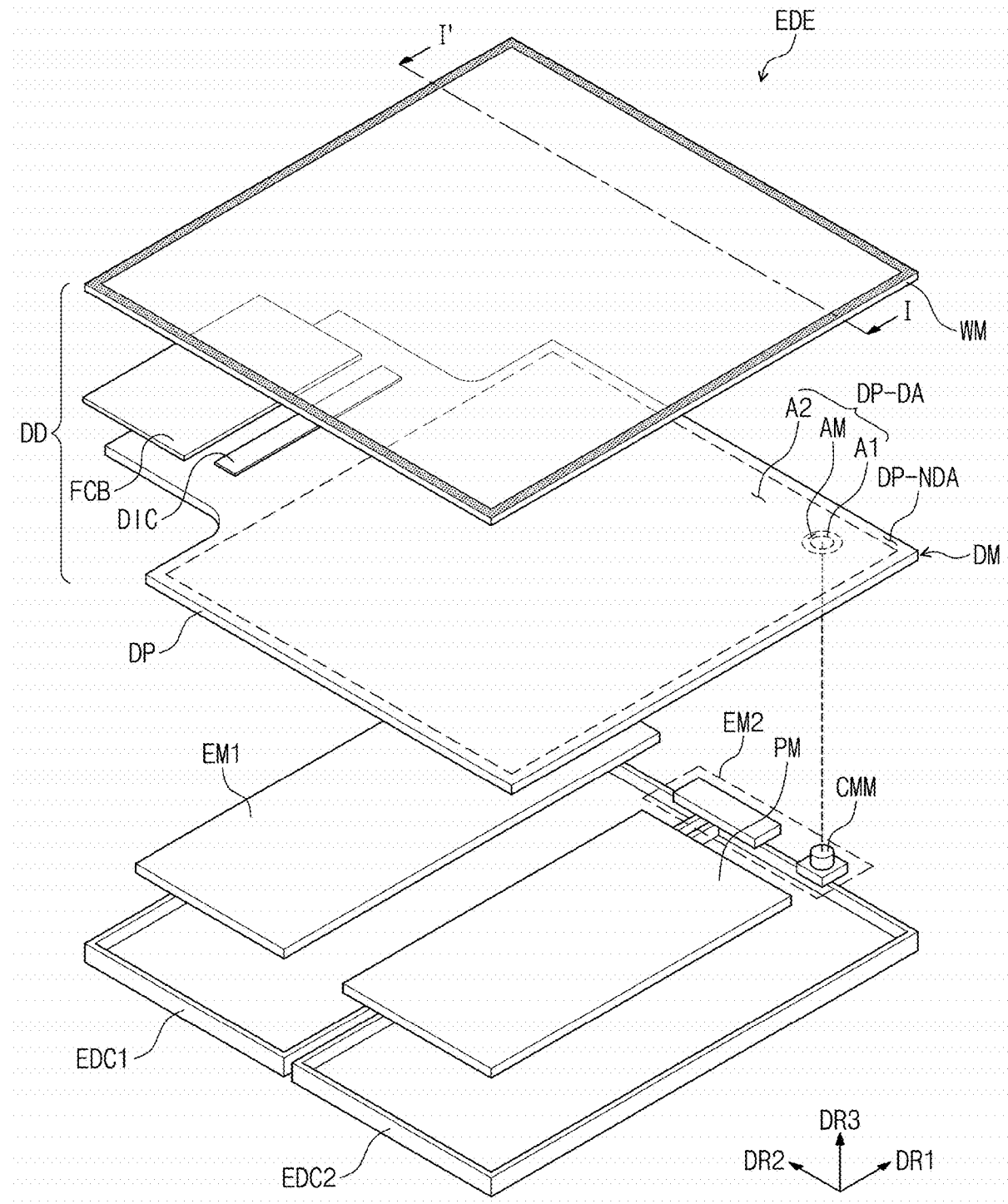
FIG. 2A is a schematic exploded perspective view of an electronic device according to an embodiment.
Figure 2B:
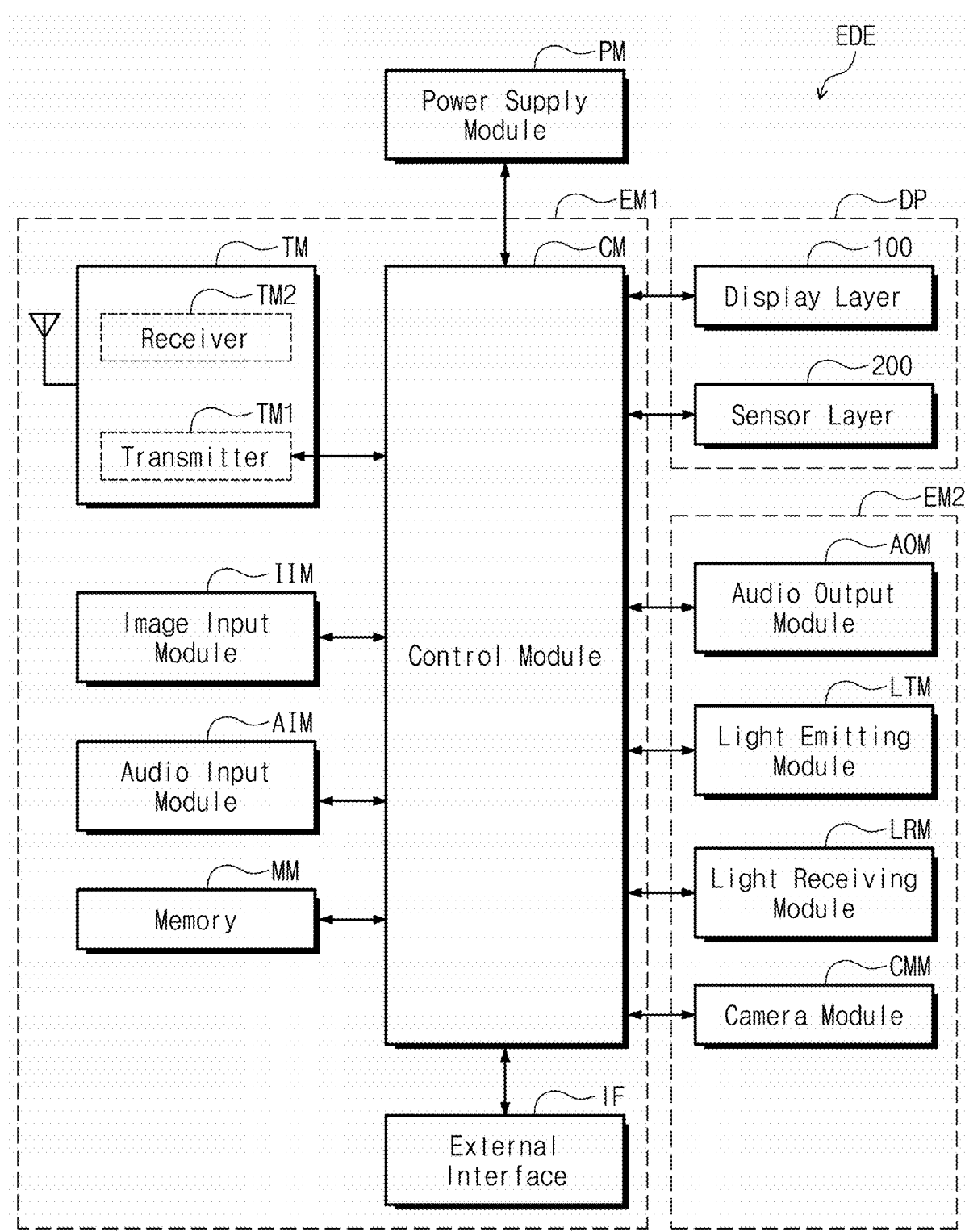
FIG. 2B is a block diagram of an electronic device according to an embodiment.

FIG. 2A is a schematic exploded perspective view of an electronic device EDE according to an embodiment. FIG. 2B is a block diagram of an electronic device EDE according to an embodiment.

Referring to FIGS. 2A and 2B, the electronic device EDE may include a display device DD, a first electronic module EM1, a second electronic module EM2, a power supply module PM, and housings EDC1 and EDC2. The electronic device EDE may further include a mechanical structure for controlling a folding operation of the display device DD.

The display device DD may include a window module WM and a display module DM. The window module WM provides the front surface of the electronic device EDE. The display module DM may include at least the display panel DP. The display module DM may generate an image and senses an external input.

Although the display module DM is illustrated as being the same as the display panel DP in FIG. 2A, the display module DM may be a stacked structure in which components including the display panel DP are stacked. A detailed description of the stacked structure of the display module DM will be described below.

The display panel DP may include a display area DP-DA and a non-display area DP-NDA corresponding to the display area DA of FIG. 1A and the non-display area NDA of FIG. 1A of the electronic device EDE, respectively. In the description, "the region/part and the region/part correspond" means overlapping and is not limited to the same area.

The display area DP-DA may include a first area A1, a second area A2, and a middle area AM. The second area A2 may be spaced apart from the first area A1, and the middle area AM may be defined between the first area A1 and the second area A2.

The first area A1 may overlap or correspond to the sensor area ED-SA of FIG. 1A of the electronic device EDE. In this embodiment, the first area A1 is shown in the shape of a circle, but may have various shapes, such as a polygon, an ellipse, a figure having at least one curved side, or an irregular shape, and embodiments are not limited thereto.

The first area A1 may be referred to as a component area, and the second area A2 may be referred to as a main display area or a general display area. The first area A1 may have a higher transmittance than the second area A2. In another example, the resolution of the first area A1 may be lower than that of the second area A2, but embodiments are not limited thereto. For example, the first area A1 may have a higher transmittance than the second area A2, but the resolution of the first area A1 may be substantially the same as the resolution of the second area A2. The first area A1 may overlap a camera module CMM to be described below.

The arrangement density of pixels arranged in the first area A1 may be lower than the arrangement density of pixels arranged in the second area A2.

A pixel disposed in the middle area AM may include emission areas. Accordingly, as a copy light emitting element that does not include a pixel circuit is provided in the middle area AM where it is difficult to arrange a pixel circuit due to space constraints, a boundary between the first area A1 and the second area A2 may not be visually recognized as dark. Accordingly, the visibility of a boundary between the first area A1 and the second area A2 having different pixel arrangement densities may be reduced by the middle area AM.

The display panel DP may include a display layer 100 and a sensor layer 200.

The display layer 100 may substantially generate an image. The display layer 100 may be a light emitting display layer, and for example, the display layer 100 may be an organic light emitting display layer, an inorganic light emitting display layer, an organic-inorganic light emitting display layer, a quantum dot display layer, a micro LED display layer, or a nano LED display layer.

The sensor layer 200 may detect an external input applied from the outside. The external input may be a user's input. The user's input may include various types of external inputs such as a part of the user's body, light, heat, pen, or pressure.

The display module DM may include a driving chip DIC disposed on the non-display area DP-NDA. The display module DM may further include a flexible circuit film FCB coupled to the non-display area DP-NDA.

The driving chip DIC may include driving elements for driving pixels of the display panel DP, for example, a data driving circuit. FIG. 2A illustrates a structure in which the driving chip DIC is mounted on the display panel DP, but embodiments are not limited thereto. For example, the driving chip DIC may be mounted on the flexible circuit film FCB.

The power supply module PM may supply power necessary for the overall operation of the electronic device EDE. The power supply module PM may include a conventional battery module.

The first electronic module EM1 and the second electronic module EM2 may include various functional modules for operating the electronic device EDE. Each of the first electronic module EM1 and the second electronic module EM2 may be mounted (e.g., directly mounted) on a motherboard electrically connected to the display panel DP, or may be mounted on a separate board to be electrically connected to the motherboard through a connector or the like.

The first electronic module EM1 may include a control module CM, a wireless communication module TM, an image input module IIM, an audio input module AIM, a memory MM, and an external interface IF.

The control module CM may control the overall operation of the electronic device EDE. The control module CM may be a microprocessor. For example, the control module CM may activate or deactivate the display panel DP. The control module CM may control other modules such as an image input module IIM or an audio input module AIM based on a touch signal received from the display panel DP.

The wireless communication module TM may communicate with an external electronic device through a first network (e.g., short-range communication networks such as Bluetooth, WiFi direct, or infrared data association (IrDA)) or a second network (e.g., telecommunications networks such as a cellular network, the Internet, or a computer network (e.g., LAN or WAN)). Communication modules included in the wireless communication module TM may be integrated into one component (e.g., a single chip) or implemented as components (e.g., multiple chips) separated from each other. The wireless communication module TM may transmit/receive voice signals using a general communication line. The wireless communication module TM may include a transmitter TM1 that modulates and transmits a signal to be transmitted, and a receiver TM2 that demodulates a received signal.

The image input module IIM may process the image signal and may convert the processed image signal into image data to be displayed on the display panel DP. The audio input module AIM may receive an external sound signal by a microphone in a recording mode, a voice recognition mode, etc. and may convert the received external sound signal into electrical voice data.

The external interface IF may include a connector capable of connecting (e.g., physically connecting) the electronic device EDE and an external electronic device. For example, the external interface IF may function as an interface between the control module CM and external devices, such as an external charger, a wired/wireless data port, a card (e.g., a memory card and a SIM/UIM card), etc.

The second electronic module EM2 may include an audio output module AOM, a light emitting module LTM, a light receiving module LRM, and a camera module CMM. The audio output module AOM may convert the audio data received from the wireless communication module TM or the sound data stored in the memory MM and may output the converted data to the outside.

The light emitting module LTM may generate and output light. The light emitting module LTM may output infrared light. The light emitting module LTM may include an LED element. The light receiving module LRM may detect infrared light. The light receiving module LRM may be activated in case that infrared light above a certain level is detected. The light receiving module LRM may include a CMOS sensor. After the infrared light generated by the light emitting module LTM is outputted, the infrared light may be reflected by an external object (e.g., a user's finger or face), and the reflected infrared light may be incident on the light receiving module LRM.

The camera module CMM may capture a still image and a video. Camera modules CMM may be provided. Among them, some camera modules CMM may overlap the first area A1. An external input (e.g., light) may be provided to the camera module CMM through the first area A1. For example, the camera module CMM may receive natural light through the first area A1 to capture an external image.

The housings EDC1 and EDC2 may accommodate the display module DM, the first and second electronic modules EM1 and EM2, and the power supply module PM. The housings EDC1 and EDC2 may protect components accommodated in the housings EDC1 and EDC2, such as the display module DM, the first and second electronic modules EM1 and EM2, and the power supply module PM. FIG. 2A illustrates two housings EDC1 and EDC2 separated from each other by way of example, but embodiments are not limited thereto. For example, the electronic device EDE may further include a hinge structure for connecting the two housings EDC1 and EDC2. The housings EDC1 and EDC2 may be coupled to the window module WM.

Figure 3:
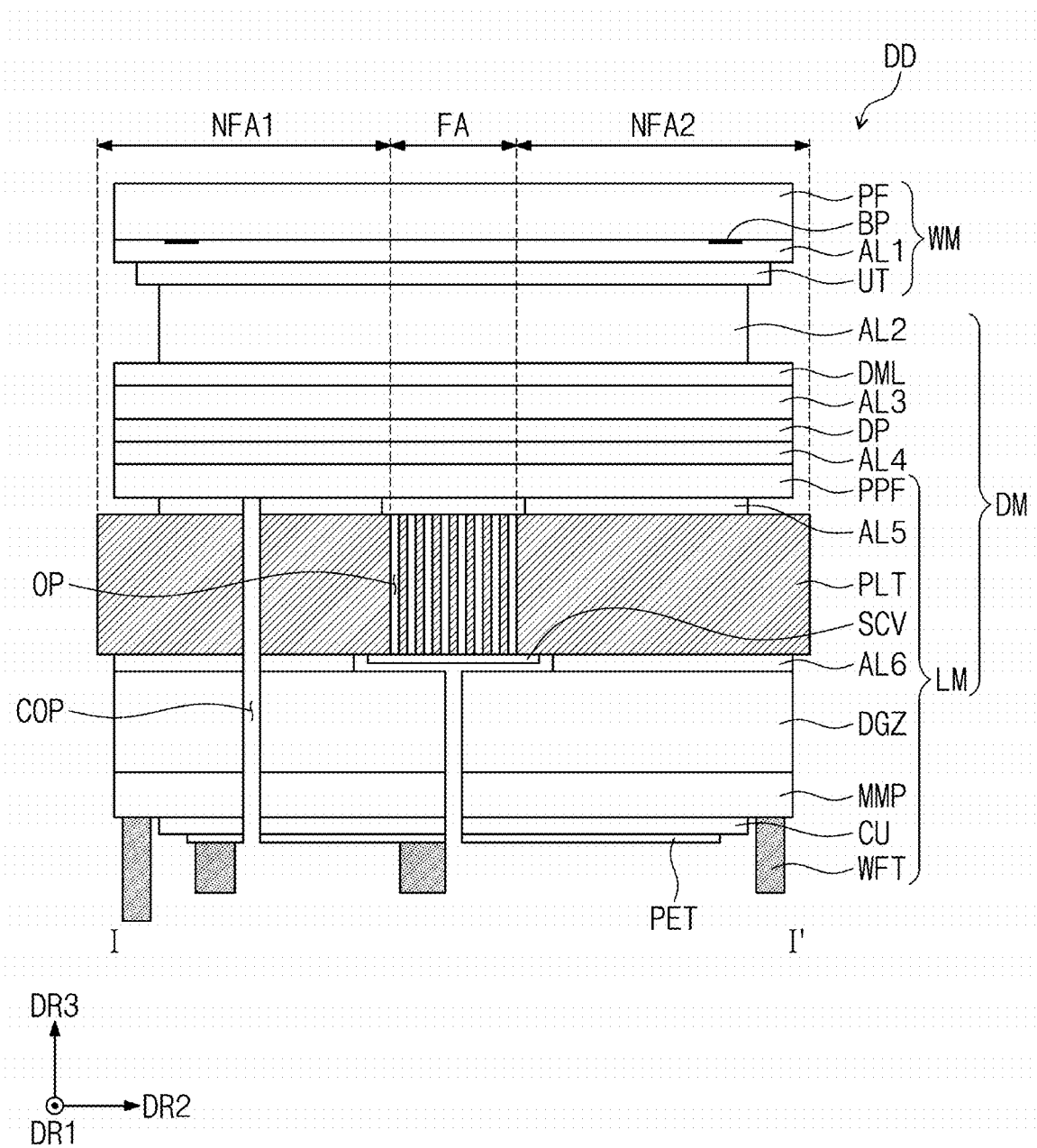
FIG. 3 is a schematic cross-sectional view of a display device according to an embodiment.

FIG. 3 is a schematic cross-sectional view of a display device DD according to an embodiment. FIG. 3 is a schematic cross-sectional view of the display device DD taken along line I-I' of FIG. 2A according to an embodiment.

Referring to FIG. 3, the display device DD may include a window module WM and a display module DM.

The window module WM may include a window UT, a protective film PF disposed on the window UT, and a bezel pattern layer BP.

The window UT may be chemically strengthened glass. As the window UT is applied to the display device DD, the occurrence of wrinkles may be minimized although folding and unfolding operations are repeated.

The protective film PF may include polyimide, polycarbonate, polyamide, triacetylcellulose, polymethylmethacrylate, or polyethylene terephthalate. For example, at least one of a hard coating layer, an anti-fingerprint layer, and an anti-reflection layer may be disposed on the upper surface of the protective film PF.

The bezel pattern layer BP may overlap the non-display area NDA of FIG. 1A. The bezel pattern layer BP may be disposed on a surface of the window UT or a surface of the protective film PF. FIG. 3 shows the bezel pattern layer BP disposed on the lower surface of the protective film PF. Embodiments are not limited thereto, and the bezel pattern layer BP may be disposed on the upper surface of the protective film PF, the upper surface of the window UT, or the lower surface of the window UT. The bezel pattern layer BP may be a colored light blocking film and may be formed by, for example, a coating method. The bezel pattern layer BP may include a base material and a dye or pigment mixed with the base material. The bezel pattern layer BP may have a closed line shape in a plan view.

The first adhesive layer AL1 may be disposed between the protective film PF and the window UT. The first adhesive layer AL1 may be a pressure sensitive adhesive (PSA) film or an optically clear adhesive (OCA). The adhesive layers described below are also the same as the first adhesive layer AL1 and may include a conventional adhesive.

The first adhesive layer AL1 may have a thickness sufficient to cover the bezel pattern layer BP. For example, the thickness of the bezel pattern layer BP may be about 3 micrometers to about 8 micrometers, and the first adhesive layer AL1 may have a thickness at a level at which bubbles are not generated in the periphery of the bezel pattern layer BP.

The first adhesive layer AL1 may be separated from the window UT. Since the strength of the protective film PF is low compared to the window UT, scratches may occur relatively readily in the protective film PF. After the first adhesive layer AL1 and the damaged protective film PF are separated from the window UT, a new protective film PF may be attached to the window UT.

The display module DM may include a shock absorbing layer DML, a display panel DP, and a lower member LM.

The shock absorbing layer DML may be disposed on the display panel DP. The shock absorbing layer DML may be a functional layer for protecting the display panel DP from external impact. The shock absorbing layer DML may be coupled to the window UT through the second adhesive layer AL2, and may be coupled to the display panel DP through the third adhesive layer AL3.

The lower member LM may be disposed under the display panel DP. The lower member LM may include a panel protective layer PPF, a supporting layer PLT, a cover layer SCV, a digitizer DGZ, a light shielding layer MMP, a dissipation layer CU, a protective layer PET, and a waterproof tape WFT. In an embodiment, the lower member LM may not include some of the above to described components, or may further include other components. In addition, the stacking order illustrated in FIG. 3 is an example of an order, and the stacking order of each component may be changed.

The panel protective layer PPF may be disposed under the display panel DP. The panel protective layer PPF may be attached to the rear surface (or the lower surface) of the display panel DP through the fourth adhesive layer AL4. The panel protective layer PPF may protect the lower portion of the display panel DP. The panel protective layer PPF may include a flexible plastic material. The panel protective layer PPF may prevent scratches from being generated on the rear surface of the display panel DP during the manufacturing process of the display panel DP. The panel protective layer PPF may be a colored polyimide film. For example, the panel protective layer PPF may be an opaque yellow film, but embodiments are not limited thereto.

The supporting layer PLT may be placed below the panel protective layer PPF. The supporting layer PLT may support the components disposed on the upper side of the supporting layer PLT, and may maintain the unfolded state and the folded state of the display device DD. In an embodiment, the supporting layer PLT may include at least a first supporting portion corresponding to the first non-folding area NFA1, a second supporting portion corresponding to the second non-folding area NFA2, and a folding portion corresponding to the folding area FA. The first supporting portion and the second supporting portion may be spaced apart from each other in the second direction DR2. The folding portion may be disposed between the first supporting portion and the second supporting portion, and openings OP may be defined in the folding portion. The flexibility of a portion of the supporting layer PLT may be improved by the openings OP. The flexibility of the part overlapping the folding area FA of the supporting layer PLT may be improved by the openings OP.

The supporting layer PLT may include carbon fiber reinforced plastic (CFRP), but embodiments are not limited thereto. In another example, the first supporting portion and the second supporting portion may include a non-metallic material, plastic, glass fiber reinforced plastic or glass. The plastic may include polyimide, polyethylene, or polyethylene terephthalate, but embodiments are not limited thereto. The first supporting portion and the second supporting portion may include the same material as each other. The folding portion may include the same material as the first supporting portion and the second supporting portion, or may include a different material from that of the first and second support portions. For example, the folding part may include a material having an elastic modulus of about 60 GPa or more, and may include a metal material such as stainless steel. For example, the folding portion may include SUS 304, but embodiments are not limited thereto, and the folding portion may include various metal materials.

The supporting layer PLT may be attached to the panel protective layer PPF through the fifth adhesive layer AL5. Fifth adhesive layers AL5 may be provided, and may be spaced apart from each other by a folding area FA therebetween. The fifth adhesive layer AL5 may not overlap the openings OP. In a plan view, the fifth adhesive layer AL5 may be spaced apart from the openings OP. Flexibility of the supporting layer PLT may be improved by not disposing the fifth adhesive layer AL5 in the area corresponding to the folding area FA.

In the area overlapping the folding area FA, the panel protective layer PPF may be spaced apart from the supporting layer PLT. For example, an empty space may be defined between the supporting layer PLT and the panel protective layer PPF in a portion overlapping the folding area FA. Since an empty space is defined between the panel protective layer PPF and the supporting layer PLT, the shape of the openings OP defined in the supporting layer PLT may not be visible from the outside of the electronic device EDE of FIG. 1A.

The thickness of the fifth adhesive layer AL5 may be less than the thickness of the fourth adhesive layer AL4. For example, the thickness of the fourth adhesive layer AL4 may be about 25 micrometers, and the thickness of the fifth adhesive layer AL5 may be about 16 micrometers. As the thickness of the fifth adhesive layer AL5 decreases, the step difference due to the fifth adhesive layer AL5 may be reduced. As the step difference is less, there is an advantage in that the shape deformation of the stacked structures due to the folding and unfolding operations of the electronic device EDE of FIG. 1A is reduced, but the openings OP may be visually recognized, or the fifth adhesive layer AL5 may be separated by repeated folding operations. As the thickness of the fifth adhesive layer AL5 increases, the openings OP may not be visually recognized, and the reliability with respect to an adhesive force of the fifth adhesive layer AL5 may be improved in spite of the repeated folding operations, however, the step difference may increase. Accordingly, the thickness of the fifth adhesive layer AL5 may be selected within an appropriate range in consideration of folding reliability, adhesive reliability, and visibility of the openings OP.

The supporting layer PLT may be attached to the digitizer DGZ through a sixth adhesive layer AL6. The sixth adhesive layer AL6 may include a plurality of sixth adhesive layers AL6 that are spaced apart from each other by a folding area FA therebetween. The sixth adhesive layer AL6 may not overlap the openings OP. In a plan view, the sixth adhesive layer AL6 may be spaced apart from the openings OP. Flexibility of the supporting layer PLT may be improved by not disposing the sixth adhesive layer AL6 in the area corresponding to the folding area FA.

The cover layer SCV may be disposed under the supporting layer PLT. The cover layer SCV may be coupled to the supporting layer PLT by an adhesive member. The cover layer SCV may cover the openings OP defined in the supporting layer PLT. Accordingly, the cover layer SCV may prevent foreign substances from being permeated into the openings OP. The cover layer SCV may have a lower elastic modulus than the supporting layer PLT. For example, the cover layer SCV may include thermoplastic polyurethane, rubber, or silicone, but embodiments are not limited thereto.

The digitizer DGZ may be disposed under the supporting layer PLT. The digitizers DGZ may be provided. For example, the digitizers DGZ may be spaced apart from each other in the second direction DR2. A portion of each of the digitizers DGZ may overlap the non-folding area NFA1 or NFA2, and the remaining portion may overlap the folding area FA. In a plan view, a portion of each of the digitizers DGZ may overlap a portion of the openings OP.

Each of the digitizers DGZ may include loop coils that generate a magnetic field of a preset resonant frequency with an input device (hereinafter, a pen). The digitizers DGZ may be referred to as an electro-magnetic resonance (EMR) sensing panel.

The magnetic field formed by the digitizers DGZ may be applied to an LC resonance circuit composed of an inductor (e.g., coil) and a capacitor of the pen. The coil may generate current by the received magnetic field and may transfer the generated current to the capacitor. Accordingly, the capacitor may charge the current inputted from the coil and may discharge the charged current into the coil. Eventually, a magnetic field of a resonant frequency may be emitted to the coil. The magnetic field emitted by the pen may be absorbed again by the loop coil of the digitizers DGZ, and accordingly, it may be determined which position the pen is close to the digitizers DGZ.

The light shielding layers MMP may be respectively disposed under the digitizers DGZ. Each of the light shielding layers MMP may include magnetic metal powder. The light shielding layers MMP may be referred to as a magnetic metal powder layer, a magnetic layer, a magnetic circuit layer, or a magnetic path layer. The light shielding layers MMP may shield the magnetic field.

The dissipation layers CU may be respectively disposed under the light shielding layers MMP. The dissipation layers CU may be sheets having high thermal conductivity. For example, each of the dissipation layers CU may include graphite, copper, or a copper alloy, but embodiments are not limited thereto.

The protective layers PET may be respectively disposed under the dissipation layers CU. The protective layers PET may be insulating layers. For example, the protective layers PET may be layers provided to prevent the occurrence of static electricity. Accordingly, electrical interference between the flexible circuit film FCB of FIG. 2A and the components disposed on the protective layers PET may be prevented from occurring by the protective layers PET.

The waterproof tapes WFT may be attached to light shielding layers MMP and protective layers PET. The waterproof tape WFT may be attached to the set bracket. Among the waterproof tapes WFT, the thickness of the waterproof tape WFT attached to the light shielding layers MMP and the thickness of the waterproof tape WFT attached to the protective layers PET may be different from each other.

A through hole COP may be defined in at least some of the components of the lower member LM. The through hole COP may overlap or correspond to a sensor area ED-SA of FIG. 1A of the electronic device EDE of FIG. 1A. At least a portion of the camera module CMM of FIG. 2A may be inserted into the through hole COP.

FIG. 3 illustrates that the through hole COP is provided from the rear surface of one of the protective layers PET to the upper surface of the fifth adhesive layer AL5 as an example, but embodiments are not limited thereto. For example, the through hole COP may be provided from the rear surface of the protective layer PET to the upper surface of the panel protective layer PPF or from the rear surface of the protective layer PET to the upper surface of the fourth adhesive layer AL4.

Figure 4:
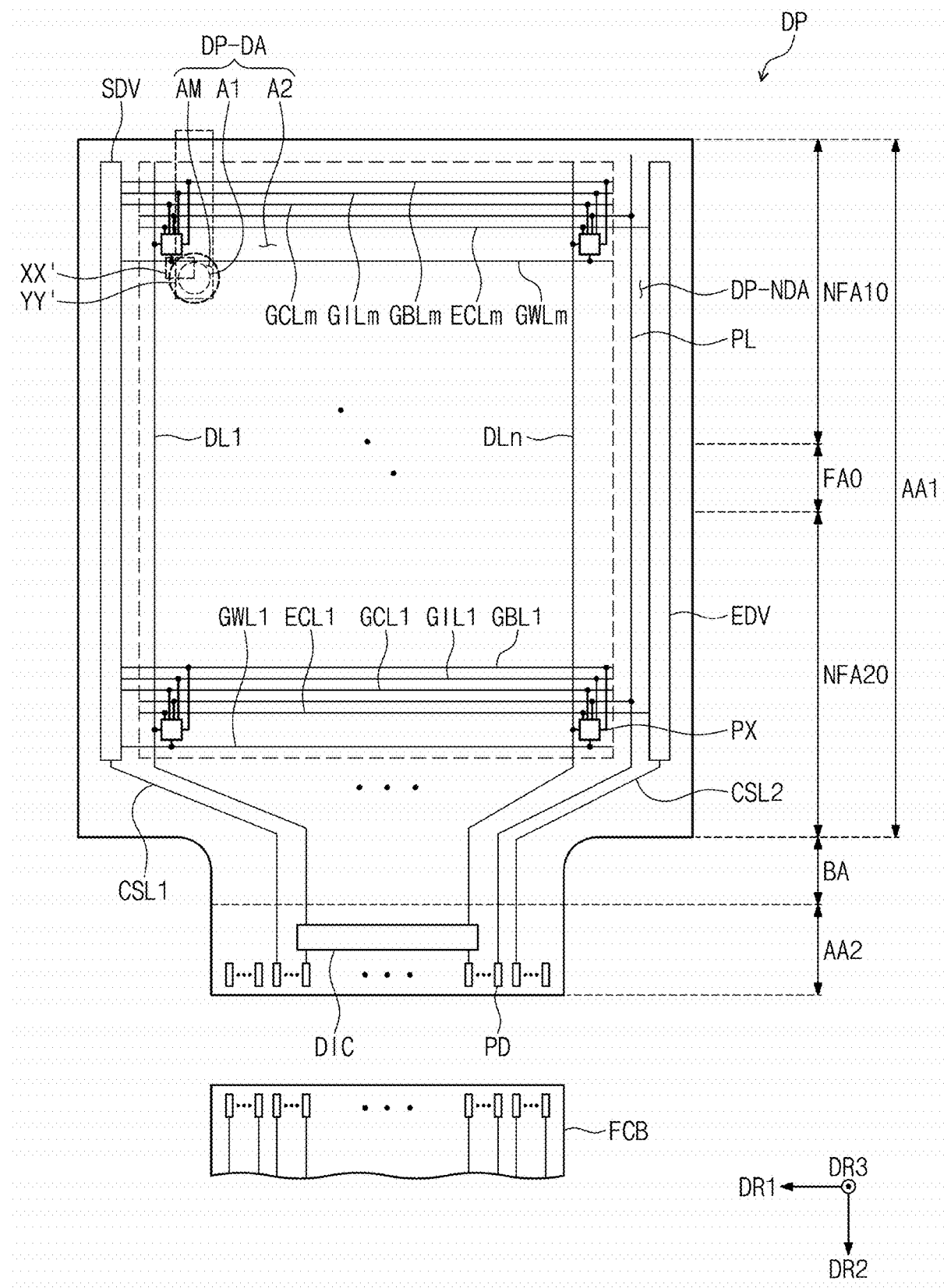
FIG. 4 is a schematic plan view of a display panel according to an embodiment.

FIG. 4 is a schematic plan view of a display panel DP according to an embodiment.

Referring to FIG. 4, a display area DP-DA and a non-display area DP-NDA around the display area DP-DA may be defined in the display panel DP. The display area DP-DA and the non-display area DP-NDA may be divided by whether or not the pixels PX are disposed. The pixel PX may be disposed in the display area DP-DA. A scanning driving unit SDV, a data driving unit, and an emission driving unit EDV may be disposed in the non-display area DP-NDA. The data driving unit may be some circuits included in the driving chip DIC.

The display area DP-DA may include a first area A1, a second area A2, and a middle area AM (or referred to as a third area). The first area A1 and the second area A2 may be distinguished by the arrangement interval (or distance) of the pixels PX, the size of the pixels PX, the shape of the pixels PX, or the presence or absence of the transmissive area TP of FIG. 6.

The pixel PX disposed in the middle area AM may have a shape similar to that of the pixel PX disposed in the second area A2. The pixel PX disposed in the middle area AM may be distinguished from the pixel PX disposed in the second area A2 in that it includes emission areas in which emission is controlled by a pixel circuit. A detailed description of the first area A1, the second area A2, and the middle area AM will be described below.

The display panel DP may include a first panel area AA1, a bending area BA, and a second panel area AA2 defined along the second direction DR2. The second panel area AA2 and the bending area BA may be a partial area of the non-display area DP-NDA. The bending area BA may be disposed between the first panel area AA1 and the second panel area AA2.

The first panel area AA1 may be an area corresponding to the display surface DS of FIG. 1A. The first panel area AA1 may include a first non-folding area NFA10, a second non-folding area NFA20, and a folding area FAO. The first non-folding area NFA10, the second non-folding area NFA20, and the folding area FAO correspond to the first non-folding area NFA1, the second non-folding area NFA2, and the folding area FA of FIGS. 1A and 1B, respectively.

The width (or length) of the bending area BA parallel to the first direction DR1 and the width (or length) of the second panel area AA2 parallel to the first direction DR1 may be less than the width (or length) of the first panel area AA1 parallel to the first direction DR1. Areas with a short length in the folding axis direction may be bent more readily.

The display panel DP may include pixels PX, initialization scan lines GIL1 to GILm, compensation scan lines GCL1 to GCLm, write scan lines GWL1 to GWLm, block scan lines GBL1 to GBLm, emission control lines ECL1 to ECLm, data lines DL1 to DLn, first and second control lines CSL1 and CSL2, a driving voltage line PL, and pads PD. Here, m and n are natural numbers of 2 or more.

The pixels PX may be connected to the initialization scan lines GIL1 to GILm, the compensation scan lines GCL1 to GCLm, the write scan lines GWL1 to GWLm, the block scan lines GBL1 to GBLm, the emission control lines ECL1 to ECLm, and the data lines DL1 to DLn.

The initialization scan lines GILL to GILm, the compensation scan lines GCL1 to GCLm, the write scan lines GWL1 to GWLm, and the block scan lines GBL1 to GBLm may extend in the first direction DR1 and may be electrically connected to the scan driving unit SDV. The data lines DL1 to DLn may extend in the second direction DR2 and may be electrically connected to the driving chip DIC through the bending area BA. The emission control lines ECL1 to ECLm may extend in a direction opposite to the first direction DR1 and may be electrically connected to the emission driving unit EDV.

The driving voltage line PL may include a portion extending in the first direction DR1 and a portion extending in the second direction DR2. The portion extending in the first direction DR1 and the portion extending in the second direction DR2 may be disposed on different layers. A portion of the driving voltage line PL extending in the second direction DR2 may extend to the second panel area AA2 through the bending area BA. The driving voltage line PL may provide a driving voltage to the pixels PX.

The first control line CSL1 may be connected to the scan driving unit SDV and may extend toward the lower end portion of the second panel area AA2 through the bending area BA. The second control line CSL2 may be connected to the emission driving unit EDV and may extend toward the lower end portion of the second panel area AA2 through the bending area BA.

When viewed in a plan view, the pads PD may be disposed adjacent to a lower end portion of the second panel area AA2. The driving chip DIC, the driving voltage line PL, the first control line CSL1, and the second control line CSL2 may be electrically connected to the pads PD. The flexible circuit film FCB may be electrically connected to the pads PD through an anisotropic conductive adhesive layer.

Figure 5:
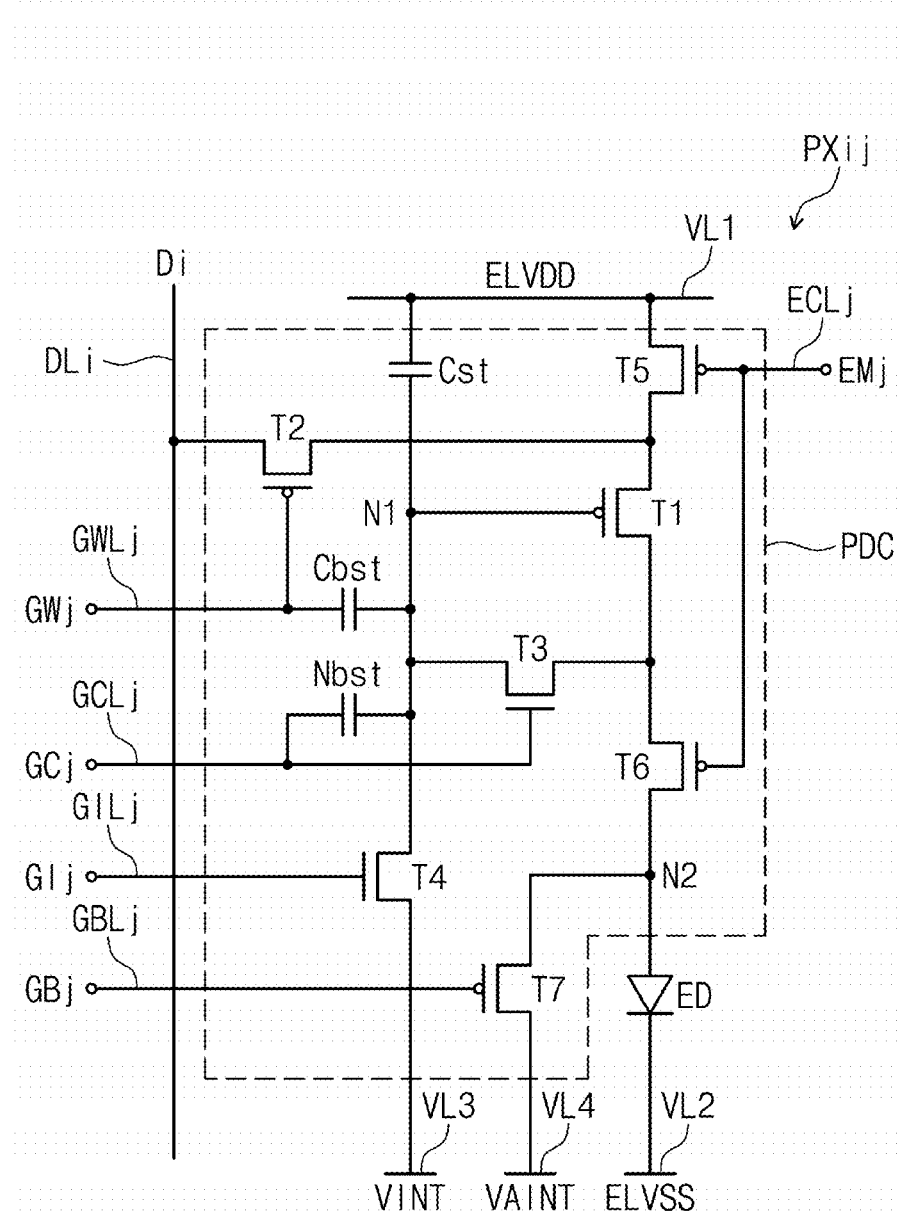
FIG. 5 is a schematic diagram of an equivalent circuit of a pixel according to an embodiment.

FIG. 5 is a schematic diagram of an equivalent circuit of a pixel PXij according to an embodiment.

FIG. 5 shows a schematic diagram of an equivalent circuit of a pixel PXij among the pixels PX of FIG. 4. Since each of the pixels PX has the same circuit structure, a detailed description of the remaining pixels PX will be omitted as a description of the circuit structure of the pixel PXij.

Referring to FIGS. 4 and 5, the pixel PXij may be connected to the i-th data line DLi among the data lines DL1 to DLn, the j-th initialization scan line GILj among the initialization scan lines GIL1 to GILm, the j-th compensation scan line GCLj among the compensation scan lines GCL1 to GCLm, the j-th write scan line GWLj among the write scan lines GWL1 to GWLm, the j-th block scan line GBLj among the block scan lines GBL1 to GBLm, the j-th emission control line ECLj among the emission control lines ECL1 to ECLm, the first and second driving voltage lines VL1 and VL2, and the first and second initialization voltage lines VL3 and VL4. Herein, i is an integer of 1 or more and n or less, and j is an integer of 1 or more and m or less.

The pixel PXij may include a light emitting element ED and a pixel circuit PDC. The light emitting element ED may be a light emitting diode. As an example, the light emitting element ED may be an organic light emitting diode including an organic light emitting layer, but embodiments are not limited thereto. The pixel circuit PDC may control the amount of current flowing through the light emitting element ED in response to the i-th data signal Di. The light emitting element ED may emit light with a certain luminance corresponding to the amount of current provided from the pixel circuit PDC. In the description, the amount of current of the pixel PXij may refer to the amount of current provided to the light emitting element ED.

The pixel circuit PDC may include first to seventh transistors T1, T2, T3, T4, T5, T6, and T7, and first to third capacitors Cst, Cbst, and Nbst. The configuration of the pixel circuit PDC according to embodiments are not limited to the embodiment shown in FIG. 5. The pixel circuit PDC illustrated in FIG. 5 is only an example, and the configuration of the pixel circuit PDC may be modified.

At least one of the first to seventh transistors T1, T2, T3, T4, T5, T6, and T7 may be a transistor having a low-temperature polycrystalline silicon (LTPS) semiconductor layer. At least one of the first to seventh transistors T1, T2, T3, T4, T5, T6, and T7 may be a transistor having an oxide semiconductor layer. For example, the third and fourth transistors T3 and T4 may be oxide semiconductor transistors, and the first, second, fifth, sixth, and seventh transistors T1, T2, T5, T6, and T7 may be LTPS transistors.

The first transistor T1 (or referred to as a driving transistor) that directly affects the brightness of the light emitting element ED, it is formed to include a semiconductor layer made of polycrystalline silicon having high reliability, so that through this, it is possible to implement a high-resolution display device. Since the oxide semiconductor has high carrier mobility and low leakage current, the voltage drop may not be large although the driving time is long. For example, since the color change of the image according to the voltage drop is not large even during low-frequency driving, low-frequency driving is possible. As such, the oxide semiconductor may have the advantage of low leakage current, by implementing at least one of the third transistor T3 and the fourth transistor T4 connected to the gate electrode of the first transistor T1 as an oxide semiconductor transistor, it is possible to prevent leakage current flowing to the gate electrode of the first transistor T1 and reduce power consumption.

Some of the first to seventh transistors T1, T2, T3, T4, T5, T6, and T7 may be P-type transistors, and others may be N-type transistors. For example, the first, second, fifth, sixth, and seventh transistors T1, T2, T5, T6, and T7 may be P-type transistors, and the third and fourth transistors T3 and T4 may be N-type transistors.

The configuration of the pixel circuit PDC according to an embodiment is not limited to the embodiment shown in FIG. 5. The pixel circuit PDC illustrated in FIG. 5 is only an example, and the configuration of the pixel circuit PDC may be modified. For example, all of the first to seventh transistors T1, T2, T3, T4, T5, T6, and T7 may be P-type transistors or N-type transistors. In another example, the first, second, fifth, and sixth transistors T1, T2, T5, and T6 may be P-type transistors, and the third, fourth, and seventh transistors T3, T4, and T7 may be N-type transistors.

The j-th initialization scan line GILj, the j-th compensation scan line GCLj, the j-th write scan line GWLj, the j-th block scan line GBLj, and the j-th emission control line ECLj may respectively transmit the j-th initialization scan signal GIj, the j-th compensation scan signal GCj, the j-th write scan signal GWj, the j-th block scan signal GBj, and the j-th emission control signal EMj to the pixel PXij. The i-th data line DLi may transfer the i-th data signal Di to the pixel PXij. The i-th data signal Di may have a voltage level corresponding to an image signal input to the display device DD of FIG. 3.

The first and second driving voltage lines VL1 and VL2 may transmit the first driving voltage ELVDD and the second driving voltage ELVSS to the pixel PXij, respectively. For example, the first and second initialization voltage lines VL3 and VL4 may transmit the first initialization voltage VINT and the second initialization voltage VAINT to the pixel PXij, respectively.

The first transistor T1 may be connected between the first driving voltage line VL1 receiving the first driving voltage ELVDD and the light emitting element ED. The first transistor T1 may include a first electrode connected to the first driving voltage line VL1 through the fifth transistor T5, a second electrode connected to a pixel electrode (or referred to as an anode) of the light emitting element ED through the sixth transistor T6, and a third electrode (e.g., a gate electrode) connected to one end portion (e.g., the first node N1) of the first capacitor Cst. The first transistor T1 may receive the i-th data signal Di transmitted from the i-th data line DLi according to the switching operation of the second transistor T2 to supply a driving current to the light emitting element ED.

The second transistor T2 may be connected between the i-th data line DLi and the first electrode of the first transistor T1. The second transistor T2 may include a first electrode connected to the i-th data line DLi, a second electrode connected to the first electrode of the first transistor T1, and a third electrode (e.g., a gate electrode) connected to the j-th write scan line GWLj. The second transistor T2 may be turned on according to the write scan signal GWj received through the j-th write scan line GWLj to transmit the i-th data signal Di transmitted from the i-th data line DLi to the first electrode of the first transistor T1. An end portion of the second capacitor Cbst may be connected to the third electrode of the second transistor T2, and another end portion of the second capacitor Cbst may be connected to the first node N1.

The third transistor T3 may be connected between the second electrode of the first transistor T1 and the first node N1. The third transistor T3 may include a first electrode connected to the third electrode of the first transistor T1, a second electrode connected to the second electrode of the first transistor T1, and a third electrode (e.g., a gate electrode) connected to the j-th compensation scan line GCLj. The third transistor T3 may be turned on according to the j-th compensation scan signal GCj received through the j-th compensation scan line GCLj to diode-connect the first transistor T1 by connecting the third electrode of the first transistor T1 and the second electrode of the first transistor T1 to each other. An end portion of the third capacitor Nbst may be connected to the third electrode of the third transistor T3, and another end portion of the third capacitor Nbst may be connected to the first node N1.

The fourth transistor T4 may be connected between the first initialization voltage line VL3 to which the first initialization voltage VINT is applied and the first node N1. The fourth transistor T4 may include a first electrode connected to the first initialization voltage line VL3 to which the first initialization voltage VINT is transmitted, a second electrode connected to the first node N1, and a third electrode (e.g., a gate electrode) connected to the j-th initialization scan line GILj. The fourth transistor T4 may be turned on according to the j-th initialization scan signal GIj received through the j-th initialization scan line GILj. The turned-on fourth transistor T4 transmits the first initialization voltage VINT to the first node N1 to initialize the voltage of the third electrode of the first transistor T1 (e.g., the voltage of the first node N1).

The fifth transistor T5 may have a first electrode connected to the first driving voltage line VL1, a second electrode connected to the first electrode of the first transistor T1, and a third electrode (e.g., a gate electrode) connected to the j-th emission control line ECLj. The sixth transistor T6 may include a first electrode connected to the second electrode of the first transistor T1, a second electrode connected to the pixel electrode of the light emitting element ED, and a third electrode (e.g., a gate electrode) connected to the j-th emission control line ECLj.

The fifth and sixth transistors T5 and T6 may be simultaneously turned on according to the j-th emission control signal EMj transmitted through the j-th emission control line ECLj. The first driving voltage ELVDD applied through the turned-on fifth transistor T5 may be compensated by the diode-connected first transistor T1 and may be transmitted to the light emitting element ED through the turned-on sixth transistor T6.

The seventh transistor T7 may include a first electrode connected to the second initialization voltage line VL4 to which the second initialization voltage VAINT is transmitted, a second electrode connected to the second electrode of the sixth transistor T6 (e.g., a second node N2), and a third electrode (e.g., a gate electrode) connected to the j-th block scan line GBLj. The second initialization voltage VAINT may have a voltage level equal to or lower than that of the first initialization voltage VINT.

An end portion of the first capacitor Cst may be connected to the third electrode of the first transistor T1, and another end portion of the first capacitor Cst may be connected to the first driving voltage line VL1. The cathode of the light emitting element ED may be connected to the second driving voltage line VL2 that transmits the second driving voltage ELVSS. The second driving voltage ELVSS may have a lower voltage level than the first driving voltage ELVDD.

Figure 6:
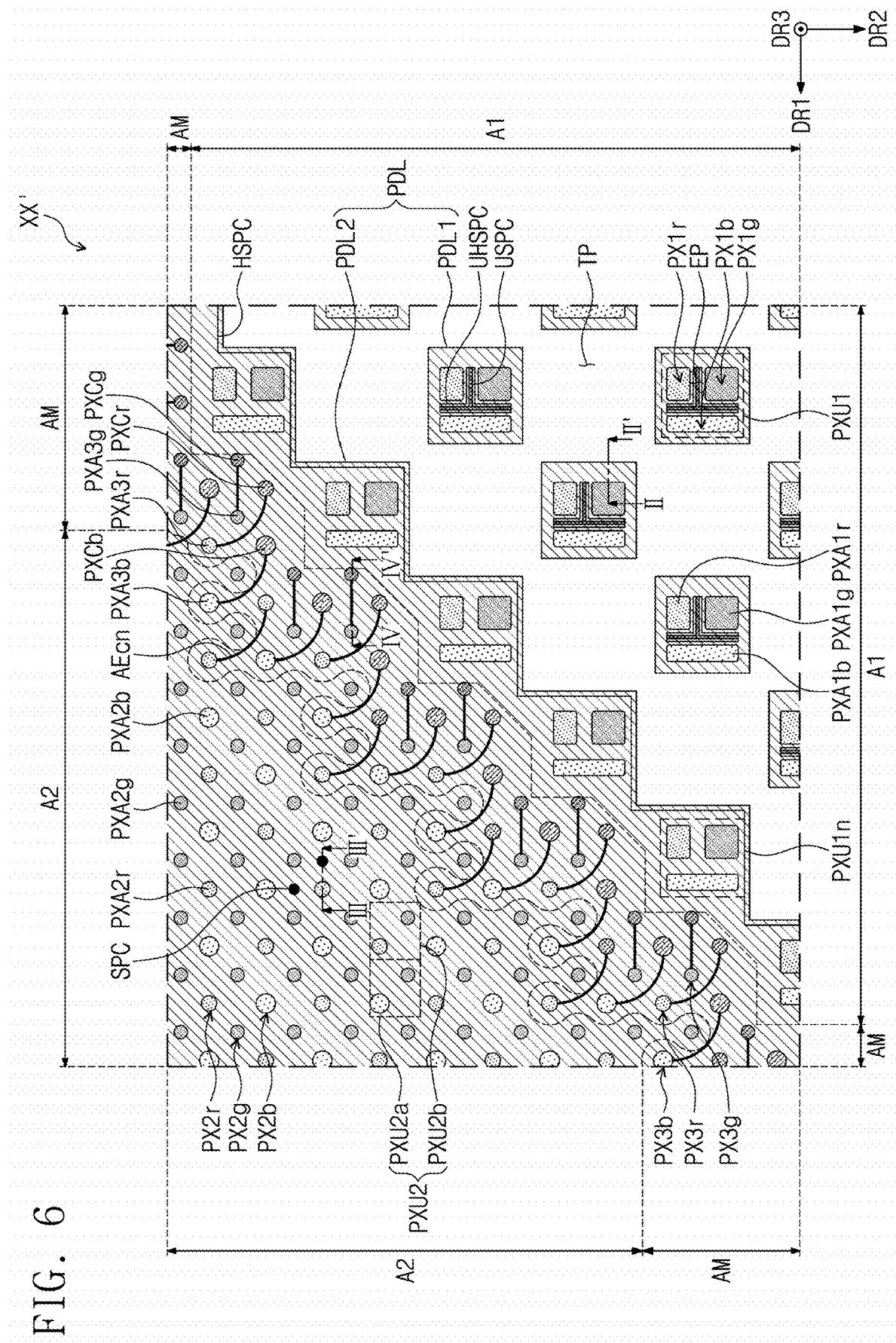
FIG. 6 is a schematic enlarged plan view of a partial area of a display panel according to an embodiment.

FIG. 6 is a schematic enlarged plan view of a partial area of the display panel according to an embodiment. FIG. 6 is a schematic enlarged plan view illustrating an area XX' illustrated in FIG. 4.

Referring to FIGS. 4 and 6, the display area DP-DA of the display panel DP may include a first area A1, a second area A2, and a middle area AM between the first area A1 and the second area A2.

The pixels PX may be provided in plurality, and the pixels PX include first pixels PX1r, PX1g, and PX1b disposed in the first area A1, second pixels PX2r, PX2g, and PX2b disposed in the second area A2, and third pixels PX3r, PX3g, and PX3b disposed in the middle area AM.

The number of first pixels PX1r, PX1g, and PX1b disposed in the reference area in the first area A1 may be less than the number of second pixels PX2r, PX2g, and PX2b disposed in the reference area in the second area A2. Accordingly, the resolution of the first area A1 may be lower than the resolution of the second area A2.

The first pixels PX1r, PX1g, and PX1b may include a first-first color pixel PX1r (or referred to as a first red pixel), a first-second color pixel PX1g (or referred to as a first green pixel), and a first-third color pixel PX1b (or referred to as a first blue pixel). The second pixels PX2r, PX2g, and PX2b may include a second-first color pixel PX2r (or referred to as a second red pixel), a second-second color pixel PX2g (or referred to as a second-first green pixel or a second-second green pixel), and a second-third color pixel PX2b (or referred to as a second blue pixel). The third pixels PX3r, PX3g, and PX3b may include a third-first color pixel PX3r (or referred to as a third red pixel), a third-second color pixel PX3g (or referred to as a third green pixel), and a third-third color pixel PX3b (or referred to as a third blue pixel). The first-first color pixel PX1r, the second-first color pixel PX2r, and the third-first color pixel PX3r may be red light emitting pixels, the first-second color pixel PX1g, the second-second color pixel PX2g, and the third-second color pixel PX3g may be green light emitting pixels, and the first-third color pixel PX1b, the second-third color pixel PX2b, and the third-third color pixel PX3b may be blue light emitting pixels.

A planar shape of each of the first pixels PX1r, PX1g, and PX1b, the second pixels PX2r, PX2g, and PX2b, and the third pixels PX3r, PX3g, and PX3b shown in FIG. 6 may correspond to the shape of the emission area defined in the light emitting element. The emission area may be an area defined by a pixel defining opening defined in the pixel defining film PDL.

FIG. 6 shows first emission areas PXA1r, PXA1g, and PXA1b corresponding to the first pixels PX1r, PX1g, and PX1b, respectively, and second emission areas PXA2r, PXA2g, and PXA2b respectively corresponding to the second pixels PX2r, PX2g, and PX2b. The third-first emission area PXA3r and the third-first copy emission area PXCr corresponding to the third-first color pixel PX3r, the third-second emission area PXA3g and third-second copy emission area PXCg corresponding to the third-second color pixel PX3g, and the third-third emission area PXA3b and the third-third copy emission area PXCb corresponding to the third-third color pixel PX3b are shown.

The area of the first-first emission area PXA1r may be greater than the area of the second-first emission area PXA2r, the area of the first-second emission area PXA1g may be greater than the area of the second-second emission area PXA2g, and the area of the first-third emission area PXA1b may be greater than the area of the second-third emission area PXA2b. In case that the same luminance is realized within the reference area, by providing the size of each of the first pixels PX1r, PX1g, and PX1b, which should emit relatively bright light, greater than the size of each of the second pixels PX2r, PX2g, and PX2b, lifespans of the first pixels PX1r, PX1g, and PX1b may be compensated.

The emission of the third-first emission area PXA3r and the emission of the third-first copy emission area PXCr may be controlled by the operation of the same pixel circuit. Accordingly, the third-first emission area PXA3r and the third-first copy emission area PXCr may or may not provide light at the same time. FIG. 6 illustrates a connection electrode AEcn in order to clarify the relationship between the third-first emission area PXA3r and the third-first copy emission area PXCr. The emission of the third-second emission area PXA3g and the third-second copy emission area PXCg may be controlled by the operation of the same pixel circuit, and the emission of the third-third emission area PXA3b and the third-third copy emission area PXCb may be controlled by the operation of the same pixel circuit.

Emission areas may be included in a pixel in the middle area AM. For example, the third-first color pixel PX3r may include a third-first emission area PXA3r and a third-first copy emission area PXCr, the third-second color pixel PX3g may include a third-second emission area PXA3g and a third-second copy emission area PXCg, and the third-third color pixel PX3b may include a third-third emission area PXA3b and a third-third copy emission area PXCb.

It is difficult to arrange a pixel circuit at the boundary between the first area A1 and the second area A2 due to space limitations. For example, the area in which the third-first copy emission area PXCr, the third-second copy emission area PXCg, and the third-third copy emission area PXCb are located may be a boundary area in which it is difficult to arrange a pixel circuit due to a space limitation. Accordingly, copy light emitting elements that do not include a pixel circuit may be disposed in the boundary area. Accordingly, as emission areas providing light are additionally provided in the boundary area, it is possible to reduce a darkly visible boundary between the first area A1 and the second area A2. For example, the middle area AM may be an area provided to reduce the darkening of the boundary between the first area A1 and the second area A2.

FIG. 6 shows a pixel defining film PDL. The pixel defining film PDL may include pixel defining pattern layers PDL1 and a pixel defining layer PDL2.

The pixel defining pattern layers PDL1 may be disposed in the first area A1 and may be arranged to be spaced apart from each other. For example, the first area A1 may include transmissive areas TP and element area EP. For example, the pixel defining pattern layers PDL1 may not overlap the transmissive areas TP and may overlap the element area EP. A boundary between the transmissive areas TP and the element area EP may be defined by the first lower light blocking layer BML1 (refer to FIG. 7A), which will be described with reference to FIG. 9A. At least three openings may be defined in each of the pixel defining pattern layers PDL1. For example, openings corresponding to the first emission areas PXA1r, PXA1g, and PXA1b may be defined in each of the pixel defining pattern layers PDL1.

A first pixel unit PXU1 and an adjacent pixel unit PXU1n may be disposed in the first area A1. Each of the first pixel unit PXU1 and the adjacent pixel unit PXU1n may include first pixels PX1r, PX1g, and PX1b. The shapes of the first emission areas PXA1r, PXA1g, and PXA1b corresponding to the first pixel unit PXU1 and the shapes of the first emission areas PXA1r, PXA1g, and PXA1b corresponding to the adjacent pixel unit PXU1n may be identical to each other.

The first pixel unit PXU1 may be disposed between the four transmissive areas TP. The adjacent pixel unit PXU1n may be disposed between the transmissive areas TP disposed at the outermost of the first area A1 among the transmissive areas TP and the second area A2. Accordingly, the adjacent pixel unit PXU1n may be adjacent to two transmissive areas TP or three transmissive areas TP.

A second pixel unit PXU2 may be disposed in the second area A2. The second pixel unit PXU2 may include a first sub-pixel unit PXU2a and a second sub-pixel unit PXU2b. The first sub-pixel unit PXU2a may include a second-third color pixel PX2b and a second-second color pixel PX2g (or referred to as a second-second green pixel). The second sub-pixel unit PXU2b may include a second-first color pixel PX2r and a second-second color pixel PX2g (or referred to as a second-first green pixel).

The pixel defining layer PDL2 may cover a portion of the second area A2, the middle area AM, and the first area A1. For example, the pixel defining layer PDL2 may cover an area in which the adjacent pixel unit PXU1n of the first area A1 is disposed. In the pixel defining layer PDL2, openings corresponding to the first emission areas PXA1r, PXA1g, and PXA1b of the adjacent pixel unit PXU1n, openings corresponding to the second emission areas PXA2r, PXA2g, PXA2b, and openings corresponding to the third-first emission area PXA3r, the third-first copy emission area PXCr, the third-second emission area PXA3g, the third-second copy emission area PXCg, the third-third emission area PXA3b and the third-third copy emission area PXCb may be defined.

FIG. 6 illustrates a first spacer HSPC, a first protruding spacer SPC, a second spacer UHSPC, and a second protruding spacer USPC.

The first spacer HSPC may be disposed on the pixel defining layer PDL2. The first spacer HSPC may cover a portion of the second area A2, the middle area AM, and the first area A1 in the same way as the pixel defining layer PDL2. For example, the first spacer HSPC may cover an area in which the adjacent pixel units PXU1n of the first area A1 are disposed. For example, the first spacer HSPC may also cover an area in which the third-first copy emission area PXCr, the third-second copy emission area PXCg, and the third-third copy emission area PXCb of the middle area AM are disposed. As the first spacer HSPC is also provided in the middle area AM, adhesive properties between the layers of the display panel DP may be strengthened (or improved).

The first protruding spacer SPC may be disposed on the first spacer HSPC. The first protruding spacer SPC may have a circular shape in a plan view. The first protruding spacer SPC may be disposed in the second area A2. The first protruding spacer SPC may not be disposed in the middle area AM. The first protruding spacer SPC may be provided only between the second pixels PX2r, PX2g, and PX2b, but may not be provided between the third-first copy emission area PXCr, the third-second copy emission area PXCg, and the third-third copy emission area PXCb.

The height (or thickness) of the first protruding spacer SPC may be greater than the height (or thickness) of the first spacer HSPC. The height of the first spacer HSPC may be 0.1 μm to 0.5 μm, and the total height of the first spacer HSPC and the first protruding spacer SPC may be 1.1 μm to 2.0 μm. However, the height of the first spacer HSPC and the overall height of the first spacer HSPC and the first protruding spacer SPC are not limited to the above-described example.

First protruding spacers SPC may be provided. For example, two first protruding spacers SPC may be disposed adjacent to one second-second color pixel PX2g. According, the probability that a defect in engraving by the mask occurs during the manufacturing process may be further reduced.

The two first protruding spacers SPC may be repeatedly arranged with four second-second color pixels PX2g therebetween. For example, the two first protruding spacers SPC may be spaced apart from the other two first protruding spacers SPC with four second-second color pixels PX2g sequentially arranged in the first direction DR1 therebetween. For example, the two first protruding spacers SPC may be spaced apart from the other two first protruding spacers SPC with four second-second color pixels PX2g sequentially arranged in the second direction DR2 therebetween. However, the arrangement of the first protruding spacers SPC is not limited thereto. For example, the two first protruding spacers SPC may be repeatedly arranged with the two second-second color pixels PX2g therebetween. For example, in an embodiment, one of the two first protruding spacers SPC may be omitted.

The second spacer UHSPC may be disposed on the pixel defining pattern layer PDL1. The second protruding spacer USPC may be disposed on the second spacer UHSPC. When viewed in a plan view, an area of the second spacer UHSPC may be greater than an area of the second protruding spacer USPC. In a plan view, each of the second spacer UHSPC and the second protruding spacer USPC may be disposed in an area between the first-first emission area PXA1r and the first-second emission area PXA1g, an area between the first-first emission area PXA1r and the first-third emission area PXA1b, and an area between the first-second emission area PXA1g and the first-third emission area PXA1b.

Figure 7A:
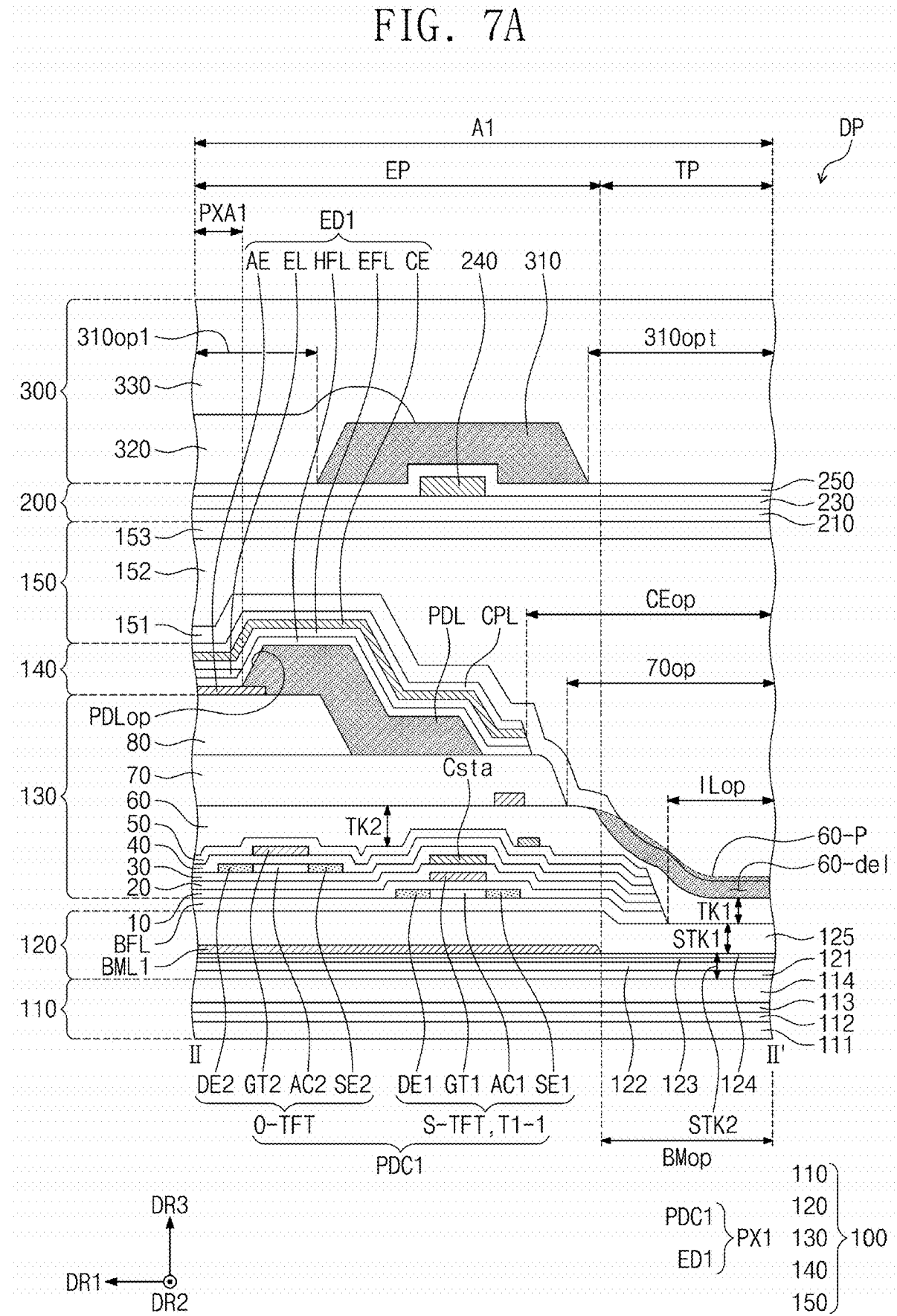
FIG. 7A is a schematic cross-sectional view illustrating a first area of a display panel according to an embodiment.
Figure 7B:
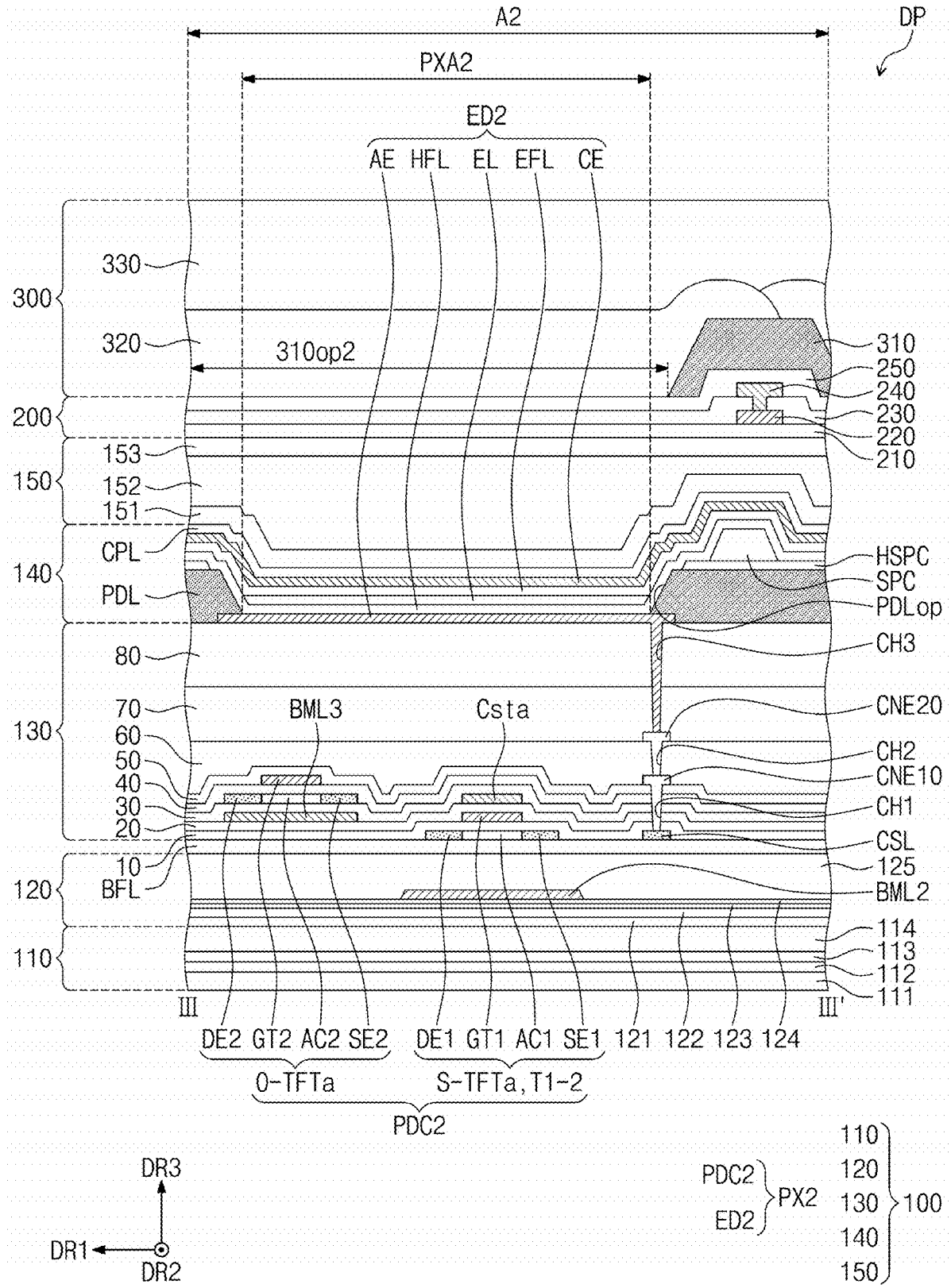
FIG. 7B is a schematic cross-sectional view illustrating a second area of a display panel according to an embodiment.
Figure 7C:
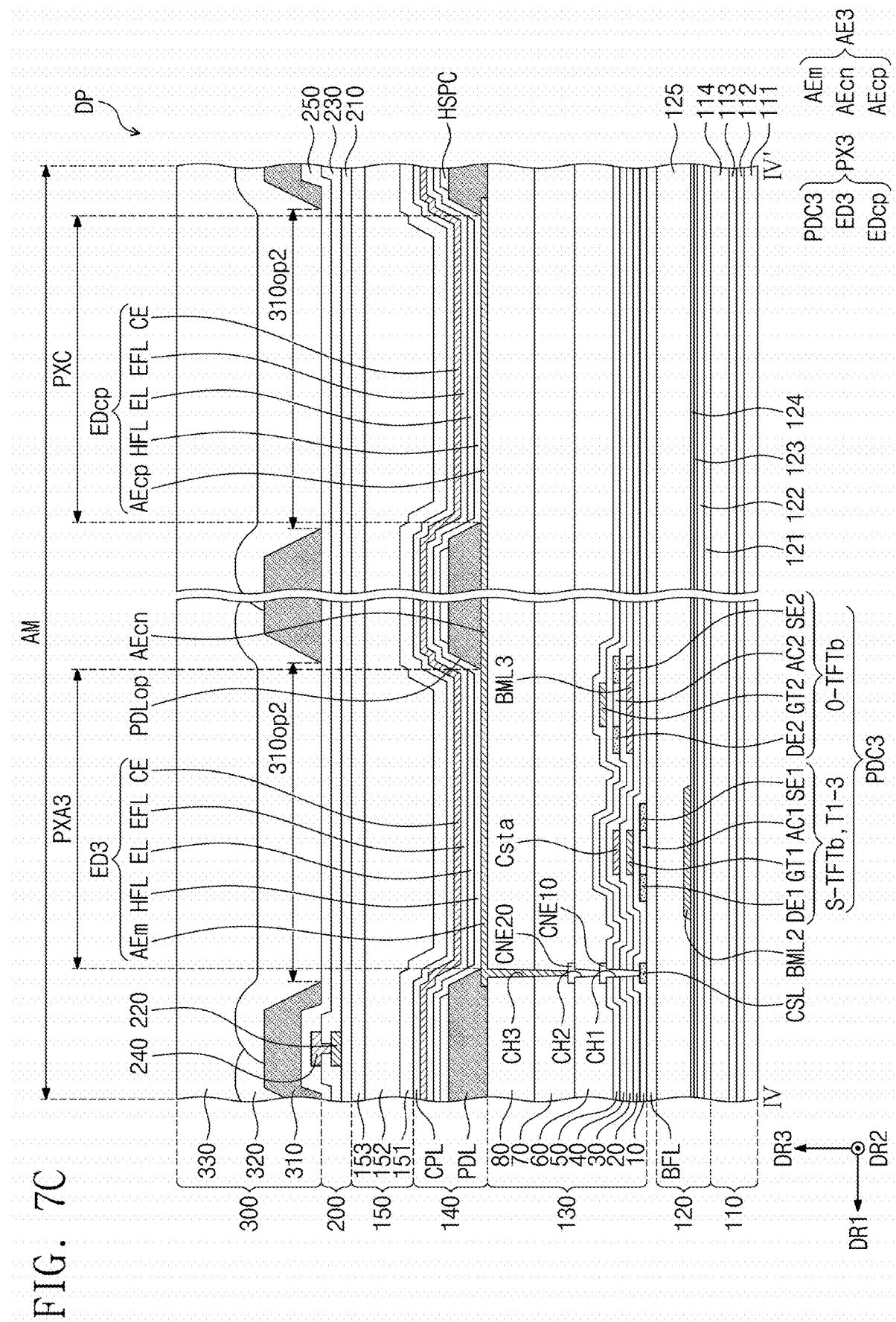
FIG. 7C is a schematic cross-sectional view illustrating a middle area of a display panel according to an embodiment.

FIG. 7A is a schematic cross-sectional view illustrating a first area A1 of a display panel DP according to an embodiment. FIG. 7B is a schematic cross-sectional view illustrating a second area A2 of the display panel DP according to an embodiment. FIG. 7C is a schematic cross-sectional view illustrating a middle area AM of a display panel DP according to an embodiment. FIG. 7A is a cross section taken along line II-IF of FIG. 6, FIG. 7B is a cross-section taken along line III-III' of FIG. 6, and FIG. 7C is a cross-section taken along line IV-IV' of FIG. 6.

Referring to FIGS. 7A, 7B, and 7C, the display panel DP may include a display layer 100, a sensor layer 200, and an anti-reflection layer 300. The display layer 100 may include a base layer 110, a barrier layer 120, a circuit layer 130, an element layer 140, and an encapsulation layer 150.

The base layer 110 may include first to fourth sub-base layers 111, 112, 113, and 114.

Each of the first sub-base layer 111 and the fourth sub-base layer 114 may include at least one of polyimide-based resin, acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. In the description "—"-based resin means to include a functional group of "—". For example, each of the first and fourth sub-base layers 111 and 114 may include polyimide.

Each of the second sub-base layer 112 and the third sub-base layer 113 may include an inorganic material. For example, each of the second sub-base layer 112 and the third sub-base layer 113 may include at least one of silicon oxide, silicon nitride, silicon oxynitride, and amorphous silicon. For example, the second sub-base layer 112 may include silicon oxynitride, and the third sub-base layer 113 may include silicon oxide.

The thickness of the first sub-base layer 111 may be greater than the thickness of the fourth sub-base layer 114. For example, the thickness of the first sub-base layer 111 may be about 100,000 angstroms, and the thickness of the fourth sub-base layer 114 may be about 56,000 angstroms. The thickness of the second sub-base layer 112 may be less than the thickness of the third sub-base layer 113. For example, the thickness of the second sub-base layer 112 may be about 1,000 angstroms, and the thickness of the third sub-base layer 113 may be about 5,000 angstroms. However, the thicknesses of the first to fourth sub-base layers 111, 112, 113, and 114 are not limited to the above-described values.

The barrier layer 120 may be disposed on the base layer 110. The barrier layer 120 may include sub-barrier layers 121, 122, 123, 124, and 125, a first lower light blocking layer BML1, and a second lower light blocking layer BML2.

The first and second lower light blocking layers BML1 and BML2 may be referred to as first and second lower layers, first and second lower metal layers, first and second lower electrode layers, first and second lower light shielding layers, first and second light blocking layers, first and second metal layers, first and second electrode layers, first and second light shielding layers, or first and second overlapping layers.

The sub-barrier layers 121, 122, 123, 124, and 125 may include a first sub-barrier layer 121, a second sub-barrier layer 122, a third sub-barrier layer 123, a fourth sub-barrier layer 124, and a fifth sub-barrier layer 125 sequentially stacked in a direction away from the base layer 110. Each of the first to fifth sub-barrier layers 121, 122, 123, 124, and 125 may include an inorganic material. For example, each of the first to fifth sub-barrier layers 121, 122, 123, 124, and 125 may include at least one of silicon oxide, silicon nitride, silicon oxynitride, and amorphous silicon. For example, the first sub-barrier layer 121 may include silicon oxynitride, the second sub-barrier layer 122 may include silicon oxide, the third sub-barrier layer 123 may include amorphous silicon, the fourth sub-barrier layer 124 may include silicon oxide, and the fifth sub-barrier layer 125 may include silicon oxide.

Among the first to fifth sub-barrier layers 121, 122, 123, 124, and 125, the fifth sub-barrier layer 125 may be closest to the circuit layer 130. The fifth sub-barrier layer 125 may be referred to as an upper sub-barrier layer. A thickness STK1 of the fifth sub-barrier layer 125 may be greater than a thickness of each of the first to fourth sub-barrier layers 121, 122, 123, and 124. For example, the thickness STK1 of the fifth sub-barrier layer 125 may be greater than the sum of the thicknesses STK2 of the first to fourth sub-barrier layers 121, 122, 123, and 124. For example, the thickness of the first sub-barrier layer 121 may be about 1,000 angstroms, the thickness of the second sub-barrier layer 122 may be about 1,500 angstroms, the thickness of the third sub-barrier layer 123 may be about 100 angstroms, the thickness of the fourth sub-barrier layer 124 may be about 130 angstroms, and the thickness of the fifth sub-barrier layer 125 may be about 4,200 angstroms. For example, the thickness STK1 of the fifth sub-barrier layer 125 may be greater than the above-described thickness.

The first lower light blocking layer BML1 may be disposed in the first area A1, and the second lower light blocking layer BML2 may be disposed in the second area A2 and the middle area AM. The first lower light blocking layer BML1 and the second lower light blocking layer BML2 may be electrically insulated from each other, and different signals may be applied to the first lower light blocking layer BML1 and the second lower light blocking layer BML2. For example, a constant voltage having a certain voltage level may be applied to the first lower light blocking layer BML1, and the first driving voltage ELVDD of FIG. 5 provided to the pixel circuit PDC of FIG. 5 may be provided to the second lower light blocking layer BML2.

The first lower light blocking layer BML1 and the second lower light blocking layer BML2 may be disposed on the same layer and may include the same material. For example, the first lower light blocking layer BML1 and the second lower light blocking layer BML2 may be disposed between the fourth sub-barrier layer 124 and the fifth sub-barrier layer 125. The first lower light blocking layer BML1 and the second lower light blocking layer BML2 may be covered by the fifth sub-barrier layer 125. Since the fifth sub-barrier layer 125 has the greatest thickness among the first to fifth sub-barrier layers 121, 122, 123, 124, and 125, a degree of change in characteristics of transistors may be reduced by voltages provided to the first and second lower light blocking layers BML1 and BML2.

The first lower light blocking layer BML1 may have a first opening BMop defining a transmissive area TP. The first lower light blocking layer BML1 may be a pattern layer that functions as a mask in case that the electrode opening CEop is formed in the common electrode CE. For example, light irradiated from the rear surface of the base layer 110 toward the common electrode CE may pass through the first opening BMop of the first lower light blocking layer BML1 to reach a portion of each of the common electrode CE and the capping layer CPL. For example, a portion of the common electrode CE and the capping layer CPL may be removed by the light passing through the first opening BMop of the first lower light blocking layer BML1. The light may include a laser beam.

An area overlapping the first opening BMop of the first lower light blocking layer BML1 in the first area A1 may be defined as a transmissive area TP, and the remaining area may be defined as an element area EP. The first pixels PX1r, PX1g and PX1b of FIG. 6 may be disposed in the element area EP, and the first pixels PX1r, PX1g and PX1b may be spaced apart from the transmissive area TP.

The buffer layer BFL may be disposed on the barrier layer 120. The buffer layer BFL may be provided in all of the first area A1, the second area A2, and the middle area AM. The buffer layer BFL may prevent diffusion of metal atoms or impurities from the base layer 110 into the first semiconductor pattern layer. For example, the buffer layer BFL may control a heat supply rate during a crystallization process for forming the first semiconductor pattern layer, so that the first semiconductor pattern layer may be uniformly formed.

The buffer layer BFL may include inorganic layers. For example, the buffer layer BFL may include a first sub-buffer layer including silicon nitride, and a second sub-buffer layer disposed on the first sub-buffer layer and including silicon oxide. The buffer layer BFL may not overlap the transmissive area TP. For example, an opening corresponding to the transmissive area TP may be defined in the buffer layer BFL. As the buffer layer BFL is not provided in the transmissive area TP, transmittance of the transmissive area TP may be further improved.

FIGS. 7A, 7B, and 7C show a first pixel PX1 disposed in a first area A1, a second pixel PX2 disposed in a second area A2, and a third pixel PX3 (or referred to as a middle pixel) disposed in the middle area AM, respectively. The first pixel PX1 may be one of the first pixels PX1r, PX1g, PX1b of FIG. 6, the second pixel PX2 may be one of the second pixels PX2r, PX2g, and PX2b of FIG. 6, and the third pixel PX3 may be one of the third pixels PX3r, PX3g, and PX3b of FIG. 6.

The first pixel PX1 may include a first light emitting element ED1 and a first pixel circuit PDC1. The second pixel PX2 may include a second light emitting element ED2 and a second pixel circuit PDC2. The third pixel PX3 may include a third light emitting element ED3, a copy light emitting element EDcp, and a third pixel circuit PDC3.

The circuit layer 130 may be disposed on the buffer layer BFL, and the element layer 140 may be disposed on the circuit layer 130.

Referring to FIG. 7A, a silicon thin film transistor S-TFT and an oxide thin film transistor O-TFT of the first pixel circuit PDC1 are illustrated by way of example. The silicon thin film transistor S-TFT may be one of the first, second, fifth, sixth, and seventh transistors T1, T2, T5, T6, and T7 described with reference to FIG. 5, and the oxide thin film transistor O-TFT may be one of the third and fourth transistors T3 and T4 described with reference to FIG. 5. For example, the silicon thin film transistor S-TFT may be the first driving transistor T1-1 included in the first pixel circuit PDC1.

The first to seventh transistors T1, T2, T3, T4, T5, T6, and T7 included in the first pixel circuit PDC1 may be referred to as first type transistors. In the first area A1, the first lower light blocking layer BML1 may overlap all of the first type transistors. For example, the first lower light blocking layer BML1 may overlap (e.g., completely overlap) the area in which the first pixel circuit PDC1 is disposed. Accordingly, the voltage provided to the first lower light blocking layer BML1 may be provided regardless of the operation of the first pixel circuit PDC1.

Referring to FIG. 7B, a silicon thin film transistor S-TFTa and an oxide thin film transistor O-TFTa of the second pixel circuit PDC2 are illustrated. The silicon thin film transistor S-TFTa may be one of the first, second, fifth, sixth, and seventh transistors T1, T2, T5, T6, and T7 described in FIG. 5, and the oxide thin film transistor O-TFTa may be one of the third and fourth transistors T3 and T4 described in FIG. 5. For example, the silicon thin film transistor S-TFTa may be the second driving transistor T1-2 included in the second pixel circuit PDC2.

The first to seventh transistors T1, T2, T3, T4, T5, T6, and T7 included in the second pixel circuit PDC2 may be referred to as second type transistors. In the second area A2, the second lower light blocking layer BML2 may overlap some of the second type transistors and may not overlap some of the second type transistors. For example, the second lower light blocking layer BML2 may overlap a portion of the area in which the second pixel circuit PDC2 is disposed, and may overlap the second driving transistor T1-2. Accordingly, the voltage provided to the second lower light blocking layer BML2 may be provided in synchronization with the operation of the second pixel circuit PDC2.

Referring to FIG. 7C, a silicon thin film transistor S-TFTb and an oxide thin film transistor O-TFTb of the third pixel circuit PDC3 are illustrated. The silicon thin film transistor S-TFTb may be one of the first, second, fifth, sixth, and seventh transistors T1, T2, T5, T6, and T7 described in FIG. 5, and the oxide thin film transistor O-TFTb may be one of the third and fourth transistors T3 and T4 described in FIG. 5. For example, the silicon thin film transistor S-TFTb may be the third driving transistor T1-3 included in the third pixel circuit PDC3.

The third pixel circuit PDC3 and the second pixel circuit PDC2 may have substantially the same structure as each other. In the middle area AM, the second lower light blocking layer BML2 may overlap a portion of the third pixel circuit PDC3 and may not overlap the remaining portion. For example, the second lower light blocking layer BML2 may overlap the third driving transistor T1-3. The copy light emitting element EDcp may be connected to the third pixel circuit PDC3 through the main pixel electrode AEm of the third light emitting element ED3. Accordingly, pixel circuit may not be disposed under the copy light emitting element EDcp. Accordingly, the copy light emitting element EDcp may not overlap the first lower light blocking layer BML1 and the second lower light blocking layer BML2.

Referring to FIGS. 7A, 7B, and 7C, the first semiconductor pattern layer may be disposed on the buffer layer BFL. The first semiconductor pattern layer may include a silicon semiconductor. For example, the silicon semiconductor may include amorphous silicon, polycrystalline silicon, or the like. For example, the first semiconductor pattern layer may include low-temperature polysilicon.

FIGS. 7A, 7B, and 7C illustrate only a portion of the first semiconductor pattern layer disposed on the buffer layer BFL, and a first semiconductor pattern layer may be further disposed in another area. The first semiconductor pattern layer may be arranged in a specific rule across the pixels. The first semiconductor pattern layer may have different electrical properties depending on whether it is doped or not. The first semiconductor pattern layer may include a first area having high conductivity and a second area having low conductivity. The first area may be doped with an N-type dopant or a P-type dopant. The P-type transistor may include a doping area doped with a P-type dopant, and the N-type transistor may include a doping area doped with an N-type dopant. The second area may be a non-doped area or a doped area at a lower concentration than the first area.

The conductivity of the first area may be greater than that of the second area, and the first area may substantially function as an electrode or a signal line. The second area may substantially correspond to an active area (or channel) of the transistor. For example, a part of the first semiconductor pattern layer may be an active area of the transistor, another part may be a source area or drain area of the transistor, and another part may be a connection electrode or a connection signal line.

The source area SE1, the active area AC1, and the drain area DE1 of the silicon thin film transistors S-TFT, S-TFTa, and S-TFTb may be formed from the first semiconductor pattern layer. The source area SE1 and the drain area DE1 may extend in opposite directions from the active area AC1 in the cross-section.

FIGS. 7B and 7C illustrate a portion of the connection signal line CSL formed from the first semiconductor pattern layer. The connection signal line CSL may be electrically connected to the second electrode of the sixth transistor T6 (refer to FIG. 5) and the second electrode of the seventh transistor T7 (refer to FIG. 5).

The circuit layer 130 may include inorganic layers and organic layers. In an embodiment, the first to fifth insulating layers 10, 20, 30, 40, and 50 sequentially stacked on the buffer layer BFL may be inorganic layers, and the sixth to eighth insulating layers 60, 70, and 80 may be organic layers.

The first insulating layer 10 may be disposed on the buffer layer BFL. The first insulating layer 10 may cover the first semiconductor pattern layer. The first insulating layer 10 may be an inorganic layer and/or an organic layer, and may have a single layer structure or a multilayer structure. The first insulating layer 10 may include at least one of aluminum oxide, titanium oxide, silicon oxide, silicon nitride, silicon oxynitride, zirconium oxide, and hafnium oxide. In this embodiment, the first insulating layer 10 may be a single-layer silicon oxide layer. In addition to the first insulating layer 10, the insulating layer of the circuit layer 130 to be described below may have a single-layer structure or a multi-layer structure.

The gate electrode GT1 of the silicon thin film transistor S-TFT, S-TFTa, or S-TFTb may be disposed on the first insulating layer 10. The gate electrode GT1 may be a part of the metal pattern layer. The gate electrode GT1 may overlap the active area AC1. In the process of doping the first semiconductor pattern layer, the gate electrode GT1 may function as a mask. The gate electrode GT1 may include titanium, silver, an alloy containing silver, molybdenum, an alloy containing molybdenum, aluminum, an alloy containing aluminum, aluminum nitride, tungsten, tungsten nitride, copper, indium tin oxide, or indium zinc oxide, but embodiments are not limited thereto.

The second insulating layer 20 may be disposed on the first insulating layer 10 and may cover the gate electrode GT1. The second insulating layer 20 may be an inorganic layer and may have a single-layer structure or a multi-layer structure. The second insulating layer 20 may include at least one of silicon oxide, silicon nitride, and silicon oxynitride. In this embodiment, the second insulating layer 20 may have a single-layer structure including a silicon nitride layer.

The third insulating layer 30 may be disposed on the second insulating layer 20. The third insulating layer 30 may be an inorganic layer and may have a single-layer structure or a multi-layer structure. For example, the third insulating layer 30 may have a multilayer structure including a silicon oxide layer and a silicon nitride layer. An electrode Csta of the first capacitor Cst of FIG. 5 may be disposed between the second insulating layer 20 and the third insulating layer 30. For example, another electrode of the first capacitor Cst may be disposed between the first insulating layer 10 and the second insulating layer 20.

The second semiconductor pattern layer may be disposed on the third insulating layer 30. The second semiconductor pattern layer may include an oxide semiconductor. The oxide semiconductor may include areas divided according to whether or not the metal oxide is reduced. An area in which the metal oxide is reduced (hereinafter, a reduced area) has greater conductivity than an area in which the metal oxide is not reduced (hereinafter, a non-reduced area). The reduced area may substantially function as the source/drain area of the transistor or signal line. The non-reduced area may substantially correspond to the active area (or semiconductor area, channel) of the transistor. For example, a portion of the second semiconductor pattern layer may be an active area of the transistor, another portion may be a source/drain area of the transistor, and another portion may be a signal transmission area.

The source area SE2, the active area AC2, and the drain area DE2 of the oxide thin film transistors O-TFT, O-TFTa, and O-TFTb may be formed from the second semiconductor pattern layer. The source area SE2 and the drain area DE2 may extend in opposite directions from the active area AC2 in the cross-section.

The oxide thin film transistor O-TFT disposed in the first area A1 may overlap the first lower light blocking layer BML1. Accordingly, light incident from the lower portion of the display panel DP may be blocked by the first lower light blocking layer BML1 and may not be provided to the active area AC2 of the oxide thin film transistor O-TFT.

The oxide thin film transistor O-TFTa disposed in the second area A2 and the oxide thin film transistor O-TFTb disposed in the middle area AM may not overlap the second lower light blocking layer BML2. Accordingly, a layer for blocking light under the oxide thin film transistors O-TFTa and O-TFTb may be added. For example, a third lower light blocking layer BML3 may be disposed under the oxide thin film transistors O-TFTa and O-TFTb disposed in the second area A2 and the middle area AM. The third lower light blocking layer BML3 may be disposed between the second insulating layer 20 and the third insulating layer 30. The third lower light blocking layer BML3 and the electrode Csta of the first capacitor Cst of FIG. 5 may include the same material and may be formed by the same process.

The fourth insulating layer 40 may be disposed on the third insulating layer 30. The fourth insulating layer 40 may cover the second semiconductor pattern layer. The fourth insulating layer 40 may be an inorganic layer and may have a single-layer structure or a multi-layer structure. The fourth insulating layer 40 may include at least one of aluminum oxide, titanium oxide, silicon oxide, silicon nitride, silicon oxynitride, zirconium oxide, and hafnium oxide. In this embodiment, the fourth insulating layer 40 may have a single-layer structure including a silicon oxide layer.

The gate electrode GT2 of the oxide thin film transistors O-TFT, O-TFTa, and O-TFTb may be disposed on the fourth insulating layer 40. The gate electrode GT2 may be a part of the metal pattern layer. The gate electrode GT2 may overlap the active area AC2. In the process of reducing the second semiconductor pattern layer, the gate electrode GT2 may function as a mask.

The fifth insulating layer 50 may be disposed on the fourth insulating layer 40 and may cover the gate electrode GT2. The fifth insulating layer 50 may be an inorganic layer and/or an organic layer, and may have a single layer structure or a multilayer structure. For example, the fifth insulating layer 50 may have a multilayer structure including a silicon oxide layer and a silicon nitride layer.

The first connection electrode CNE10 may be disposed on the fifth insulating layer 50. The first connection electrode CNE10 may be connected to the connection signal line CSL through a first contact hole CH1 passing through the first to fifth insulating layers 10, 20, 30, 40, and 50.

A second opening ILop may be defined in the buffer layer BFL and at least some of the insulating layers 10, 20, 30, 40, 50, 60, 70, and 80 included in the circuit layer 130. For example, a second opening ILop may be defined in the buffer layer BFL and the first to fifth insulating layers 10, 20, 30, 40, and 50. The second opening ILop may be defined in an area overlapping the transmissive area TP. For example, as a portion of each of the buffer layer BFL and the first to fifth insulating layers 10, 20, 30, 40, and 50 overlapping the transmissive area TP are removed, the transmittance of the transmissive area TP may be improved.

The minimum width of the second opening ILop may be less than the minimum width of the first opening BMop. Sidewalls of the buffer layer BFL and the first to fifth insulating layers 10, 20, 30, 40, and 50 defining the second opening ILop may further protrude toward the transmissive area TP than the sidewall of the first lower light blocking layer BML1.

The sixth insulating layer 60 may be disposed on the fifth insulating layer 50. The sixth insulating layer 60 may include an organic material, and the sixth insulating layer 60 may include a polyimide-based resin. For example, the sixth insulating layer 60 may include photosensitive polyimide. The second connection electrode CNE20 may be disposed on the sixth insulating layer 60. The second connection electrode CNE20 may be connected to the first connection electrode CNE10 through the second contact hole CH2 passing through the sixth insulating layer 60.

The sixth insulating layer 60 may be disposed in both the element area EP and the transmissive area TP. The sixth insulating layer 60 may be referred to as a common organic layer. The sixth insulating layer 60 may fill a portion in which the second opening ILop is defined. For example, the sixth insulating layer 60 may overlap the transmissive area TP. As the sixth insulating layer 60 is provided in the transmissive area TP, a step difference of the upper surface of the sixth insulating layer 60 may be reduced. In case that the step difference between the layers overlapping the transmissive area TP is reduced, diffraction of light incident to the transmissive area TP may be relaxed (or reduced). Accordingly, distortion of the image due to diffraction may be reduced, so that the quality of an image obtained from the camera module CMM of FIG. 2A may be improved.

A portion of the preliminary common organic layer 60-P disposed in the transmissive area TP in the thickness direction (or the third direction DR3) may be removed to form (or provide) the sixth insulating layer 60. In FIG. 7A, the preliminary common organic layer 60-P is indicated by a dotted line, and the removed portion 60-del is indicated by dark hatching. A halftone mask may be used to form the sixth insulating layer 60 from the preliminary common organic layer 60-P.

The first thickness TK1 of the sixth insulating layer 60 in the transmissive area TP may be less than the second thickness TK2 of the sixth insulating layer 60 in the element area EP. For example, the first thickness TK1 may be a minimum thickness or an average thickness of the sixth insulating layer 60 in the transmissive area TP, and the second thickness TK2 may be a maximum thickness or an average thickness of the sixth insulating layer 60 in the element area EP. The first thickness TK1 may be about 40 percent or more and less than 100 percent of the second thickness TK2. As the difference between the first thickness TK1 and the second thickness TK2 increases, the step difference of the upper surface of the sixth insulating layer 60 may increase. For example, in the process of patterning the conductive layer closest to the transmissive area TP, the conductive layer may be more patterned (or removed) than the design. For example, the probability that the line (or wiring) becomes thinner may increase, and accordingly, the probability of occurrence of a defect may increase. As in the embodiment, in case that the first thickness TK1 is provided to be about 40% or more of the second thickness TK2, the probability of occurrence of the defect may be reduced. Accordingly, the transmittance of the transmissive area TP may be improved by providing the first thickness TK1 to be greater than or equal to about 40 percent of the second thickness TK2, and a side effect thereof may be minimized.

For example, in case that the second thickness TK2 is about 15,000 angstroms, the first thickness TK1 may be about 6,000 angstroms or more and about 10,000 angstroms or less. In case that the first thickness TK1 exceeds about 10,000 angstroms, the transmittance improvement effect may be reduced. Accordingly, the first thickness TK1 may be determined within a range of about 40 percent or more of the second thickness TK2 and about 10,000 angstroms or less.

The seventh insulating layer 70 may be disposed on the sixth insulating layer 60 and may cover the second connection electrode CNE20. A third opening 70*op* may be defined in the seventh insulating layer 70. The third opening 70*op* may be defined in an area overlapping the transmissive area TP. A minimum width of the third opening 70*op* may be larger than the minimum width of the first opening BMop and the minimum width of the second opening ILop. The eighth insulating layer 80 may be disposed on the seventh insulating layer 70.

Each of the sixth insulating layer 60, the seventh insulating layer 70, and the eighth insulating layer 80 may be an organic layer. In the description, the sixth insulating layer 60 may be referred to as a first organic insulating layer, the seventh insulating layer 70 may be referred to as a second organic insulating layer, and the eighth insulating layer 80 may be referred to as a third organic insulating layer. For example, each of the sixth insulating layer 60, the seventh insulating layer 70, and the eighth insulating layer 80 may include general purpose polymers such as Benzocyclobutene (BCB), polyimide, Hexamethyldisiloxane (HMDSO), Polymethylmethacrylate (PMMA), or polystyrene (PS), polymer derivatives having phenol-based groups, acryl-based polymers, imide-based polymers, arylether-based polymers, amide-based polymers, fluorine-based polymers, p-xylene-based polymers, vinyl alcohol-based polymers, or blends thereof, and the like.

Referring to FIGS. 7A, 7B, and 7C, the element layer 140 including the first to third light emitting elements ED1, ED2, and ED3 and the copy light emitting element EDcp may be disposed on the circuit layer 130. Each of the first and second light emitting elements ED1 and ED2 may include a pixel electrode AE (or an anode), a first functional layer HFL, a light emitting layer EL, a second functional layer EFL, and a common electrode CE (or cathode). The third light emitting element ED3 and the copy light emitting element EDcp may include a third pixel electrode AE3, a first functional layer HFL, a light emitting layer EL, a second functional layer EFL, and a common electrode CE (or a cathode). The first functional layer HFL, the second functional layer EFL, and the common electrode CE may be provided in common to the pixels PX of FIG. 4.

The pixel electrode AE and the third pixel electrode AE3 may be disposed on the eighth insulating layer 80. The pixel electrode AE and the third pixel electrode AE3 may be connected to the second connection electrode CNE20 through the third contact hole CH3 passing through the seventh insulating layer 70 and the eighth insulating layer 80. The pixel electrode AE and the third pixel electrode AE3 may be a semi-transmissive electrode, a transmissive electrode, or a reflective electrode. In an embodiment, the pixel electrode AE and the third pixel electrode AE3 may include a reflective layer formed of silver, magnesium, aluminum, platinum, palladium, gold, nickel, neodymium, iridium, chromium, or a compound thereof, and a transparent or translucent electrode layer formed on the reflective layer. The transparent or translucent electrode layer may include at least one selected from the group consisting of indium tin oxide, indium zinc oxide, indium gallium zinc oxide, zinc oxide or indium oxide, and aluminum-doped zinc oxide. For example, the pixel electrode AE and the third pixel electrode AE3 may include a multilayer structure in which indium tin oxide, silver, and indium tin oxide are sequentially stacked.

The third pixel electrode AE3 may include a main pixel electrode AEm, a connection electrode AEcn, and a copy pixel electrode AEcp. The main pixel electrode AEm may be included in the third light emitting element ED3, and the copy pixel electrode AEcp may be included in the copy light emitting element EDcp. The connection electrode AEcn may electrically connect the third light emitting element ED3 and the copy light emitting element EDcp.

A pixel defining film PDL may be disposed on the eighth insulating layer 80. The pixel defining film PDL may have a property of absorbing light, and for example, the pixel defining film PDL may have a black color. The pixel defining film PDL may include a black coloring agent. The black coloring agent may include a black dye and a black pigment. The black coloring agent may include carbon black, a metal such as chromium, or an oxide thereof.

An opening PDLop exposing a portion of each of the pixel electrode AE and the third pixel electrode AE3 may be defined in the pixel defining film PDL. For example, the pixel defining film PDL may cover the edge portion of the pixel electrode AE. For example, the pixel defining film PDL may cover a side surface of the eighth insulating layer 80 adjacent to the transmissive area TP. The pixel defining film PDL may be spaced apart from the side surface of the seventh insulating layer 70 adjacent to the transmissive area TP. Accordingly, the pixel defining film PDL may stably contact the seventh insulating layer 70 and the eighth insulating layer 80.

Emission areas may be defined by openings PDLop defined in a pixel defining film PDL. For example, a first emission area PXA1 may be defined in the first light emitting element ED1, a second emission area PXA2 may be defined in the second light emitting element ED2, a third emission area PXA3 may be defined in the third light emitting element ED3, and a copy emission area PXC may be defined in the copy light emitting element EDcp. Since the third emission area PXA3 and the copy emission area PXC share the third pixel electrode AE3, they may emit light simultaneously.

The first spacer HSPC may be disposed on the pixel defining layer PDL2 (refer to FIG. 6). The first protruding spacer SPC may be disposed on the first spacer HSPC. The first spacer HSPC and the first protruding spacer SPC may have an integral shape and may be formed of the same material. For example, the first spacer HSPC and the first protruding spacer SPC may be formed by the halftone mask in the same process. However, this is only an example and embodiments are not limited thereto. For example, the first spacer HSPC and the first protruding spacer SPC may include different materials or may be formed by separate processes.

As shown in FIG. 6, the second spacer UHSPC and the first spacer HSPC may have substantially the same thickness as each other, and the second protruding spacer USPC and the first protruding spacer SPC may have substantially the same thickness as each other. For example, the cross-sectional shapes of the second spacer UHSPC and the second protruding spacer USPC may be similar to the cross-sectional shapes of the first spacer HSPC and the first protruding spacer SPC illustrated in FIG. 7B.

The first functional layer HFL may be disposed on the pixel electrode AE, the pixel defining film PDL, the first spacer HSPC, and the first protruding spacer SPC. The first functional layer HFL may include a hole transport layer (HTL), a hole injection layer (HIL), or both the HTL and the HIL. The first functional layer HFL may be disposed throughout the first area A1, the second area A2, and the middle area AM.

The light emitting layer EL may be disposed on the first functional layer HFL, and may be disposed in an area corresponding to the opening PDLop of the pixel defining film PDL. The light emitting layer EL may include an organic material, an inorganic material, or an organic-inorganic material, which emit light of a certain color. The light emitting layer EL may be disposed in the first area A1, the second area A2, and the middle area AM. The light emitting layer EL disposed in the first area A1 may be disposed in an area spaced apart from the transmissive area TP, e.g., in the element area EP.

The second functional layer EFL may be disposed on the first functional layer HFL and may cover the light emitting layer EL. The second functional layer EFL may include an electron transport layer (ETL), an electron injection layer (EIL), or both the ETL and the EIL. The second functional layer EFL may be disposed throughout the first area A1, the second area A2, and the middle area AM.

The common electrode CE may be disposed on the second functional layer EFL. The common electrode CE may be disposed in the first area A1, the second area A2, and the middle area AM. An electrode opening CEop overlapping the first opening BMop may be defined in the common electrode CE. The minimum width of the electrode opening CEop may be greater than the minimum width of the first opening BMop of the first lower light blocking layer BML1.

The element layer 140 may further include a capping layer CPL disposed on the common electrode CE. The capping layer CPL may function to improve emission efficiency by the principle of constructive interference. The capping layer CPL may include, for example, a material having a refractive index of about 1.6 or more with respect to light having a wavelength of about 589 nm. The capping layer CPL may be an organic capping layer including an organic material, an inorganic capping layer including an inorganic material, or a composite capping layer including an organic material and an inorganic material. For example, the capping layer CPL may include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. Carbocyclic compounds, heterocyclic compounds, and amine group-containing compounds may optionally be substituted with substituents including O, N, S, Se, Si, F, Cl, Br, I, or any combination thereof.

A portion of the capping layer CPL overlapping the electrode opening CEop of the common electrode CE may be removed. As a portion of the capping layer CPL including a portion overlapping the transmissive area TP and a portion of the common electrode CE are removed, the transmittance of the transmissive area TP may be further improved.

The encapsulation layer 150 may be disposed on the element layer 140. The encapsulation layer 150 may include an inorganic layer 151, an organic layer 152, and an inorganic layer 153 that are sequentially stacked, but the layers of the encapsulation layer 150 are not limited thereto.

The inorganic layers 151 and 153 may protect the element layer 140 from moisture and oxygen, and the organic layer 152 may protect the element layer 140 from foreign substances such as dust particles. The inorganic layers 151 and 153 may include a silicon nitride layer, a silicon oxynitride layer, a silicon oxide layer, a titanium oxide layer, or an aluminum oxide layer. The organic layer 152 may include an acrylic organic layer, but embodiments are not limited thereto.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be disposed (e.g., directly disposed) on the display layer 100. The sensor base layer 210 may be an inorganic layer including at least one of silicon nitride, silicon oxynitride, and silicon oxide. In another example, the sensor base layer 210 may be an organic layer including an epoxy-based resin, an acryl-based resin, or an imide-based resin. The sensor base layer 210 may have a single-layer structure or a multi-layer structure stacked along the third direction DR3.

Each of the first sensor conductive layer 220 and the second sensor conductive layer 240 may have a single-layer structure or a multi-layer structure stacked along the third direction DR3.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide, indium zinc oxide, zinc oxide, or indium zinc tin oxide. For example, the transparent conductive material may include a conductive polymer such as poly(3,4-ethylenedioxythiophene) (PEDOT), metal nanowires, graphene, and the like.

The multilayered conductive layer may include metal layers. The metal layers may have a three-layer structure of, for example, titanium/aluminum/titanium. The multilayered conductive layer may include at least one metal layer and at least one transparent conductive layer.

The sensor insulating layer 230 may be disposed between the first sensor conductive layer 220 and the second sensor conductive layer 240. The sensor insulating layer 230 may include an inorganic layer. The inorganic layer may include at least one of aluminum oxide, titanium oxide, silicon oxide, silicon nitride, silicon oxynitride, zirconium oxide, and hafnium oxide.

In another example, the sensor insulating layer 230 may include an organic layer. The organic layer may include at least one of acryl-based resin, methacryl-based resin, polyisoprene-based resin, vinyl-based resin, epoxy-based resin, urethane-based resin, cellulose-based resin, siloxane-based resin, polyimide-based resin, polyamide-based resin, and perylene-based resin.

The sensor cover layer 250 may be disposed on the sensor insulating layer 230 and cover the second sensor conductive layer 240. The second sensor conductive layer 240 may include a conductive pattern layer 240P of FIG. 13A. The sensor cover layer 250 may cover the conductive pattern layer 240P, and may reduce or eliminate the probability of damage to the conductive pattern layer 240P in a subsequent process.

The sensor cover layer 250 may include an inorganic material. For example, the sensor cover layer 250 may include silicon nitride, but embodiments are not limited thereto.

The anti-reflection layer 300 may be disposed on the sensor layer 200. The anti-reflection layer 300 may include a bank layer (or partition layer) 310, color filters 320, and a planarization layer 330. The bank layer 310 and the color filters 320 may not be disposed in the transmissive area TP of the first area A1.

Figure 13A:
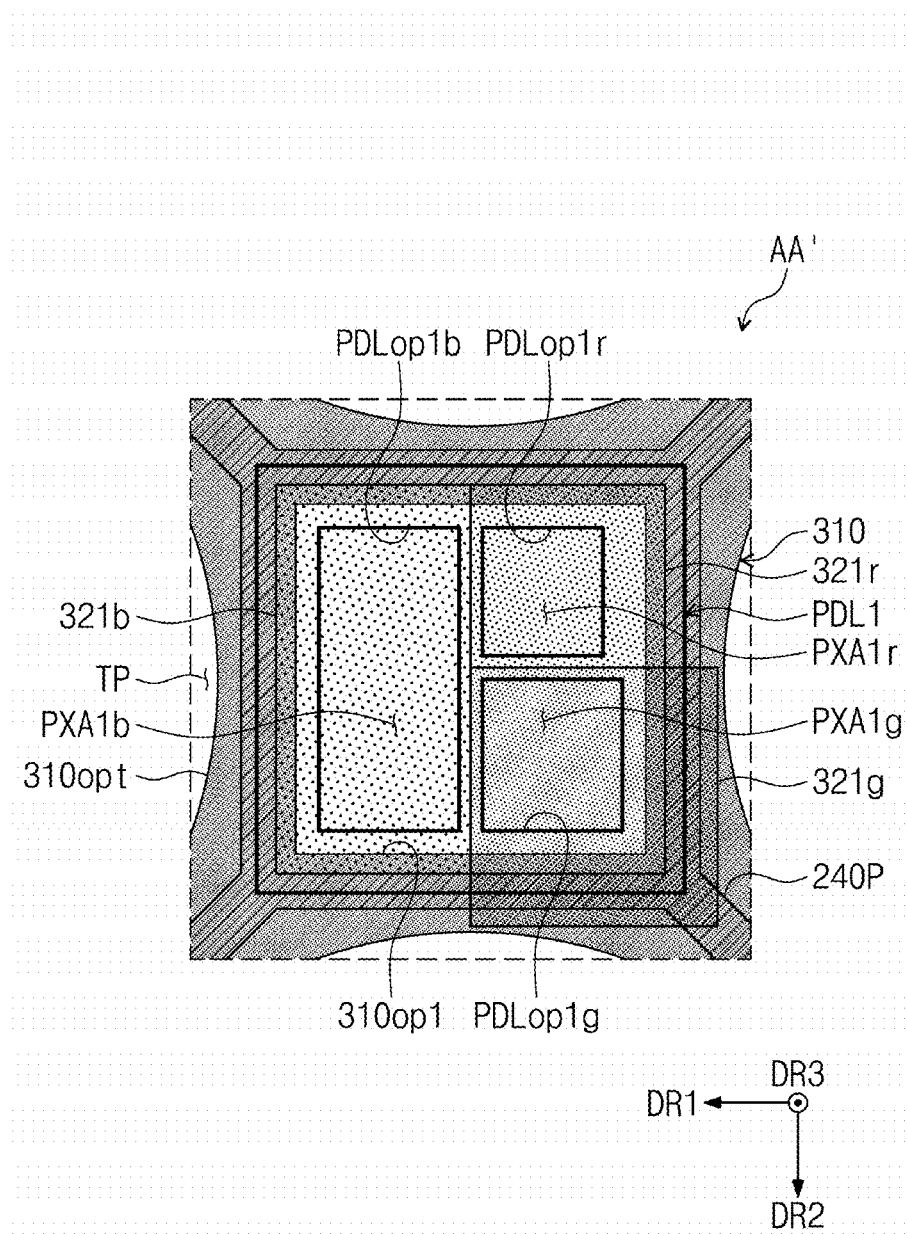
FIG. 13A is a schematic enlarged plan view of a partial area of a display panel according to an embodiment.

The bank layer 310 may overlap the conductive pattern layer 240P of FIG. 13A of the second sensor conductive layer 240. The sensor cover layer 250 may be disposed between the bank layer 310 and the second sensor conductive layer 240. The bank layer 310 may prevent reflection of external light by the second sensor conductive layer 240. The material of the bank layer 310 may not be limited as long as it is a material that absorbs light. The bank layer 310 may be a layer having a black color, and in an embodiment, the bank layer 310 may include a black coloring agent. The black coloring agent may include a black dye and a black pigment. The black coloring agent may include carbon black, a metal such as chromium, or an oxide thereof.

Figure 12:
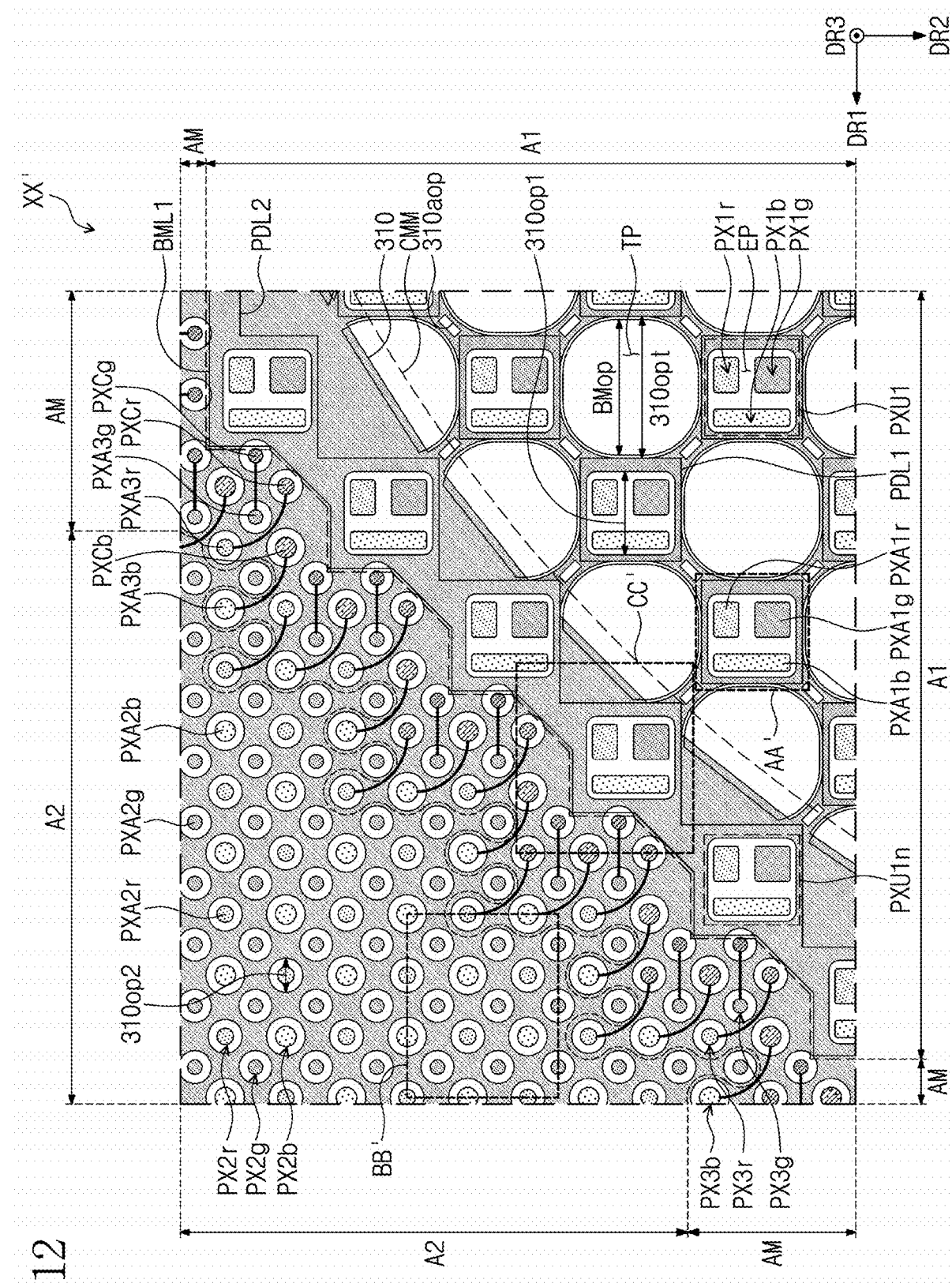
FIG. 12 is a schematic enlarged plan view of a partial area of a display panel according to an embodiment.

Bank openings 310op1 and 310op2 and a transmission opening 310opt may be defined in the bank layer 310. The bank openings 310op1 and 310op2 may overlap the light emitting layers EL, respectively. For reference, the shape of the bank layer 310 in a plan view is shown in FIG. 12. The color filters 320 may be disposed to correspond to the bank openings 310op1 and 310op2. The color filter 320 may transmit light provided from the light emitting layer EL overlapping the color filter 320.

The transmission opening 310opt of the bank layer 310 may overlap the first opening BMop of the first lower light blocking layer BML1. The minimum width of the transmission opening 310opt of the bank layer 310 and the minimum width of the first opening BMop of the first lower light blocking layer BML1 may be substantially the same as each other. For example, in an area adjacent to the transmissive area TP, the end portion of the bank layer 310 may be substantially aligned with the end portion of the first lower light blocking layer BML1. In the description, that each component is "substantially aligned" or that the width of each component is "substantially the same" includes not only cases where each component is completely aligned or the width of each component has the same size physically, but also includes cases where they are identical within the error range that occurs in the process despite being identical in design.

In an area adjacent to the transmissive area TP, the end portion of the bank layer 310 may protrude more toward the transmissive area TP than the end portion of the pixel defining film PDL and the end portion of the common electrode CE.

The planarization layer 330 may cover the bank layer 310 and the color filters 320. The planarization layer 330 may include an organic material, and may provide a flat surface on the upper surface of the planarization layer 330. In an embodiment, the planarization layer 330 may be omitted.

In an embodiment, the anti-reflection layer 300 may include a reflection adjustment layer instead of the color filters 320. For example, the color filters 320 may be omitted from the drawings of FIGS. 7A, 7B, and 7C, and a reflection adjustment layer may be added at a place where the color filters 320 are omitted. The reflection adjustment layer may selectively absorb light of a partial band among light reflected from the inside of the display panel DP and/or the electronic device EDE of FIG. 1A or light incident from the outside of the display panel DP and/or the electronic device EDE.

As an example, the reflection adjustment layer absorbs light of a first wavelength range of about 490 nm to about 505 nm and a second wavelength range of about 585 nm to about 600 nm, so that the transmittance of light in the first wavelength range and the second wavelength range may be about 40% or less. The reflection adjustment layer may absorb light having a wavelength out of wavelength ranges of red, green, and blue light emitted from the light emitting layer EL. As such, the reflection adjustment layer absorbs light of a wavelength that does not belong to the wavelength range of red, green, or blue light emitted from the light emitting layer EL, so that a decrease in luminance of the display panel DP and/or the electronic device EDE may be prevented or minimized. For example, reduction in emission efficiency of the display panel and/or electronic device may be prevented or minimized at the same time, and visibility may be improved.

The reflection adjustment layer may be provided as an organic material layer including a dye, a pigment, or a combination thereof. The reflection adjustment layer may include a tetraazaporphyrin (TAP)-based compound, porphyrin-based compound, a metal porphyrin-based compound, an oxazine-based compound, a squarylium-based compound, a triarylmethane-based compound, a polymethine-based compound, a anthaquinone-based compound, a phthalocyanine-based compound, an azo-based compound, a perylene-based compound, a xanthene-based compound, a diimmonium-based compound, a dipyrromethene-based compound, a cyanine-based compound, and combinations thereof.

In an embodiment, the reflection adjustment layer may have a transmittance of about 64% to about 72%. The transmittance of the reflection adjustment layer may be adjusted according to the content of pigments and/or dyes included in the reflection adjustment layer. The reflection adjustment layer may overlap the emission areas in a plan view, but may not overlap the transmissive area TP in a plan view.

Figure 8A:
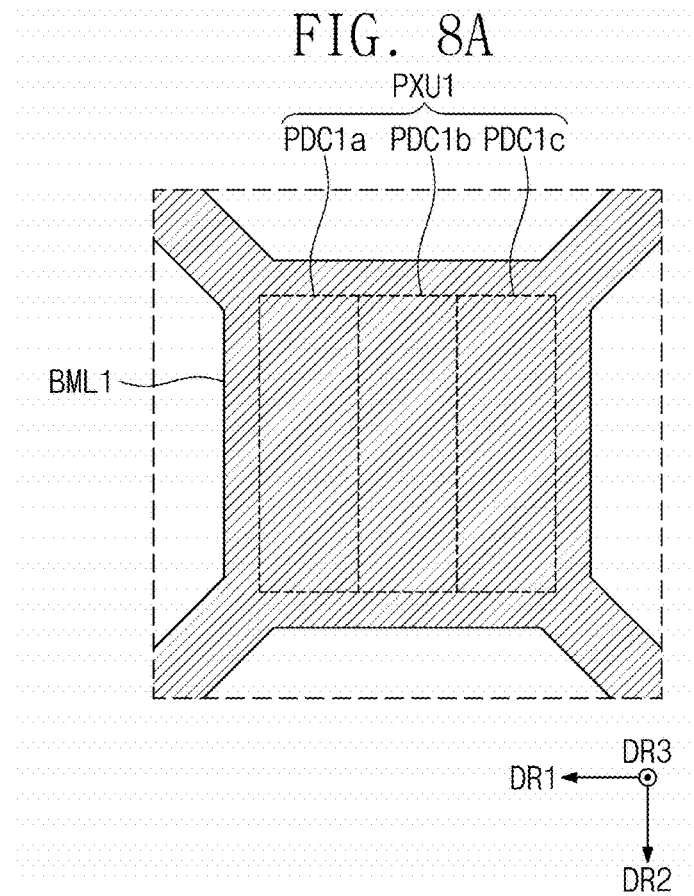
FIG. 8A is a schematic plan view illustrating a portion of a first lower light blocking layer according to an embodiment.
Figure 8B:
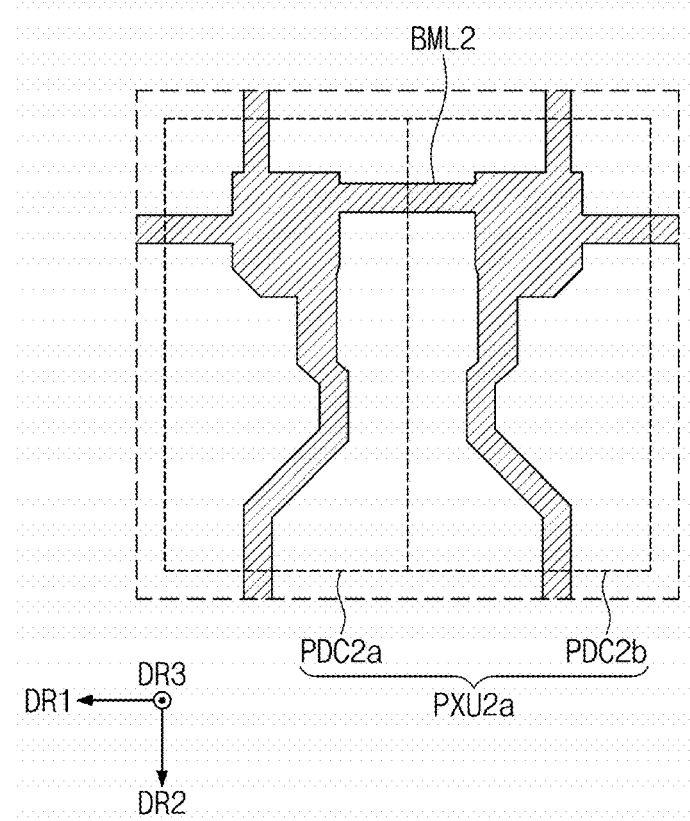
FIG. 8B is a schematic plan view illustrating a portion of a second lower light blocking layer according to an embodiment.

FIG. 8A is a schematic plan view illustrating a portion of a first lower light blocking layer BML1 according to an embodiment. FIG. 8B is a schematic plan view illustrating a portion of a second lower light blocking layer BML2 according to an embodiment.

In FIG. 8A, the first pixel unit PXU1 overlapping the first lower light blocking layer BML1 is illustrated with a dotted line, and in FIG. 8B, the first sub-pixel unit PXU2a overlapping the second lower light blocking layer BML2 is illustrated with a dotted line. Since the arrangement relationship between the second sub-pixel unit PXU2b of FIG. 6 and the second lower light blocking layer BML2 has substantially the same structure as the arrangement relationship between the first sub-pixel unit PXU2a and the second lower light blocking layer BML2, a description thereof will be omitted.

The first pixel unit PXU1 may include three first pixel circuits PDC1a, PDC1b, and PDC1c. The second sub-pixel unit PXU2a may include two second pixel circuits PDC2a and PDC2b. The dotted line regions illustrated in FIGS. 8A and 8B may correspond to regions in which three first pixel circuits PDC1a, PDC1b, and PDC1c and two second pixel circuits PDC2a and PDC2b are disposed, respectively.

Referring to FIGS. 8A and 8B, the first lower light blocking layer BML1 and the second lower light blocking layer BML2 may be disposed on the same layer and may be simultaneously formed by the same process. Thus, as compared to the process of forming the first and second lower light blocking layers formed on different layers, in the process of forming the first and second lower light blocking layers BML1 and BML2 according to an embodiment, the mask process may be omitted once. Accordingly, the manufacturing process of the display panel DP of FIG. 7A may be simplified, and thus the manufacturing cost of the display panel DP may be reduced.

The first lower light blocking layer BML1 and the second lower light blocking layer BML2 may be disposed between the fourth sub-barrier layer 124 and the fifth sub-barrier layer 125 shown in FIGS. 7A, 7B, and 7C.

The first lower light blocking layer BML1 and the second lower light blocking layer BML2 may be electrically insulated from each other. A constant voltage having a certain voltage level may be provided to the first lower light blocking layer BML1, and a power voltage provided to the second pixel circuit PDC2a or PDC2b may be provided to the second lower light blocking layer BML2. For example, a first driving voltage ELVDD of FIG. 5 may be provided to the second lower light blocking layer BML2.

The first lower light blocking layer BML1 may overlap the entire area in which the first pixel unit PXU1 is disposed. Accordingly, the first lower light blocking layer BML1 may overlap the first pixels PX1r, PX1g, and PX1b of FIG. 6 included in the first pixel unit PXU1. In the first area A1, the first lower light blocking layer BML1 may overlap all of the first type transistors included in each of the first pixels PX1r, PX1g, and PX1b. Accordingly, the voltage provided to the first lower light blocking layer BML1 may be provided regardless of the operation of the first pixels PX1r, PX1g, and PX1b.

The second lower light blocking layer BML2 may overlap a portion of an area in which the first sub-pixel unit PXU2a is disposed. For example, the first sub-pixel unit PXU2a may include a second-second color pixel PX2g of FIG. 6 and a second-third color pixel PX2b of FIG. 6. In the second area A2, the second lower light blocking layer BML2 may overlap some of the second type transistors included in each of the second-second color pixel PX2g and the second-third color pixel PX2b. For example, the second lower light blocking layer BML2 may overlap the first transistor T1 of FIG. 5. Accordingly, the voltage provided to the second lower light blocking layer BML2 may be provided in synchronization with the operations of the second-second color pixel PX2g and the second-third color pixel PX2b.

Each of the first lower light blocking layer BML1 and the second lower light blocking layer BML2 may have a single-layer structure or a multi-layer structure including layers. For example, each of the first lower light blocking layer BML1 and the second lower light blocking layer BML2 may have a multilayer structure in which titanium and molybdenum are sequentially stacked. A passage may be provided by cracks formed in the first to fourth sub-barrier layers 121, 122, 123, and 124 of FIG. 7A and particles between the first to fourth sub-barrier layers 121, 122, 123, and 124 of FIG. 7A. For example, hydrogen may be permeated through the passage, and the lower layer including titanium may function to adsorb hydrogen. Accordingly, the probability of occurrence of a defect caused by hydrogen in the transistor may be reduced. In an embodiment, molybdenum may be substituted with copper. In another example, each of the first lower light blocking layer BML1 and the second lower light blocking layer BML2 may include molybdenum or copper, but embodiments are not limited thereto.

Figure 9A:
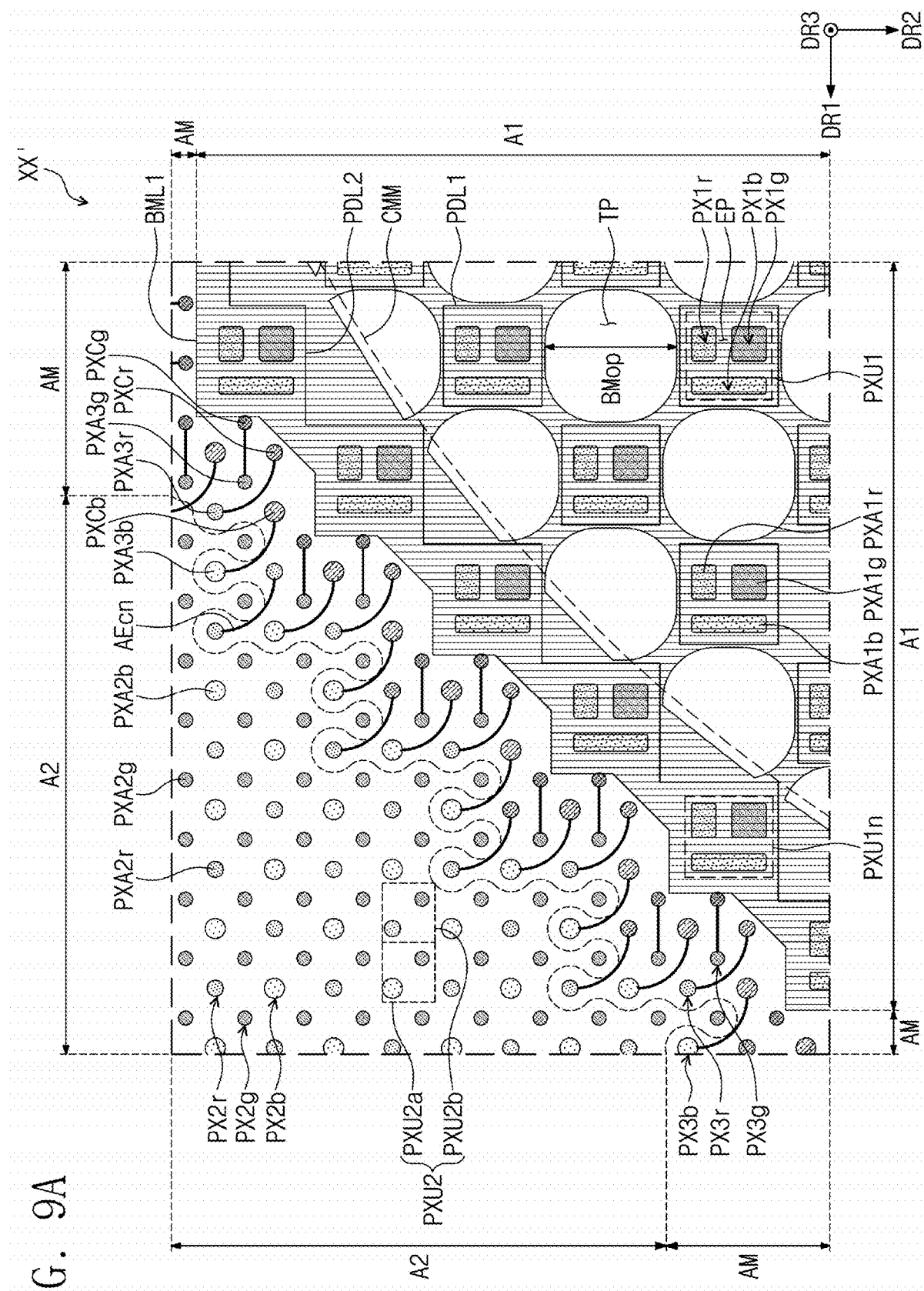
FIG. 9A is a schematic enlarged plan view of a partial area of a display panel according to an embodiment.
Figure 9B:
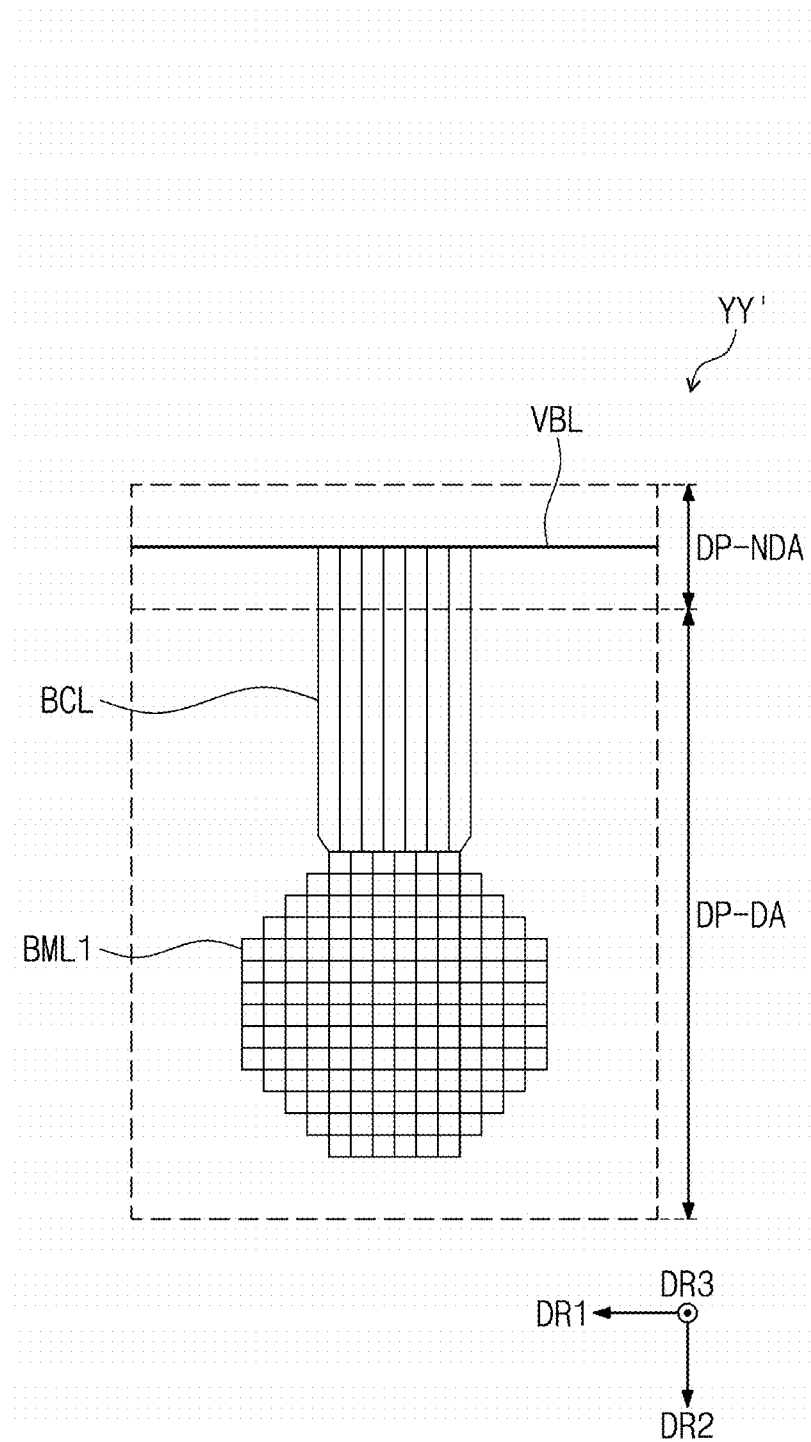
FIG. 9B is a schematic enlarged plan view of a partial area of a display panel according to an embodiment.

FIG. 9A is a schematic enlarged plan view of a partial area of a display panel according to an embodiment. FIG. 9B is a schematic enlarged plan view of a partial area of a display panel according to an embodiment. FIG. 9A is a schematic enlarged plan view illustrating an area XX' illustrated in FIG. 4. FIG. 9B is a schematic enlarged plan view of an area YY' shown in FIG. 4.

Referring to FIGS. 9A and 9B, the first lower light blocking layer BML1 may be disposed in the first area A1. The display panel DP of FIG. 4 may further include a first light blocking voltage line VBL and a second light blocking voltage line BCL. The first light blocking voltage line VBL and the second light blocking voltage line BCL may be electrically connected to the first lower light blocking layer BML1, so that a constant voltage having a certain voltage level may be transferred to the first lower light blocking layer BML1.

For example, the first light blocking voltage line VBL may be disposed in the non-display area DP-NDA and surround at least a portion of the display area DP-DA. Pads may be respectively connected to an end portion and another end portion of the first light blocking voltage line VBL, and a constant voltage may be provided through the pads.

The second light blocking voltage line BCL may extend from the first light blocking voltage line VBL and may be connected to the first lower light blocking layer BML1 through the display area DP-DA. Second light blocking voltage lines BCL may be provided. FIG. 9B shows that the number of second light blocking voltage lines BCL is 8, but the number of second light blocking voltage lines BCL may be less than 8 or more than 8.

In FIG. 9A, the camera module CMM overlapping the first area A1 is illustrated. A dotted line portion indicated as the camera module CMM may correspond to a light receiving portion or a lens of the camera module CMM that receives a light.

The camera module CMM may overlap a part of the first area A1. For example, the camera module CMM may overlap the transmissive areas TP and the element areas EP in which the first pixel unit PXU1 is disposed. The camera module CMM may not overlap the adjacent pixel unit PXU1n. For example, the camera module CMM may not overlap the middle area (AM) and the second area A2. Accordingly, the camera module CMM may not overlap the second pixels PX2r, PX2g, and PX2b and the third pixels PX3r, PX3g, and PX3b.

Figure 10A:
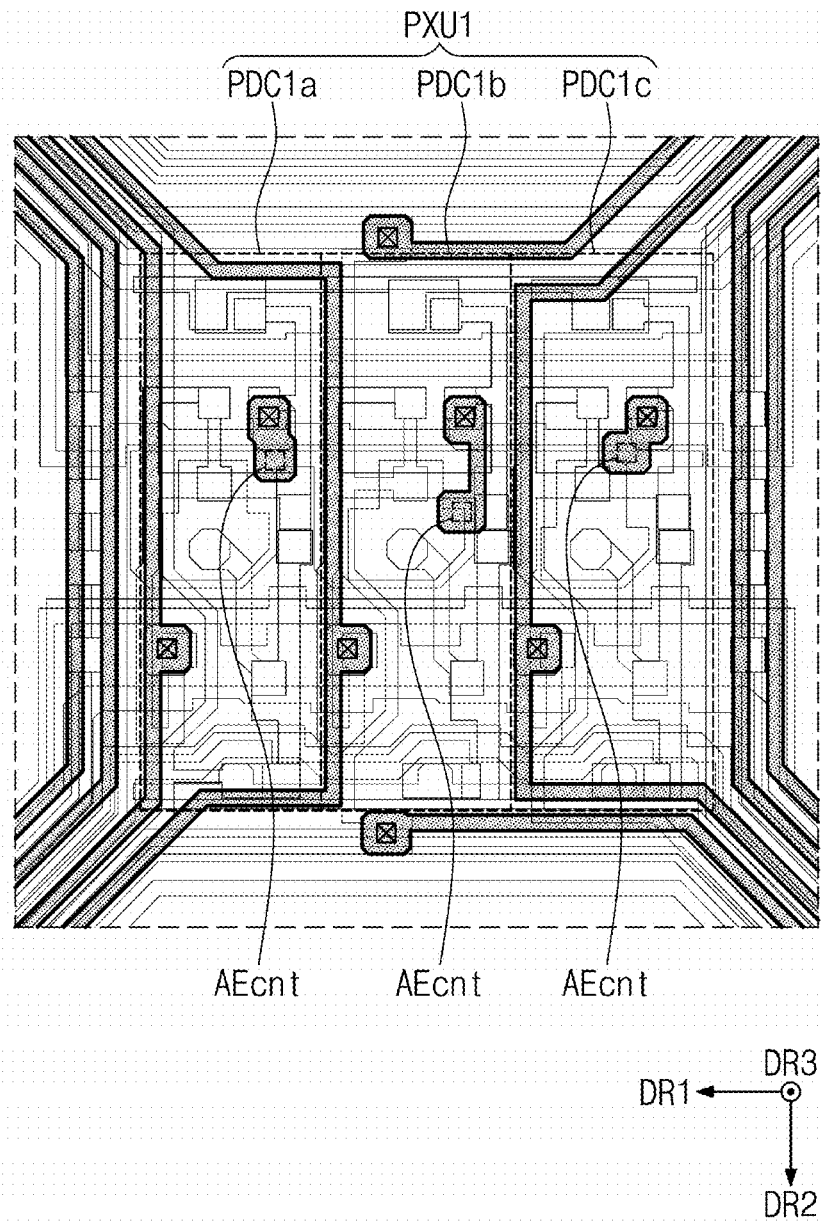
FIG. 10A is a schematic plan view illustrating pixel circuits disposed in a first area according to an embodiment.
Figure 10B:
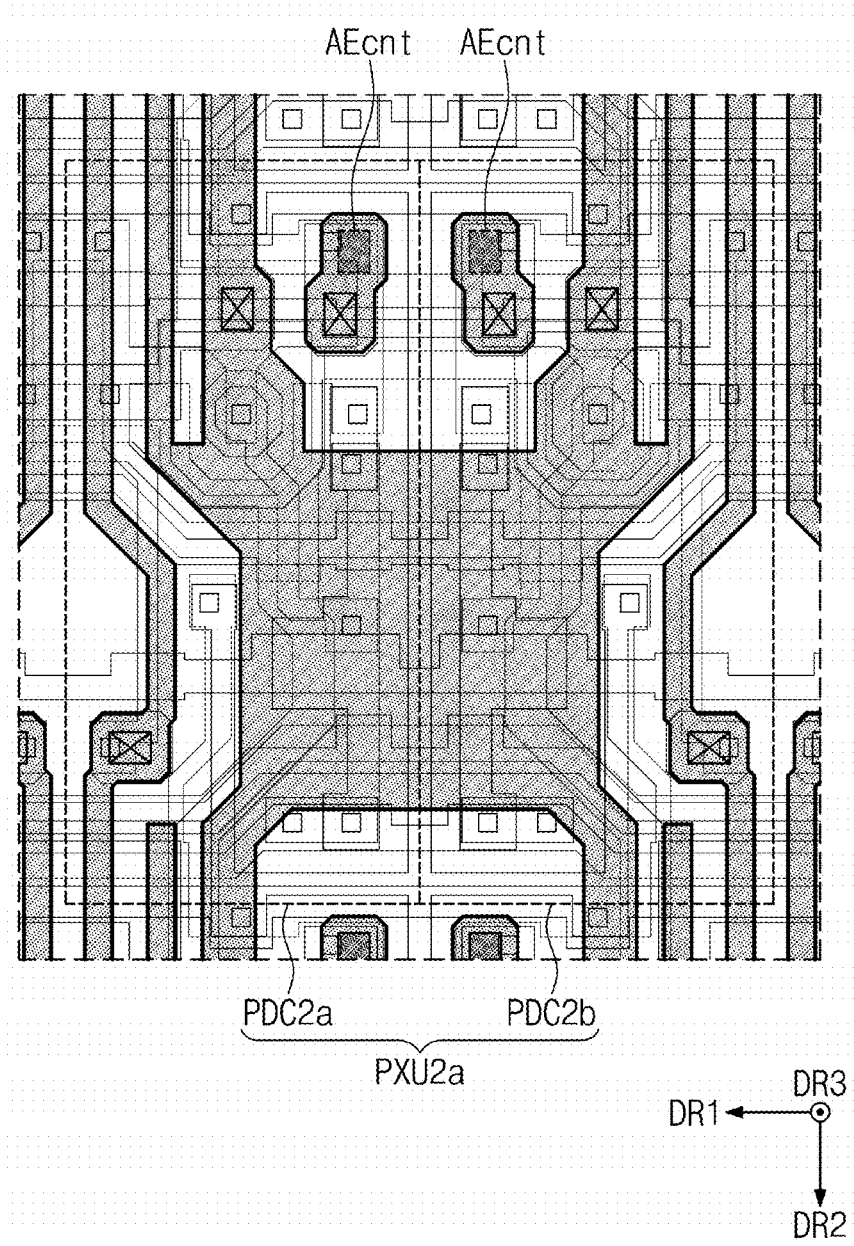
FIG. 10B is a schematic plan view illustrating pixel circuits disposed in a second area according to an embodiment.

FIG. 10A is a schematic plan view illustrating pixel circuits disposed in a first area according to an embodiment. FIG. 10B is a schematic plan view illustrating pixel circuits disposed in a second area according to an embodiment.

Referring to FIGS. 10A and 10B, each of the first pixel circuits PDC1a, PDC1b, and PDC1c and the second pixel circuits PDC2a and PDC2b may be implemented by conductive layers and semiconductor layers. In FIGS. 10A and 10B, pattern layers included in the conductive layer disposed between the sixth insulating layer 60 of FIG. 7B and the seventh insulating layer 70 of FIG. 7B are shaded. The pixel electrode contact portions AEcnt may be portions to which first to third pixel electrodes AE1, AE2, and AE3 of FIG. 11 to be described below contact, respectively.

A third pixel circuit PDC3 of FIG. 7C having substantially the same layout as the second pixel circuit PDC2a or PDC2b may be disposed under the third light emitting element ED3 of FIG. 7C. A structure such as the second pixel circuit PDC2a or PDC2b may not be disposed in the areas where the copy light emitting element EDcp is disposed due to space constraints. Accordingly, the copy light emitting element EDcp may share the third pixel circuit PDC3 of FIG. 7C and may be driven together with the third light emitting element ED3.

Figure 11:
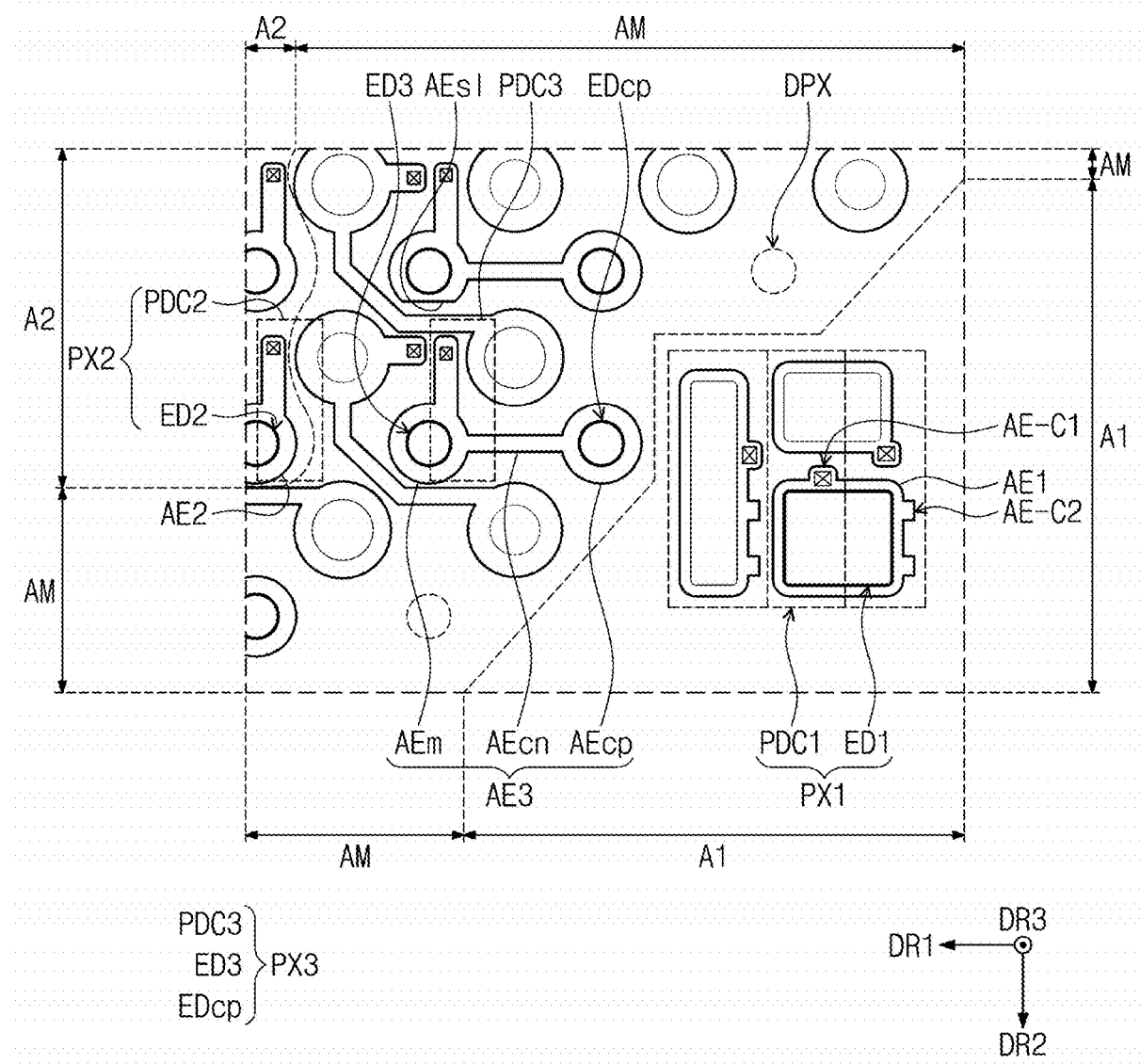
FIG. 11 is a schematic enlarged plan view of a partial area of a display panel according to an embodiment.

FIG. 11 is a schematic enlarged plan view of a partial area of a display panel according to an embodiment.

Referring to FIG. 11, the first pixel electrode AE1 may be disposed in the first area A1, the second pixel electrode AE2 may be disposed in the second area A2, and the third pixel electrode AE3 may be disposed in the middle area AM. The first pixel electrode AE1, the second pixel electrode AE2, and the third pixel electrode AE3 may include a metal, an alloy, a conductive metal oxide, or a transparent conductive material. The first pixel electrode AE1, the second pixel electrode AE2, and the third pixel electrode AE3 may have a multilayer structure in which indium tin oxide, silver, and indium tin oxide are sequentially stacked, but embodiments are not limited thereto.

The first pixel PX1 disposed in the first area A1 may include a first pixel circuit PDC1 and a first light emitting element ED1. The first pixel electrode AE1 may be included in the first light emitting element ED1. The first pixel electrode AE1 may be electrically connected to the first pixel circuit PDC1, and for example, the first pixel electrode AE1 may be connected to the pixel electrode contact portion AEcnt illustrated in FIG. 10A.

The second pixel PX2 disposed in the second area A2 may include a second pixel circuit PDC2 and a second light emitting element ED2. The second pixel electrode AE2 may be included in the second light emitting element ED2. The second pixel electrode AE2 may be electrically connected to the second pixel circuit PDC2, and for example, the second pixel electrode AE2 may be connected to the pixel electrode contact portion AEcnt shown in FIG. 10B.

The third pixel PX3 disposed in the middle area AM may include a third pixel circuit PDC3, a third light emitting element ED3, and a copy light emitting element EDcp. The third pixel electrode AE3 may be electrically connected to the third pixel circuit PDC3. The third pixel circuit PDC3 may have substantially the same layout as one of the second pixel circuits PDC2a and PDC2b illustrated in FIG. 10B. The copy light emitting element EDcp may be closer to the first light emitting element ED1 than the third light emitting element ED3. The third pixel circuit PDC3 may not be disposed under the copy light emitting element EDcp due to space constraints. Accordingly, the copy light emitting element EDcp may not overlap the first lower light blocking layer BML1 of FIG. 8A and the second lower light blocking layer BML2 of FIG. 8B.

The third pixel electrode AE3 may be included in the third light emitting element ED3 and the copy light emitting element EDcp. The third pixel electrode AE3 may include a main pixel electrode AEm, a connection electrode AEcn, and a copy pixel electrode AEcp. The main pixel electrode AEm may be included in the third light emitting element ED3, and the copy pixel electrode AEcp may be included in the copy light emitting element EDcp. The connection electrode AEcn may electrically connect the third light emitting element ED3 and the copy light emitting element EDcp.

The main pixel electrode AEm, the connection electrode AEcn, and the copy pixel electrode AEcp may be disposed on the same layer and may include the same material. For example, the main pixel electrode AEm, the connection electrode AEcn, and the copy pixel electrode AEcp may be simultaneously formed by the same process. The main pixel electrode AEm may be connected (e.g., directly connected) to the third pixel circuit PDC3, and the copy pixel electrode AEcp may be connected to the third pixel circuit PDC3 through the connection electrode AEcn and the main pixel electrode AEm.

Some of the main pixel electrodes AEm may include a straight edge portion AEsl to ensure an area through which the connection electrode AEcn passes. The straight edge portion AEsl may be provided at a portion facing the connection electrode AEcn.

The first pixel electrode AE1 may include a first protrusion AE-C1 and a second protrusion AE-C2. The first protrusion AE-C1 may be a portion connected to the pixel electrode contact portion AEcnt illustrated in FIG. 10A and may overlap the contact hole. The second protrusion AE-C2 may be a portion that extends to overlap the second semiconductor pattern layer including the active area AC2 of FIG. 7A of the oxide thin film transistor O-TFT of FIG. 7A. Accordingly, the lower surface of the second semiconductor pattern layer may be blocked from light by the first lower light blocking layer BML1 of FIG. 8A, and the upper surface of the second semiconductor pattern layer may be blocked from light by the first pixel electrode AE1.

Referring to FIG. 11, a dummy pixel DPX may be disposed in the middle area AM. The dummy pixel DPX may be a pixel that does not emit light and may be referred to as a defective pixel or a missing pixel. For example, the dummy pixel DPX may include a light emitting layer EL of FIG. 7B without including the pixel circuit PDC of FIG. 5 and the pixel electrode AE of FIG. 7B. In an embodiment, the dummy pixel DPX may further include a first functional layer HFL of FIG. 7B, a second functional layer EFL of FIG. 7B, and a common electrode CE of FIG. 7B. The dummy pixel DPX may overlap a dummy bank opening defined in the bank layer 310 of FIG. 7B. However, this is only an example, and the dummy bank opening may not be defined in the region where the dummy pixel DPX is disposed. In another example, a dummy pixel defining opening may be defined in the pixel defining layer PDL2 of FIG. 6 corresponding to the region in which the dummy pixel DPX is disposed.

FIG. 12 is a schematic enlarged plan view of a partial area of a display panel according to an embodiment. FIG. 12 is a schematic enlarged plan view illustrating an area XX' illustrated in FIG. 4.

Referring to FIGS. 7A, 7B, 7C, and 12, bank openings 310op1 and 310op2 and a transmission opening 310opt may be defined in the bank layer 310. The bank openings 310op1 and 310op2 may include a first bank opening 310op1 defined in the first area A1 and a second bank opening 310op2 defined in the second area A2 and the middle area AM. The transmission opening 310opt may be defined in the first area A1.

A first bank opening 310op1 in the first area A1 may overlap a first pixel unit PXU1. Accordingly, the first bank opening 310op1 may overlap the first emission areas PXA1r, PXA1g, and PXA1b.

The bank layer 310 may not dispose between the first emission areas PXA1r, PXA1g, and PXA1b adjacent to each other in the first area A1. Accordingly, it is not necessary to form a portion of the relatively thin and long bank layer 310 in a narrow area between the first emission areas PXA1r, PXA1g, and PXA1b. Accordingly, the difficulty of the process of forming the bank layer 310 may be reduced. For example, since a portion of the bank layer 310 is not disposed between the first emission areas PXA1r, PXA1g, and PXA1b, although the viewing angle is increased, a degree of change in a luminance ratio or a white angular dependency (WAD) characteristic may be reduced. For example, the luminance ratio or WAD characteristic in the first area A1 may be improved.

In the second area A2 and the middle area AM, one second bank opening 310op2 may overlap one emission area of the second emission areas PXA2r, PXA2g, and PXA2b, the third emission areas PXA3r, PXA3g, and PXA3b, and the copy emission areas PXCr, PXCg, and PXCb. In the second area A2 and the middle area AM, there is a portion of the bank layer 310 between the second emission areas PXA2r, PXA2g, and PXA2b, the third emission areas PXA3r, PXA3g, and PXA3b, and the copy emission areas PXCr, PXCg, and PXCb adjacent to each other.

The transmission opening 310opt may overlap the first opening BMop of the first lower light blocking layer BML1. The size of the transmission opening 310opt may be substantially the same as the size of the first opening BMop of the first lower light blocking layer BML1.

An additional bank opening 310aop may be further defined in the bank layer 310. The additional bank opening 310aop may be defined in the area between the transmission openings 310opt. For example, an additional bank opening 310aop may be provided in the area overlapping the copy light emitting elements CED1, CED2, CED3, or CED4 of FIG. 14.

FIG. 13A is a schematic enlarged plan view of a partial area of a display panel according to an embodiment. FIG. 13A is a schematic enlarged plan view of area AA' shown in FIG. 12.

Referring to FIGS. 7A and 13A, the color filters 320 may include a first color filter 321r, a second color filter 321g, and a third color filter 321b disposed in the first area A1. The first, second, and third color filters 321r, 321g, and 321b may overlap the first bank opening 310op1 of the bank layer 310.

A first opening PDLoplr, a second opening PDLoplg, and a third opening PDLoplb may be defined in the pixel defining pattern layer PDL1. The first opening PDLoplr, the second opening PDLoplg, and the third opening PDLoplb may overlap the first bank opening 310op 1 of the bank layer 310. The first color filter 321r may overlap the first opening PDLoplr, the second color filter 321g may overlap the second opening PDLoplg, and the third color filter 321b may overlap the third opening PDLoplb.

Among the first, second, and third color filters 321r, 321g, and 321b, the second color filter 321g may have the largest area and the first color filter 321r may have the smallest area. Accordingly, the second color filter 321g may protrude further in a direction away from the third color filter 321b than the first color filter 321r.

The conductive pattern layer 240P may be covered by the bank layer 310. Accordingly, the entire conductive pattern layer 240P may overlap the bank layer 310. The bank layer 310 may prevent reflection of external light by the conductive pattern layer 240P.

Figure 13B:
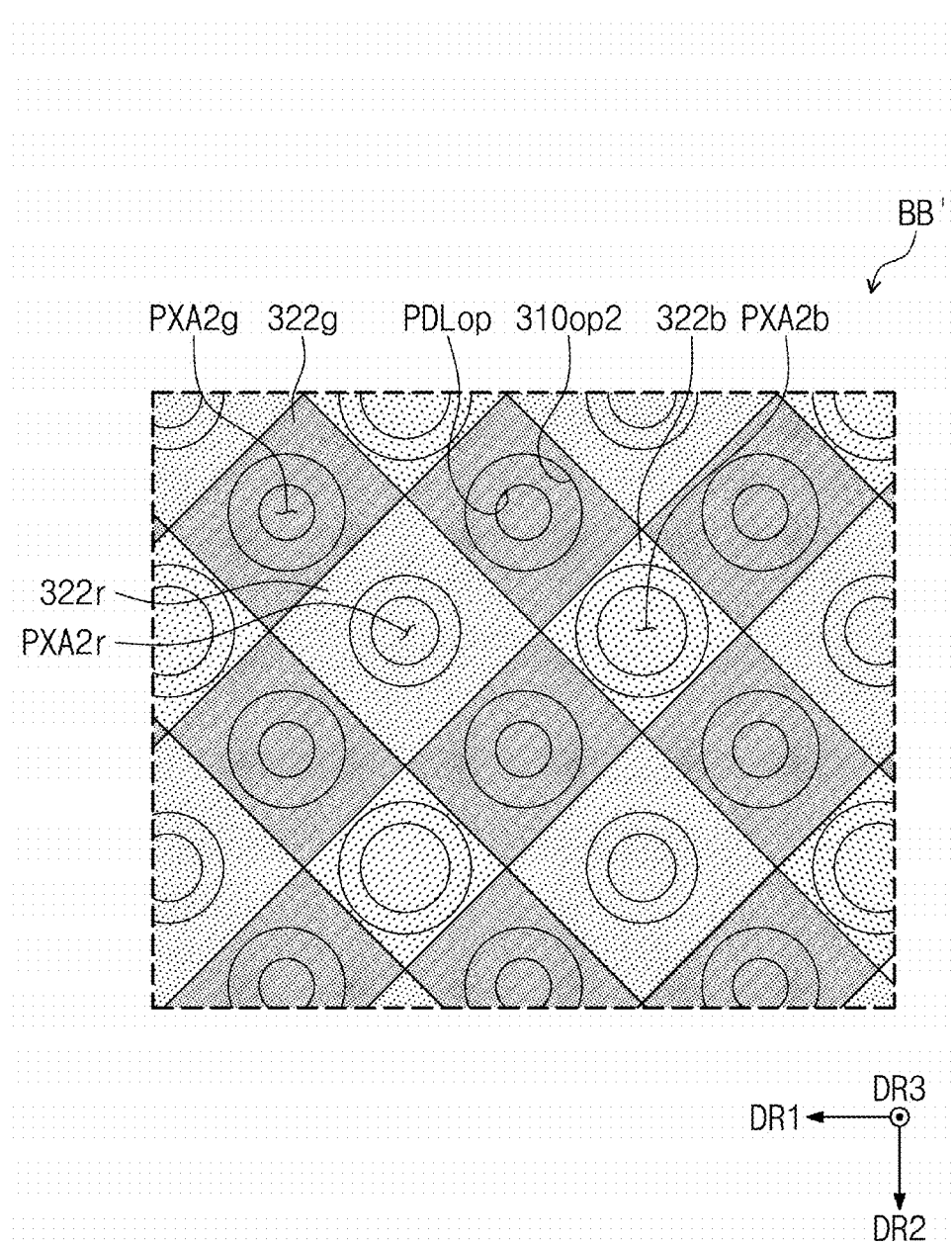
FIG. 13B is a schematic enlarged plan view of a partial area of a display panel according to an embodiment.

FIG. 13B is a schematic enlarged plan view of a partial area of a display panel according to an embodiment. FIG. 13B is a schematic enlarged plan view of an area BB' illustrated in FIG. 12.

Referring to FIGS. 7B and 13B, the color filters 320 may include a first color filter 322r, a second color filter 322g, and a third color filter 322b disposed in the second area A2. The first, second, and third color filters 322r, 322g, and 322b may overlap the second bank openings 310op2 of the bank layer 310, e.g., in a one-to-one correspondence.

A shape of each of the second bank openings 310op2 may be different from a shape of each of the first, second, and third color filters 322r, 322g, and 322b. For example, the shape of the opening PDLop of the pixel defining layer PDL2 may be different from the shape of each of the first, second, and third color filters 322r, 322g, and 322b. For example, the shape of the opening PDLop in a plan view may be circular, and the shape of each of the second bank openings 310op2 in a plan view may be circular. A second bank opening 310op2 may have a shape surrounding the opening PDLop in a plan view. Each of the first, second, and third color filters 322r, 322g, and 322b may have a rectangular shape in a plan view.

The second emission areas PXA2r, PXA2g, and PXA2b may include a second-first emission area PXA2r, a second-second emission area PXA2g, and a second-third emission area PXA2b. Among the second emission areas PXA2r, PXA2g, and PXA2b, the second-second emission area PXA2g may have the smallest area and the second-third emission area PXA2b may have the largest area. Among the first, second, and third color filters 322r, 322g, and 322b, the first color filter 322r may have the largest area and the third color filter 322b may have the smallest area.

One second-first emission area PXA2r, two second-second emission areas PXA2g, and one second-third emission area PXA2b may form one repeating unit. For example, within one repeating unit, the area occupied by the two second color filters 322g may be the largest, the area occupied by the one first color filter 322r may be the next largest, and the area occupied by the one third color filter 322b may be the smallest. For example, an area ratio of the first color filter 322r, the second color filters 322g, and the third color filter 322b in the repeating unit may be 29:54:17.

The area of each of the first, second, and third color filters 322r, 322g, and 322b may be determined according to the reflection color of the electronic device EDE of FIG. 1A. Accordingly, the area of the emission area may not be proportional to the area of the color filter corresponding thereto.

Figure 13C:
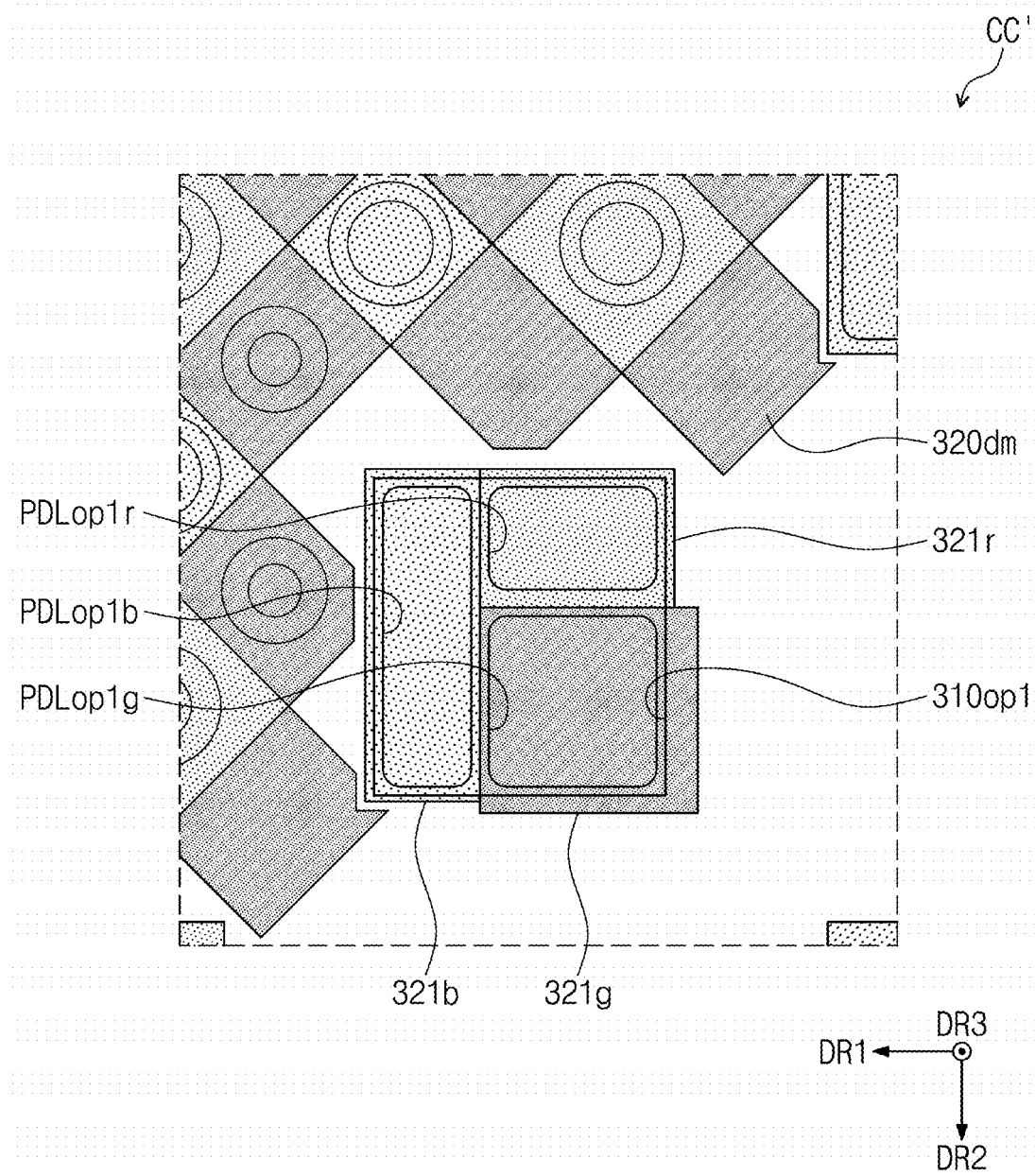
FIG. 13C is a schematic enlarged plan view of a partial area of a display panel according to an embodiment.

FIG. 13C is a schematic enlarged plan view of a partial area of a display panel according to an embodiment. FIG. 13C is a schematic enlarged plan view of an area CC' shown in FIG. 12.

Referring to FIGS. 12 and 13C, the color filters 320 of FIG. 7A may further include dummy color filters 320dm disposed at a boundary between the first area A1 and the middle area AM or adjacent to the boundary. The dummy color filters 320dm and the second color filter 321g may have the same color as each other. The dummy color filters 320dm may be provided to optimize the reflection color of the electronic device EDE of FIG. 1A, and the dummy color filters 320dm may be omitted.

Figure 14:
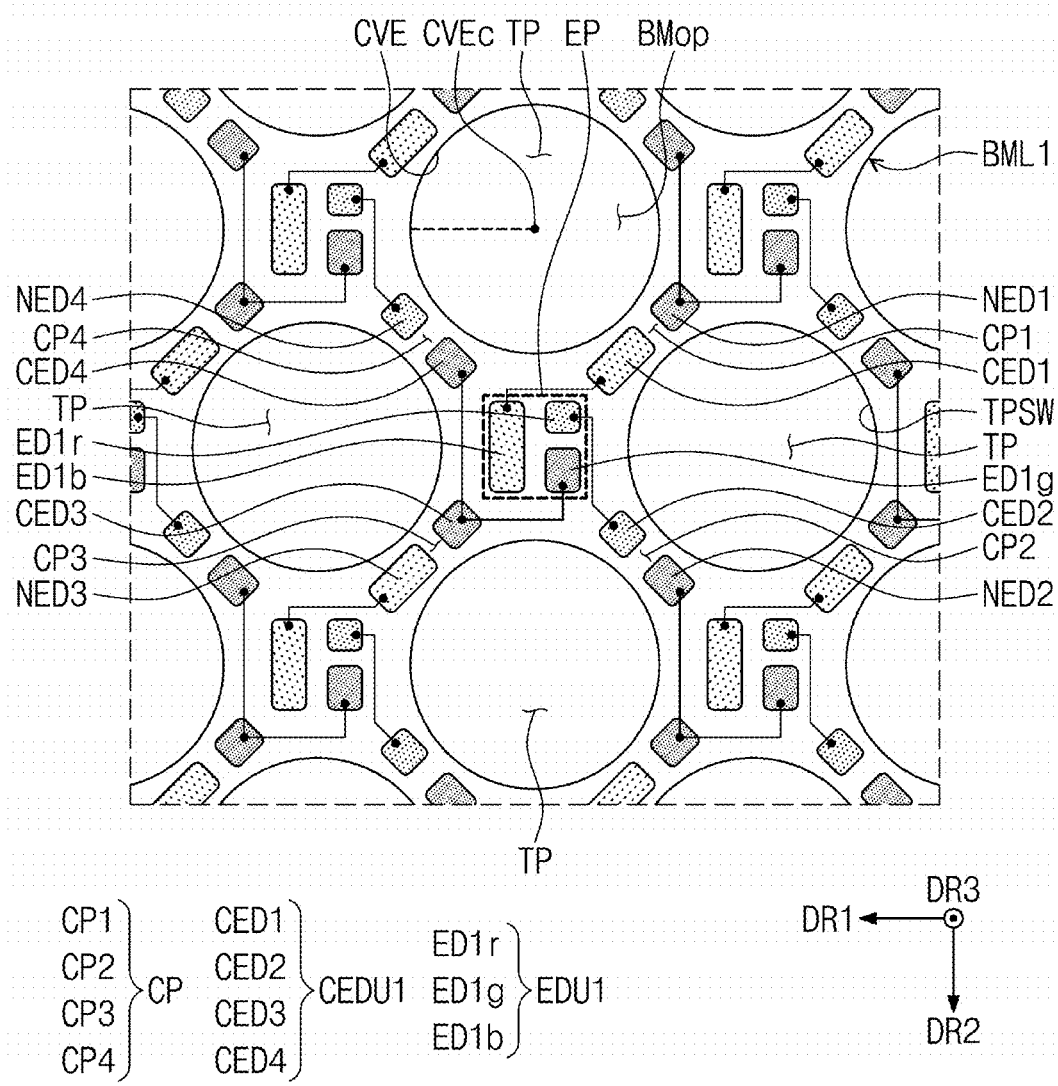
FIG. 14 is a schematic enlarged plan view of a partial area of a display panel according to an embodiment.

FIG. 14 is a schematic enlarged plan view of a partial area of a display panel according to an embodiment.

Referring to FIGS. 12 and 14, the first light emitting unit EDU1 disposed in the element area EP may include first light emitting elements ED1r, ED1g, and ED1b. The first light emitting elements ED1r, ED1g, and ED1b may include a first-first light emitting element ED1r, a first-second light emitting element ED1g, and a first-third light emitting element ED1b. Below, the first-first light emitting element ED1r, the first-second light emitting element ED1g, and the first-third light emitting element ED1b may be referred to as a first light emitting element ED1r, a second light emitting element ED1g, and a third light emitting element ED1b, respectively.

The first light emitting element ED1r, the second light emitting element ED1g, and the third light emitting element ED1b may emit different colors of light. For example, the first light emitting element ED1r may emit red light, the second light emitting element ED1g may emit green light, and the third light emitting element ED1b may emit blue light.

The first area A1 of the display panel DP of FIG. 4 may further include connection areas CP extending from the element area EP. Each of the connection areas CP may be arranged between two transmissive areas TP. The element area EP and the connection areas CP may overlap the first lower light blocking layer BML1. The transmissive areas TP may not overlap both the first lower light blocking layer BML1 and the bank layer 310.

The display panel DP may further include a first copy light emitting unit CEDU1 disposed in the connection areas CP. The first copy light emitting unit CEDU1 may include copy light emitting elements CED1, CED2, CED3, and CED4. Operations of the copy light emitting elements CED1, CED2, CED3, and CED4 may be controlled by the first pixel circuits PDC1a, PDC1b, and PDC1c of FIG. 10A for controlling the operation of the first light emitting unit EDU1. Accordingly, the first copy light emitting unit CEDU1 may operate in synchronization with the first light emitting unit EDU1.

For example, the first to third light emitting elements ED1r, ED1g, and ED1b may overlap the first pixel circuits PDC1a, PDC1b, and PDC1c, respectively, and operations of the first to third light emitting elements ED1r, ED1g, and ED1b may be controlled by the first pixel circuits PDC1a, PDC1b, and PDC1c of FIG. 10A, respectively. For example, the first light emitting element ED1r may be electrically connected to the first pixel circuit PDC1c, the second light emitting element ED1g may be electrically connected to the first pixel circuit PDC1b, and the third light emitting element ED1b may be electrically connected to the first pixel circuit PDC1a.

Each of the copy light emitting elements CED1, CED2, CED3, and CED4 may be electrically connected to any one of the first pixel circuits PDC1a, PDC1b, and PDC1c and may emit light simultaneously with any one of the first to third light emitting elements ED1r, ED1g, and ED1b.

The connection areas CP may include a first connection area CP1 adjacent to the first light emitting element ED1r, a second connection area CP2 adjacent to the second light emitting element ED1g, and third and fourth connection areas CP3 and CP4 adjacent to the third light emitting element ED1b. The first connection area CP1, the second connection area CP2, the third connection area CP3, and the fourth connection area CP4 may be sequentially defined in a clockwise direction based on the element area EP.

Copy light emitting elements CED1, CED2, CED3, and CED4 may include a first copy light emitting element CED1 disposed in the first connection area CP1, a second copy light emitting element CED2 disposed in a second connection area CP2, a third copy light emitting element CED3 disposed in the third connection area CP3, and a fourth copy light emitting element CED4 disposed in the fourth connection area CP4.

An emission color of the first copy light emitting element CED1 may be different from an emission color of the first light emitting element ED1r. An emission color of the second copy light emitting element CED2 may be different from an emission color of the second light emitting element ED1g. Emission colors of the third copy light emitting element CED3 and the fourth copy light emitting element CED4 may be different from emission color of the third light emitting element ED1b.

The first copy light emitting element CED1 may be electrically connected to the third light emitting element ED1b, and the first copy light emitting element CED1 may simultaneously emit light with the third light emitting element ED1b. The second copy light emitting element CED2 may be electrically connected to the first light emitting element ED1r, and the second copy light emitting element CED2 may emit light simultaneously with the first light emitting element ED1r. The third copy light emitting element CED3 and the fourth copy light emitting element CED4 may be electrically connected to the second light emitting element ED1g, and the third copy light emitting element CED3 and the fourth copy light emitting element CED4 may emit light simultaneously with the second light emitting element ED1g.

According to an embodiment, each of the first to third light emitting elements ED1r, ED1g, and ED1b may be adjacent to at least one copy light emitting element CED1, CED2, CED3, or CED4. One light emitting element ED1r, ED1g, or ED1b and one copy light emitting element CED1, CED2, CED3, or CED4 adjacent to each other may emit different colors of light. For example, one light emitting element ED1r may be spaced apart with a copy light emitting element CED2 emitting light of the same color with another light emitting element ED1g emitting light of a different color therebetween.

As one light emitting element ED1r, ED1g, or ED1b and a copy light emitting element CED1, CED2, CED3, or CED4 emitting light of the same color as the one light emitting element ED1r, ED1g, or ED1b are spaced apart and not adjacent to each other, a roughness index may be improved.

The display panel DP may further include adjacent copy light emitting elements NED1, NED2, NED3, and NED4 disposed adjacent to the first copy light emitting unit CEDU1. In each of the first to fourth connection areas CP1, CP2, CP3, and CP4, one copy light emitting element CED1, CED2, CED3, or CED4 among the copy light emitting elements CED1, CED2, CED3, and CED4 and one adjacent copy light emitting element NED1, NED2, NED3, or NED4 among the adjacent copy light emitting elements NED1, NED2, NED3, and NED4 may be disposed.

For example, a first copy light emitting element CED1 and a first adjacent copy light emitting element NED1 may be disposed in the first connection area CP1. An emission color of the first copy light emitting element CED1 may be different from an emission color of the first adjacent copy light emitting element NED1. A second copy light emitting element CED2 and a second adjacent copy light emitting element NED2 may be disposed in the second connection area CP2. The emission color of the second copy light emitting element CED2 and the emission color of the second adjacent copy light emitting element NED2 may be different from each other. A third copy light emitting element CED3 and a third adjacent copy light emitting element NED3 may be disposed in the third connection area CP3. The emission color of the third copy light emitting element CED3 and the emission color of the third adjacent copy light emitting element NED3 may be different from each other. A fourth copy light emitting element CED4 and a fourth adjacent copy light emitting element NED4 may be disposed in the fourth connection area CP4. The emission color of the fourth copy light emitting element CED4 and the emission color of the fourth adjacent copy light emitting element NED4 may be different from each other.

A first opening BMop overlapping the transmissive area TP may be defined in the first lower light blocking layer BML1. The first opening BMop may be referred to as an opening or a transmission opening.

The sidewall TPSW of the first lower light blocking layer BML1 defining the first opening BMop may have a rounded shape. When viewed in a plan view, the first opening BMop may have a circular shape. When viewed in a plan view, the first opening BMop may include the curved edge portion CVE, and the center point of curvature CVEc (or the center of curvature) of the curved edge portion CVE may overlap the corresponding first opening BMop. In case that the first opening BMop is formed only with the curved edge portion CVE, a diffraction phenomenon caused by the first lower light blocking layer BML1 may be minimized. Thus, the quality of an image acquired by the camera module CMM may be improved. Accordingly, the effect of improving the performance of the camera module CMM may be derived.

Figure 15:
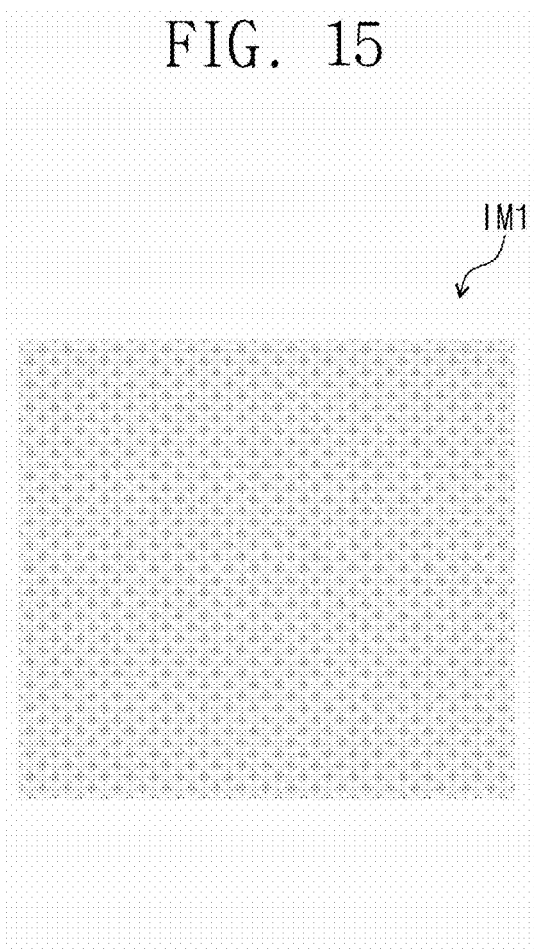
FIG. 15 is a converted image obtained from a display panel displaying a monochrome image according to an embodiment.
Figure 16:
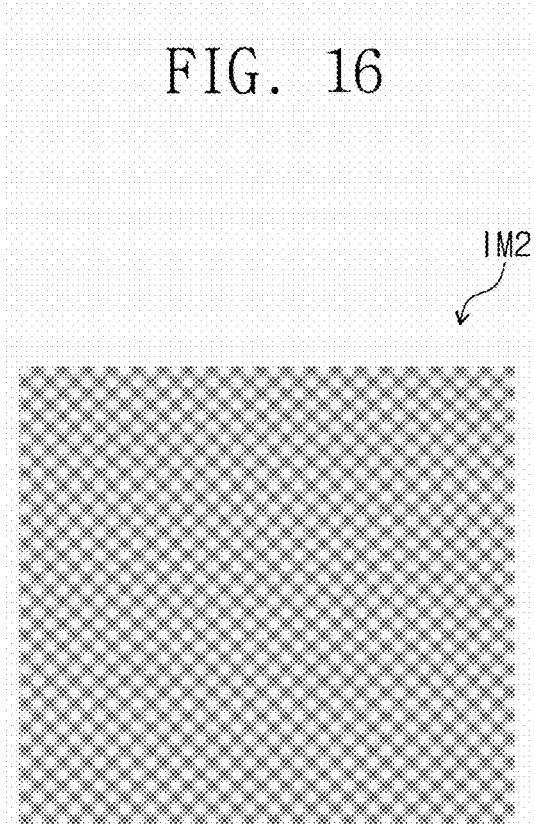
FIG. 16 is a converted image obtained from a display panel according to a comparative example that displays a monochromatic image.

FIG. 15 is a converted image obtained from a display panel displaying a monochromatic image according to an embodiment. FIG. 16 is a converted image obtained from a display panel according to a comparative example that displays a monochromatic image.

FIG. 15 is a first converted image IM1 obtained from the first area A1 of FIG. 4 of the display panel DP of FIG. 4 having the structure shown in FIG. 14, and FIG. 16 is a second converted image IM2 obtained from a first area of the display panel that does not include the first copy light emitting unit CEDU1 of FIG. 14.

The roughness index of the first converted image IM1 may be about 12.7, and the roughness index of the second converted image IM2 may be about 18.4. Here, the roughness index may indicate a difference in perceived luminance in a monochromatic image. For example, as a pattern according to a luminance difference in the illustrated image, for example, a grid pattern, may be clearly recognized, the perceived luminance difference may be large, so that the roughness index may be increased. Therefore, in a situation where a monochrome image is displayed, a specific pattern may not be visually recognized, and it may be understood that as the roughness index is lower, the display quality may be better.

For example, the roughness index may be a square root of a value obtained by dividing the difference between the maximum luminance value and the minimum luminance value of the perceived luminance by two. Accordingly, as the luminance difference increases, the roughness index may increase. A converted image for obtaining perceived luminance may be obtained in various ways. For example, after Fourier transforming the simulated image and applying a contrast sensitivity function (CSF) to the Fourier transformed image, the converted image may be obtained by inverse Fourier transform.

According to an embodiment, as the display panel DP of FIG. 4 may include the first copy light emitting unit CEDU1 of FIG. 14, the roughness index may be lowered. Accordingly, in case that a monochromatic image is displayed, a degree of recognizing a grid pattern in the first area A1 may be reduced. Thus, the display quality of the display panel DP may be improved.

Figure 17:
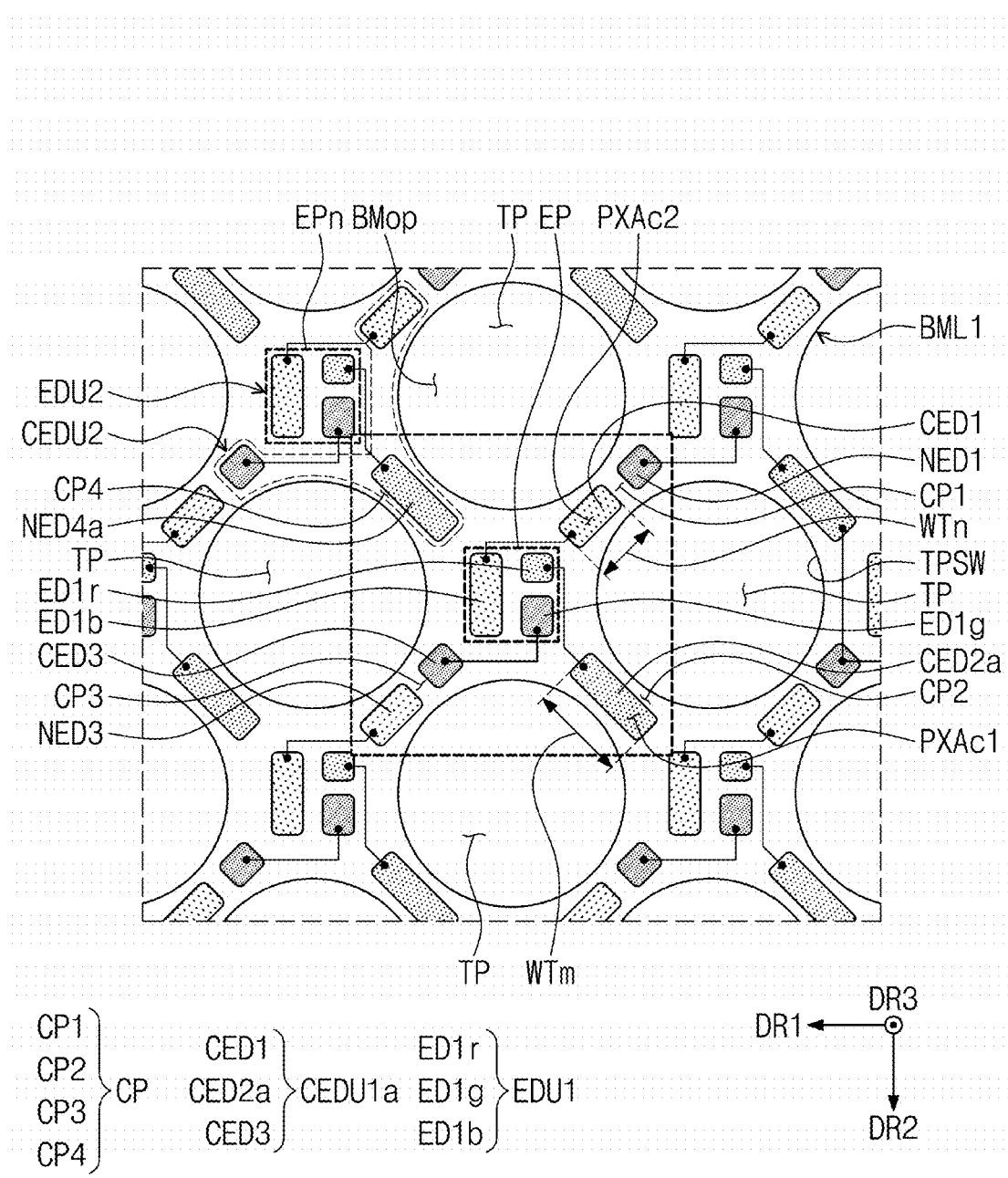
FIG. 17 is a schematic enlarged plan view of a partial area of a display panel according to an embodiment.

FIG. 17 is a schematic enlarged plan view of a partial area of a display panel according to an embodiment.

Referring to FIGS. 12 and 17, the display panel DP of FIG. 4 may further include a first copy light emitting unit CEDU1a disposed in the connection areas CP. The first copy light emitting unit CEDU1a may include copy light emitting elements CED1, CED2a, and CED3. Operations of the copy light emitting elements CED1, CED2a, and CED3 may be controlled by the first pixel circuits PDC1a, PDC1b, and PDC1c of FIG. 10A for controlling the operation of the first light emitting unit EDU1. Accordingly, the first copy light emitting unit CEDU1a may operate in synchronization with the first light emitting unit EDU1.

Copy light emitting elements CED1, CED2a, and CED3 may include a first copy light emitting element CED1 disposed in the first connection area CP1, a second copy light emitting element CED2a disposed in the second connection area CP2, and a third copy light emitting element CED3 disposed in the third connection area CP3.

The display panel DP of FIG. 4 may further include a second light emitting unit EDU2 disposed in another element area EPn within a first area A1 and a second copy light emitting unit CEDU2 that operates in synchronization with the second light emitting unit EDU2. The second copy light emitting unit CEDU2 may include an adjacent copy light emitting element NED4a disposed in the fourth connection area CP4. The emission color of the adjacent copy light emitting element NED4a and the emission color of the first light emitting element ED1r may be the same as each other.

One copy light emitting element CED1 or CED3 and one adjacent copy light emitting element NED1 or NED3 may be arranged in two connection areas among the first to fourth connection areas CP1, CP2, CP3, and CP4, for example, the first connection area CP1 and the third connection area CP3, respectively. A second copy light emitting element CED2a may be disposed in another one among the first to fourth connection areas CP1, CP2, CP3, and CP4, for example, the second connection area CP2, and one adjacent copy light emitting element NED4a may be disposed in the other one among the first to fourth connection areas CP1, CP2, CP3, and CP4, for example, the fourth connection area CP4. The emission color of the second copy light emitting element CED2a and the emission color of the adjacent copy light emitting element NED4a may be the same as each other.

The maximum width WTm of the emission area PXAc1 defined in the second copy light emitting element CED2a disposed in the second connection area CP2 may be greater than the maximum width WTn of the emission area PXAc2 defined in the copy light emitting element CED1 or CED3 disposed in the first connection area CP1 or the third connection area CP3.

Figure 18:
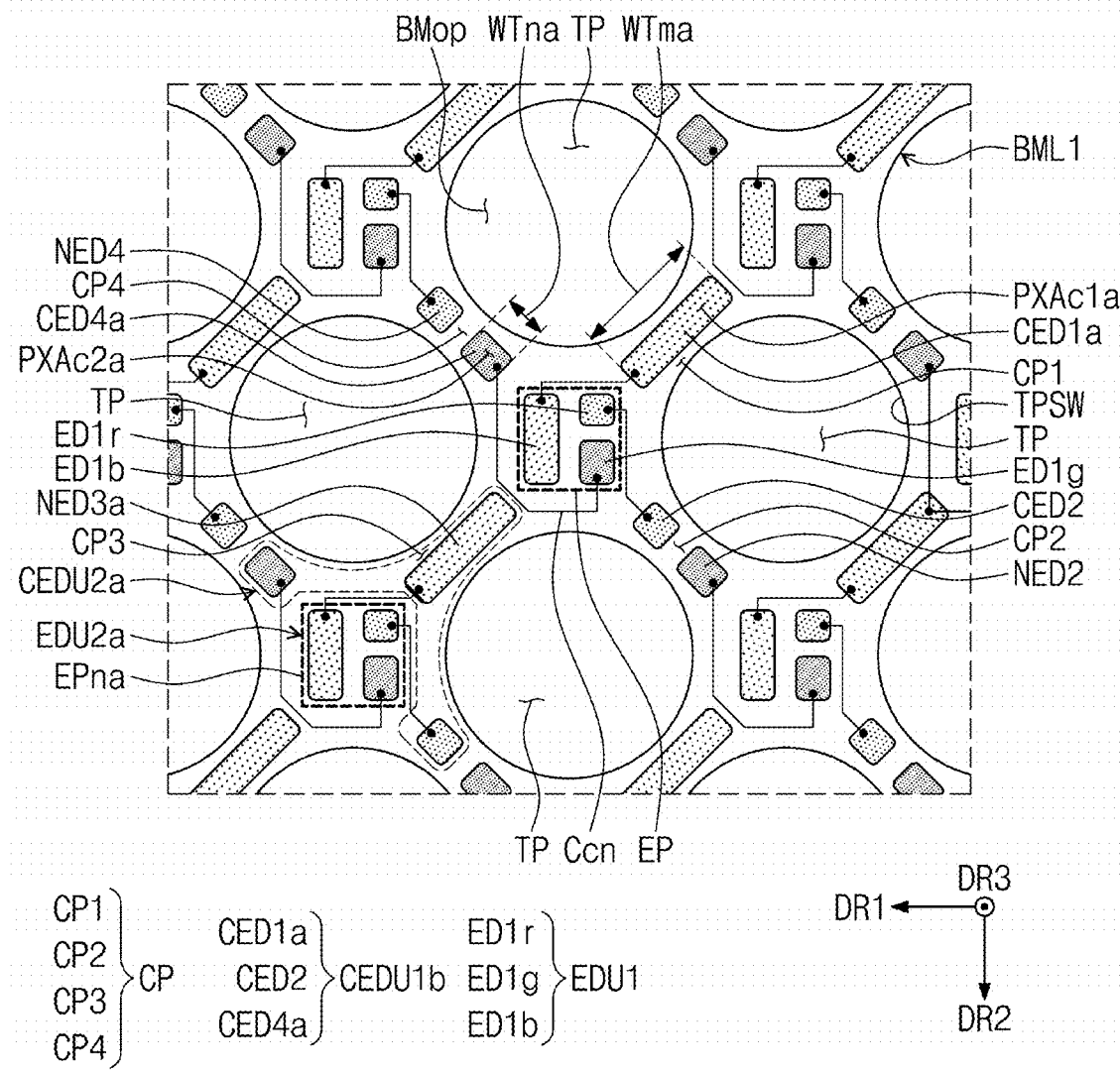
FIG. 18 is a schematic enlarged plan view of a partial area of a display panel according to an embodiment.

FIG. 18 is a schematic enlarged plan view of a partial area of a display panel according to an embodiment.

Referring to FIGS. 12 and 18, the display panel DP of FIG. 4 may further include a first copy light emitting unit CEDU1b disposed in the connection areas CP. The first copy light emitting unit CEDU1b may include copy light emitting elements CED1a, CED2, and CED4a. Operations of the copy light emitting elements CED1a, CED2, and CED4a may be controlled by the first pixel circuits PDC1a, PDC1b, and PDC1c of FIG. 10A for controlling the operation of the first light emitting unit EDU1. Accordingly, the first copy light emitting unit CEDU1b may operate in synchronization with the first light emitting unit EDU1.

Copy light emitting elements CED1a, CED2, and CED4a may include a first copy light emitting element CED1a disposed in the first connection area CP1, a second copy light emitting element CED2 disposed in the second connection area CP2, and a third copy light emitting element CED4a disposed in the fourth connection area CP4.

The display panel DP of FIG. 4 may further include a second light emitting unit EDU2a disposed in another element area EPna within a first area A1 and a second copy light emitting unit CEDU2a that operates in synchronization with the second light emitting unit EDU2a. The second copy light emitting unit CEDU2a may include an adjacent copy light emitting element NED3a disposed in the third connection area CP3. The emission color of the adjacent copy light emitting element NED3a and the emission color of the third light emitting element ED1b may be the same as each other. A connection line Ccn connecting the second light emitting element ED1g and the third copy light emitting element CED4a may be disposed between the adjacent copy light emitting element NED3a and the third light emitting element ED1b.

One copy light emitting element CED2 or CED4a and one adjacent copy light emitting element NED2 or NED4 may be arranged in two connection areas among the first to fourth connection areas CP1, CP2, CP3, and CP4, for example, the second connection area CP2 and the fourth connection area CP4, respectively. A first copy light emitting element CED1a may be disposed in another one among the first to fourth connection areas CP1, CP2, CP3, and CP4, for example, the first connection area CP1, and one adjacent copy light emitting element NED3a may be disposed in the other one among the first to fourth connection areas CP1, CP2, CP3, and CP4, for example, the third connection area CP3. The emission color of the first copy light emitting element CED1a and the emission color of the adjacent copy light emitting element NED3a may be the same as each other.

The maximum width WTma of the emission area PXAc1a defined in the first copy light emitting element CED1a disposed in the first connection area CP1 may be greater than the maximum width WTna of the emission area PXAc2a defined in the copy light emitting element CED2 or CED4a disposed in the second connection area CP2 or the fourth connection area CP4.

Figure 19:
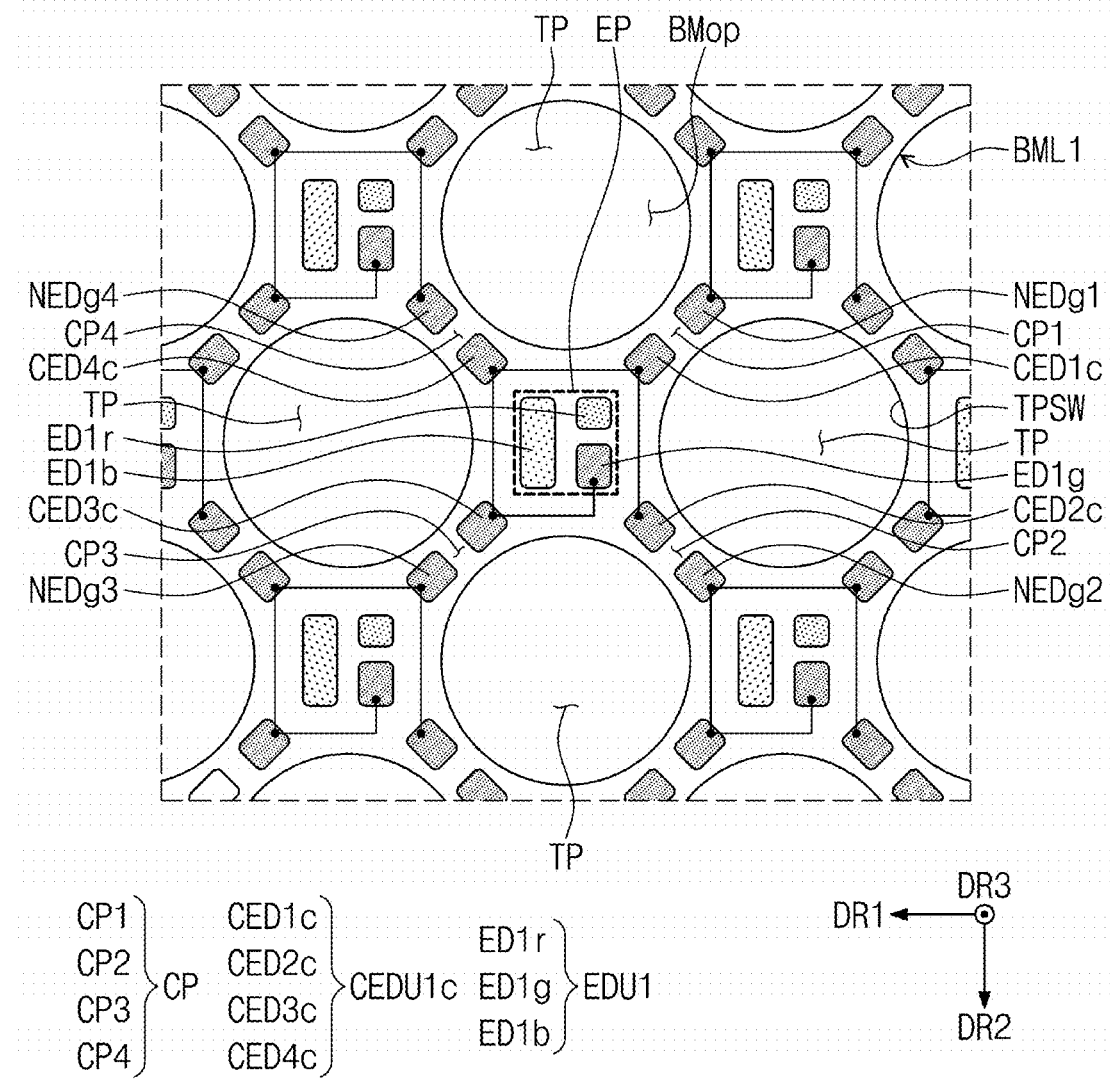
FIG. 19 is a schematic enlarged plan view of a partial area of a display panel according to an embodiment.

FIG. 19 is a schematic enlarged plan view of a partial area of a display panel according to an embodiment.

Referring to FIGS. 12 and 19, the display panel DP of FIG. 4 may further include a first copy light emitting unit CEDU1c disposed in the connection areas CP. The first copy light emitting unit CEDU1c may include copy light emitting elements CED1c, CED2c, CED3c, and CED4c. Operations of the copy light emitting elements CED1c, CED2c, CED3c, and CED4c may be controlled by one of the first pixel circuits PDC1a, PDC1b, and PDC1c of FIG. 10A for controlling the operation of the first light emitting unit EDU1. Copy light emitting elements CED1c, CED2c, CED3c, and CED4c may include a first copy light emitting element CED1c disposed in the first connection area CP1, a second copy light emitting element CED2c disposed in a second connection area CP2, a third copy light emitting element CED3c disposed in the third connection area CP3, and a fourth copy light emitting element CED4c disposed in the fourth connection area CP4.

The first to fourth copy light emitting elements CED1c, CED2c, CED3c, and CED4c may be electrically connected to the second light emitting element ED1g. Accordingly, the first to fourth copy light emitting elements CED1c, CED2c, CED3c, and CED4c may simultaneously emit light with the second light emitting element ED1g. The second light emitting element ED1g and the first to fourth copy light emitting elements CED1c, CED2c, CED3c, and CED4c may emit green light. In another example, the second to fourth copy light emitting elements CED2c, CED3c, and CED4c may be electrically connected to the second light emitting element ED1g. Accordingly, the second to fourth copy light emitting elements CED2c, CED3c, and CED4c may simultaneously emit light with the second light emitting element ED1g.

The display panel DP of FIG. 4 may further include adjacent copy light emitting elements NEDg1, NEDg2, NEDg3, and NEDg4 disposed adjacent to the first copy light emitting unit CEDU1c. In each of the first to fourth connection areas CP1, CP2, CP3, and CP4, one copy light emitting element CED1c, CED2c, CED3c, or CED4c among the copy light emitting elements CED1c, CED2c, CED3c, and CED4c and one adjacent copy light emitting element NEDg1, NEDg2, NEDg3, or NEDg4 among the adjacent copy light emitting elements NEDg1, NEDg2, NEDg3, and NEDg4 may be disposed. For example, two copy light emitting elements may be disposed in each of the first to fourth connection areas CP1, CP2, CP3, and CP4.

Figure 20:
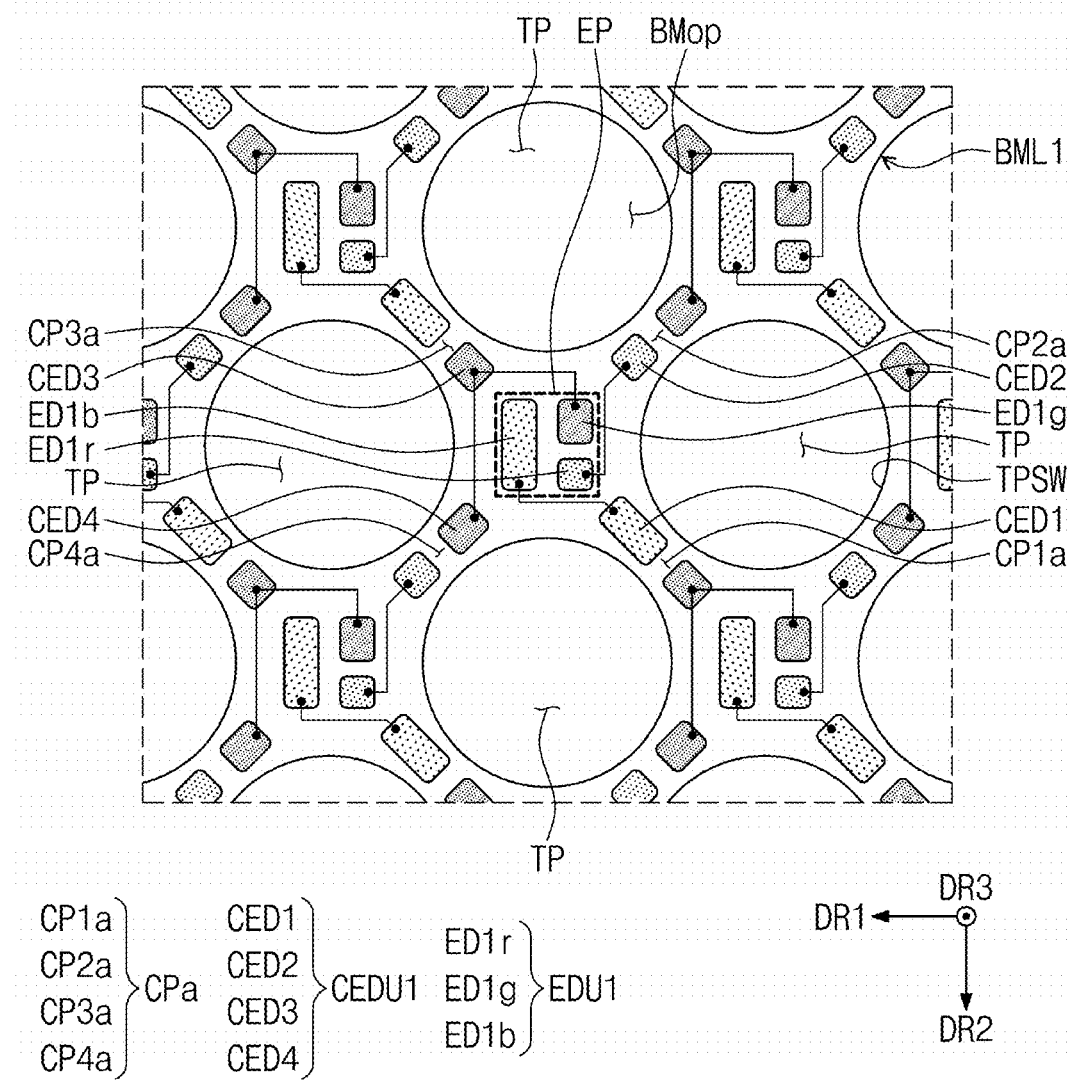
FIG. 20 is a schematic enlarged plan view of a partial area of a display panel according to an embodiment.

FIG. 20 is a schematic enlarged plan view of a partial area of a display panel according to an embodiment.

The structure of FIG. 20 may be a structure in which the structure shown in FIG. 14 is vertically inverted. The connection areas CPa may include a first connection area CP1a adjacent to the first light emitting element ED1r, a second connection area CP2a adjacent to the second light emitting element ED1g, and third and fourth connection areas CP3a and CP4a adjacent to the third light emitting element ED1b. The first to fourth connection areas CP1a, CP2a, CP3a, and CP4a may be sequentially defined in a counterclockwise direction based on the element area EP. The contents described with reference to FIGS. 14, 17, 18, and 19 may also be applied to the embodiment shown in FIG. 20.

Figure 21:
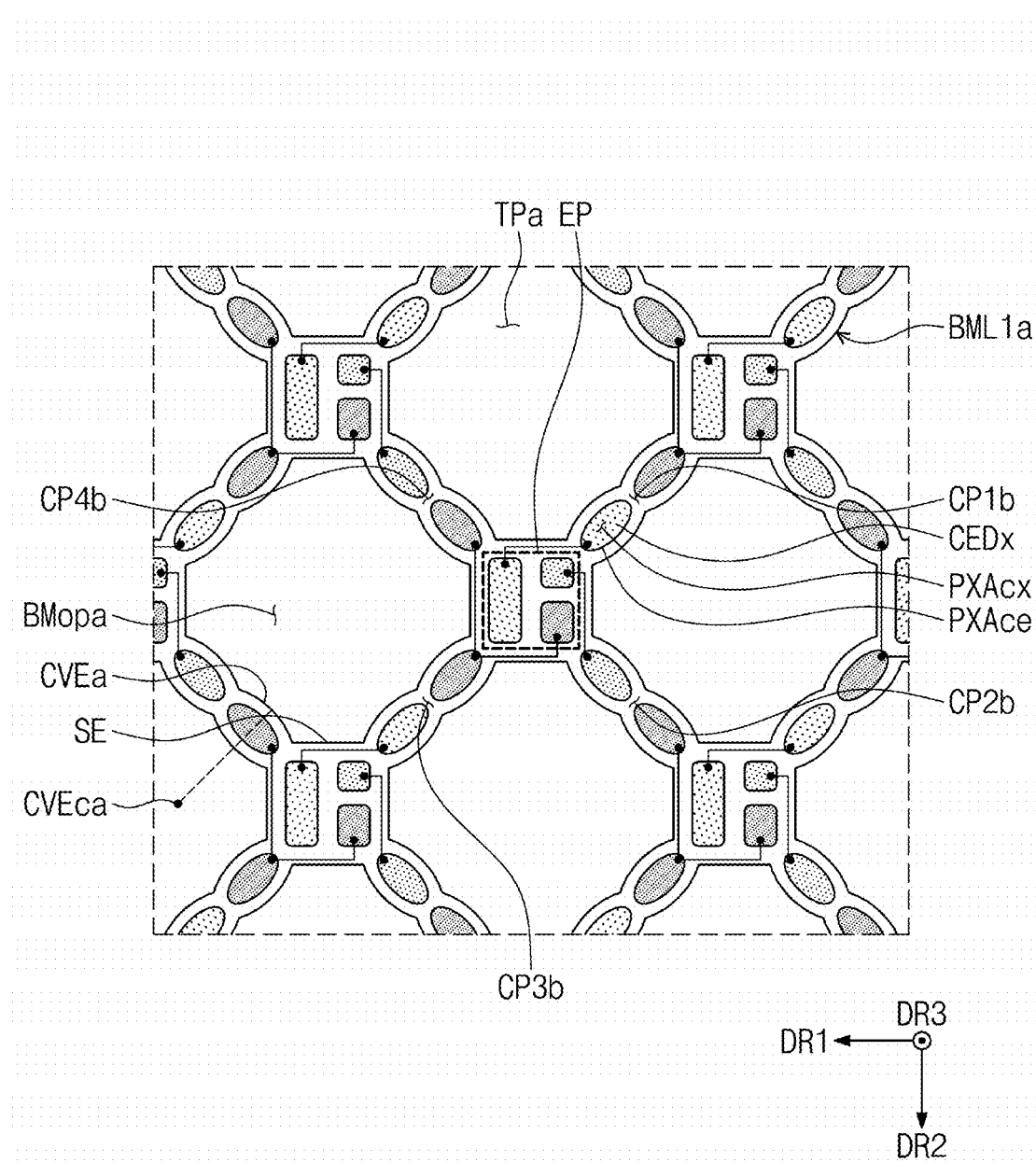
FIG. 21 is a schematic enlarged plan view of a partial area of a display panel according to an embodiment.

FIG. 21 is a schematic enlarged plan view of a partial area of a display panel according to an embodiment.

Referring to FIG. 21, a first opening BMopa overlapping the transmissive area TPa may be defined in the first lower light blocking layer BML1a. When viewed in a plan view, the first opening BMopa may include curved edge portions CVEa and straight edge portions SE. The curved edge portion CVEa may have a shape protruding (or convex) toward the center portion of the first opening BMopa. The center point of curvature CVEca of the curved edge portion CVEa may not overlap the corresponding first opening BMopa. The center point of curvature CVEca of the curved edge portion CVEa may overlap another first opening BMopa spaced apart from the corresponding first opening BMopa. In another embodiment, the straight edge portions SE may be provided as curved edge portions. For example, the straight edge portions SE may be replaced with curved edge portions having a concave shape with respect to the center portion of the first opening BMopa.

When viewed in a plan view, the edge portion of the transmissive area TPa may correspond to the curved edge portions CVEa and the straight edge portions SE of the first opening BMopa. Accordingly, an edge portion of the transmissive area TPa may include curved edge portions CVEa. FIG. 21 shows a center point of curvature CVEca for a curved edge portion CVEa. The center point of curvature CVEca may not overlap the corresponding transmissive area TPa. For example, the centers of curvature of the curved edge portions CVEa may not overlap the corresponding transmissive area TPa.

The emission area PXAcx may have a shape corresponding to the shape of the first to fourth connection areas CP1b, CP2b, CP3b, and CP4b. Accordingly, the area of the emission area PXAcx may be maximized within a limited area. An emission area PXAcx defined in each of the copy light emitting elements CEDx may have a curved edge portion PXAce. The emission area PXAcx may have an elliptical shape or a circular shape. However, this is only an example, and the emission area PXAcx may have a distorted circular shape.

An area of the first opening BMopa may be greater than an area of the first opening BMop illustrated in FIG. 14. Accordingly, the area of the transmissive area TPa may be further increased. Accordingly, the transmittance of the first area A1 of FIG. 4 may be improved. For example, as the first opening BMopa may include the curved edge portions CVEa, the lengths of the straight edge portions SE may be reduced. Accordingly, a phenomenon in which light passing through the transmissive area TPa is diffracted by the first lower light blocking layer BML1a may be reduced. Accordingly, the effect of improving the performance of the camera module CMM of FIG. 12 disposed to overlap the first area A1 may be derived.

Figure 22:
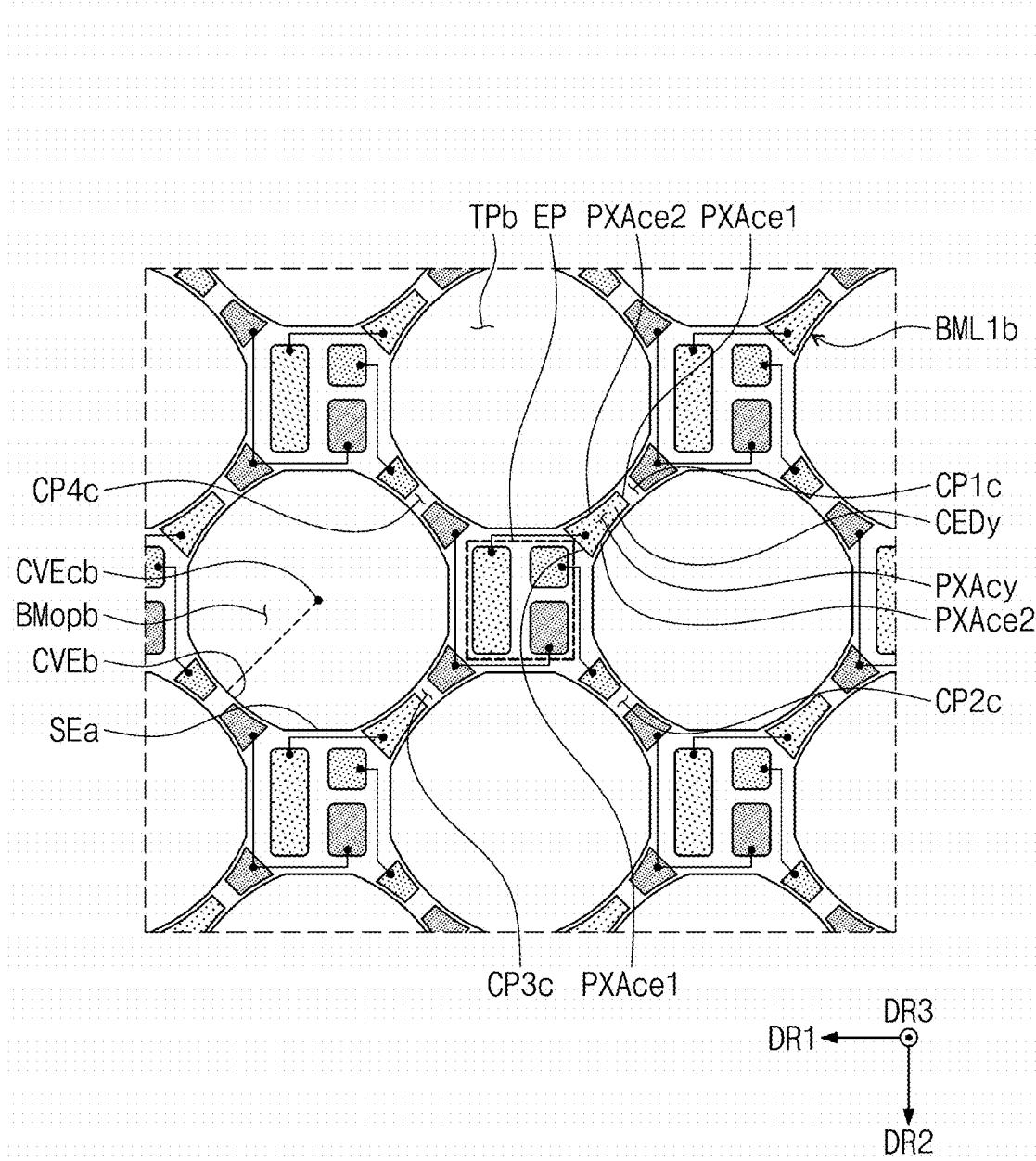
FIG. 22 is a schematic enlarged plan view of a partial area of a display panel according to an embodiment.

FIG. 22 is a schematic enlarged plan view of a partial area of a display panel according to an embodiment.

Referring to FIG. 22, a first opening BMopb overlapping the transmissive area TPb may be defined in the first lower light blocking layer BML1b. When viewed in a plan view, the first opening BMopb may include curved edge portions CVEb and straight edge portions SEa. The center point of curvature CVEcb of the curved edge portion CVEb may overlap the corresponding first opening BMopb. The curved edge portion CVEb may have a concave shape with respect to the center of the first opening BMopb.

When viewed in a plan view, the edge portion of the transmissive area TPb may correspond to the curved edge portions CVEb and the straight edge portions SEa of the first opening BMopb. Accordingly, an edge portion of the transmissive area TPb may include curved edge portions CVEb, and a center point of curvature CVEcb of each of the curved edge portions CVEb may overlap a corresponding transmissive area TPb. An area of the first opening BMopb may be greater than an area of the first opening BMop illustrated in FIG. 14. Accordingly, the area of the transmissive area TPb may be further increased. Accordingly, the transmittance of the first area A1 of FIG. 4 may be improved.

The emission area PXAcy defined in each of the copy light emitting elements CEDy may have an irregular shape corresponding to the shapes of the first to fourth connection areas CP1c, CP2c, CP3c, and CP4c. For example, the emission area PXAcy defined in each of the copy light emitting elements CEDy may include straight edge portions PXAce1 and curved edge portions PXAce2 connected to the straight edge portions PXAce1. Accordingly, the area of the emission area PXAcy may be maximized within a limited area.

Figure 23:
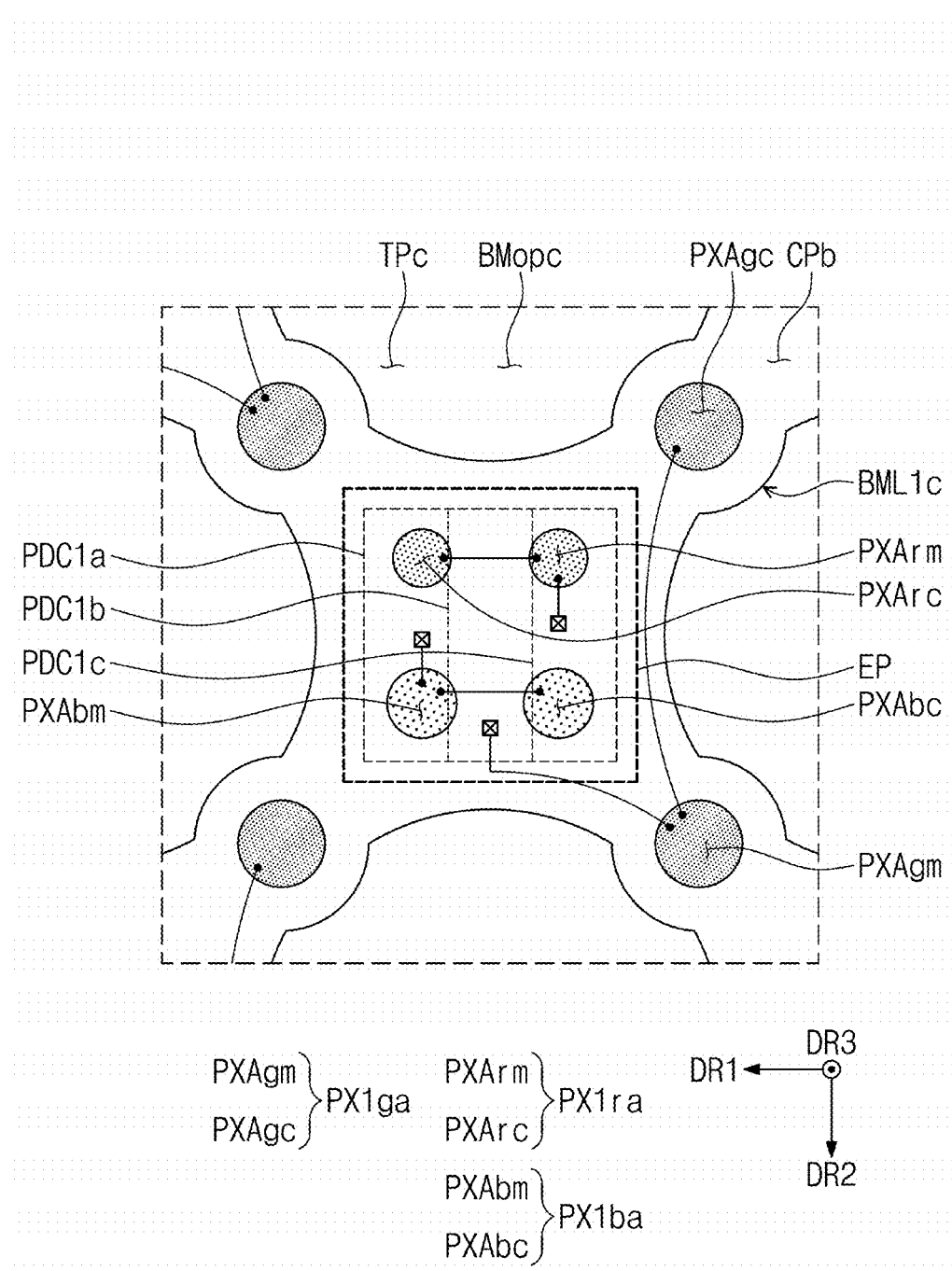
FIG. 23 is a schematic enlarged plan view of a partial area of a display panel according to an embodiment.

FIG. 23 is a schematic enlarged plan view of a partial area of a display panel according to an embodiment.

Referring to FIG. 23, a first opening BMopc defining a transmissive area TPc may be defined in the first lower light blocking layer BML1c.

The first pixel circuits PDC1a, PDC1b, and PDC1c may be disposed in the element area EP. Emission of the first color pixel PX1ra may be controlled by a first pixel circuit PDC1c (or referred to as a first-third pixel circuit), and the first color pixel PX1ra may include a first emission area PXArm and a first copy emission area PXArc. Emission of the second color pixel PX1ga may be controlled by a first pixel circuit PDC1b (or referred to as a first-second pixel circuit), and the second color pixel PX1ga may include a second emission area PXAgm and a second copy emission area PXAgc. Emission of the third color pixel PX1ba may be controlled by a first pixel circuit PDC1a (or referred to as a first-first pixel circuit), and the third color pixel PX1ba may include a third emission area PXAbm and a third copy emission area PXAbc.

The first color pixel PX1ra, the second color pixel PX1ga, and the third color pixel PX1ba may emit different colors of light. For example, the first color pixel PX1ra may emit red light, the second color pixel PX1ga may emit green light, and the third color pixel PX1ba may emit blue light.

In an embodiment, the first emission area PXArm, the first copy emission area PXArc, the third emission area PXAbm, and the third copy emission area PXAbc may be all disposed in the element area EP, and the second emission area PXAgm and the second copy emission area PXAgc may be disposed in the connection area CPb.

Each of the emission areas may be defined in a corresponding light emitting element. In an embodiment, a light emitting element emitting red light and a light emitting element emitting blue light may be disposed in the element area EP, and a light emitting element emitting green light may be disposed in the connection area CPb. In case that an emission area or a copy emission area arranged in the element area EP and an emission area or a copy emission area arranged in the connection area CPb emit different colors of light, the arrangement relationship of the light emitting elements may be variously modified.

Figure 24:
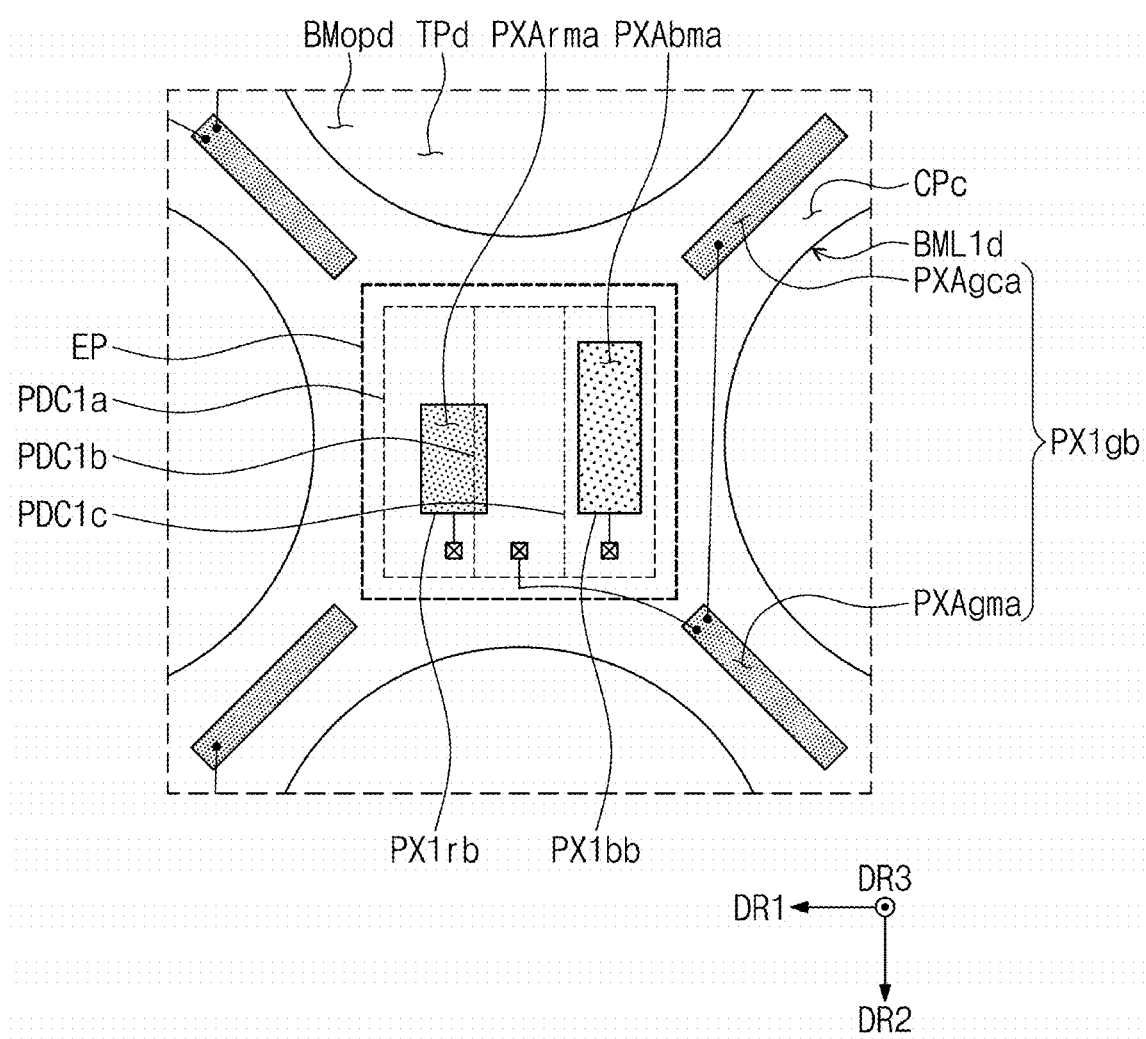
FIG. 24 is a schematic enlarged plan view of a partial area of a display panel according to an embodiment.

FIG. 24 is a schematic enlarged plan view of a partial area of a display panel according to an embodiment.

Referring to FIG. 24, a first opening BMopd defining a transmissive area TPd may be defined in the first lower light blocking layer BML1d.

The first pixel circuits PDC1a, PDC1b, and PDC1c may be disposed in the element area EP. Emission of the first color pixel PX1rb may be controlled by the first pixel circuit PDC1a and the first color pixel PX1rb may include a first emission area PXArma. Emission of the second color pixel PX1gb may be controlled by the first pixel circuit PDC1b and the second color pixel PX1gb may include a second emission area PXAgma and a second copy emission area PXAgca. Emission of the third color pixel PX1bb may be controlled by the first pixel circuit PDC1c and the third color pixel PX1bb may include a third emission area PXAbm.

In an embodiment, the first emission area PXArma and the third emission area PXAbma may be disposed in the element area EP, and the second emission area PXAgma and the second copy emission area PXAgca may be disposed in the connection area CPc. Accordingly, according to an embodiment, the emission areas disposed in the element area EP and the emission areas disposed in the connection area CPc may emit different colors of light.

As described above, each of the light emitting elements may be adjacent to at least one copy light emitting element in the first area of the display panel. A light emitting element and a copy light emitting element adjacent to each other may emit different colors of light. As a light emitting element and a copy light emitting element, which emit light of the same color as each other, are disposed spaced apart from each other, the roughness index of the image may be improved, and the display quality of the display panel may be improved.

The shape of the first opening of the first lower light blocking layer defining the transmissive area may include a curved edge portion. Accordingly, a phenomenon in which light passing through the transmissive area is diffracted by the first lower light blocking layer may be reduced. For example, the transmittance of the first area may be improved by changing the shape of the first opening of the first lower light blocking layer to increase the area of the transmissive area. Accordingly, the effect of improving the performance of the electronic module disposed to overlap the first area may be derived.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. An electronic device comprising:
a display panel comprising:
a first area including a transmissive area, an element area, and a plurality of connection areas extending from the element area, and
a second area spaced apart from the first area, wherein
the display panel comprises:
a first light emitting unit disposed in the element area and including a first light emitting element, a second light emitting element, and a third light emitting element; and
a first copy light emitting unit disposed in the plurality of connection areas and including a plurality of copy light emitting elements, the first copy light emitting unit that operates in synchronization with the first light emitting unit,
the plurality of connection areas comprise:
a first connection area adjacent to the first light emitting element,
a second connection area adjacent to the second light emitting element, and
a third connection area and a fourth connection area both adjacent to the third light emitting element, and
an emission color of the first light emitting element is different from an emission color of a first copy light emitting element of the plurality of copy light emitting elements disposed in the first connection area.

2. The electronic device of claim 1, wherein
the first copy light emitting element is electrically connected to the third light emitting element, and
the first copy light emitting element and the third light emitting element are configured to emit light simultaneously.

3. The electronic device of claim 1, wherein the plurality of copy light emitting elements further comprise:
a second copy light emitting element disposed in the second connection area,
a third copy light emitting element disposed in the third connection area, and
a fourth copy light emitting element disposed in the fourth connection area.

4. The electronic device of claim 3, wherein
the second copy light emitting element is electrically connected to the first light emitting element, and
the second copy light emitting element and the first light emitting element are configured to emit light simultaneously.

5. The electronic device of claim 3, wherein
the third copy light emitting element and the fourth copy light emitting element are electrically connected to the second light emitting element, and
the second light emitting element, the third copy light emitting element and the fourth copy light emitting element are configured to emit light simultaneously.

6. The electronic device of claim 3, wherein
the second copy light emitting element, the third copy light emitting element, and the fourth copy light emitting element are electrically connected to the second light emitting element, and
the second light emitting element, the second copy light emitting element, the third copy light emitting element, and the fourth copy light emitting element are configured to emit light simultaneously.

7. The electronic device of claim 6, wherein the second light emitting element, the second copy light emitting element, the third copy light emitting element, and the fourth copy light emitting element are configured to emit green light.

8. The electronic device of claim 1, wherein the plurality of copy light emitting elements further comprise:
a second copy light emitting element disposed in the second connection area, and
a third copy light emitting element disposed in one of the third connection area and the fourth connection area.

9. The electronic device of claim 8, wherein
the display panel further comprises:
a second light emitting unit disposed in another element area of the first area; and
a second copy light emitting unit that operates in synchronization with the second light emitting unit, and
the second copy light emitting unit comprises an adjacent copy light emitting element disposed in another one of the third connection area and the fourth connection area.

10. The electronic device of claim 9, wherein an emission color of the adjacent copy light emitting element and the emission color of the first light emitting element are same as each other.

11. The electronic device of claim 9, wherein an emission color of the adjacent copy light emitting element and an emission color of the third light emitting element are same as each other.

12. The electronic device of claim 11, wherein a connection line connecting the second light emitting element and the third copy light emitting element is disposed between the adjacent copy light emitting element and the third light emitting element.

13. The electronic device of claim 1, wherein
the display panel further comprises a plurality of adjacent copy light emitting elements disposed adjacent to the first copy light emitting unit, and
at least one of the plurality of copy light emitting elements and at least one of the plurality of adjacent copy light emitting elements are disposed in each of the first, second, third, and fourth connection areas.

14. The electronic device of claim 1, wherein
the display panel further comprises a plurality of adjacent copy light emitting elements disposed adjacent to the first copy light emitting unit,
one of the plurality of copy light emitting elements and one of the plurality of adjacent copy light emitting elements are disposed in two connection areas of the first, second, and third, and fourth connection areas,
another one of the plurality of copy light emitting elements is disposed in another connection area of the first, second, third, and fourth connection areas, and
another one of the plurality of adjacent copy light emitting elements is disposed in another connection area of the first, second, third, and fourth connection areas.

15. The electronic device of claim 14, wherein an emission color of the another one of the plurality of copy light emitting elements disposed in the another connection area and an emission color of the another one of the plurality of adjacent copy light emitting elements disposed in the other connection area are same as each other.

16. The electronic device of claim 14, wherein a maximum width of an emission area defined in the another one of the plurality of copy light emitting elements disposed in the another connection area is greater than a maximum width of an emission area defined in the one of the plurality of copy light emitting elements disposed in the two connection areas.

17. The electronic device of claim 1, wherein the display panel further comprises:
a base layer;
a barrier layer disposed on the base layer, the barrier layer including:
a first lower light blocking layer disposed in the first area, and
a second lower light blocking layer disposed in the second area; and
a circuit layer disposed on the barrier layer and disposed in the element area, the circuit layer including a first pixel circuit, a second pixel circuit, and a third pixel circuit, wherein
the first light emitting unit and the first copy light emitting unit are disposed on the circuit layer,
the first light emitting element is electrically connected to the first pixel circuit,
the second light emitting element is electrically connected to the second pixel circuit,
the third light emitting element is electrically connected to the third pixel circuit, and
an opening overlapping the transmissive area is formed in the first lower light blocking layer.

18. The electronic device of claim 17, wherein when viewed in a plan view, a sidewall of the first lower light blocking layer defining the opening has a rounded shape.

19. The electronic device of claim 17, wherein when viewed in a plan view, the opening is circular.

20. The electronic device of claim 17, wherein when viewed in a plan view,
the opening has a straight edge portion and a curved edge portion, and
a center of curvature of the curved edge portion overlaps the opening.

21. The electronic device of claim 17, wherein when viewed in a plan view,
the opening has a curved edge portion, and
a center of curvature of the curved edge portion does not overlap the opening.

22. The electronic device of claim 1, wherein an emission area defined in each of the plurality of copy light emitting elements has a curved edge portion.

23. The electronic device of claim 1, wherein an emission area defined in each of the plurality of copy light emitting elements comprises straight edge portions and curved edge portions connected to the straight edge portions.

24. An electronic device comprising:
a display panel comprising:
a first area including a transmissive area, an element area, and a plurality of connection areas extending from the element area, and
a second area spaced apart from the first area, wherein the display panel comprises:
a first light emitting unit disposed in the element area and including a first light emitting element, a second light emitting element, and a third light emitting element; and
a first copy light emitting unit including a plurality of copy light emitting elements disposed in the plurality of connection areas, and operating in synchronization with the first light emitting unit,
the plurality of connection areas comprise:
a first connection area adjacent to the first light emitting element,
a second connection area adjacent to the second light emitting element, and
a third connection area and a fourth connection area both adjacent to the third light emitting element,
the plurality of copy light emitting elements comprise:
a first copy light emitting element disposed in the first connection area,
a second copy light emitting element disposed in the second connection area, and
a third copy light emitting element disposed in one of the third connection area and the fourth connection area, and
the third copy light emitting element is electrically connected to the second light emitting element.

25. The electronic device of claim 24, wherein the first copy light emitting element and the second copy light emitting element are electrically connected to the second light emitting element.

26. The electronic device of claim 24, wherein
the first copy light emitting element is electrically connected to the third light emitting element, and
the second copy light emitting element is electrically connected to the first light emitting element.

27. The electronic device of claim 24, wherein the plurality of copy light emitting elements further comprise a fourth copy light emitting element disposed in another one of the third connection area and the fourth connection area.

28. The electronic device of claim 24, wherein when viewed in a plan view, the transmissive area is circular.

29. The electronic device of claim 24, wherein when viewed in a plan view,
an edge portion of the transmissive area comprises a straight edge portion and a curved edge portion, and
a center of curvature of the curved edge portion overlaps the transmissive area.

30. The electronic device of claim 24, wherein when viewed in a plan view,
an edge portion of the transmissive area comprises a plurality of curved edge portions, and
a center of curvature of each of the plurality of curved edge portions does not overlap the transmissive area.

31. The electronic device of claim 24, wherein an emission area defined in each of the plurality of copy light emitting elements has a curved edge portion.

32. The electronic device of claim 24, wherein an emission area defined in each of the plurality of copy light emitting elements comprises straight edge portions and curved edge portions connected to the straight edge portions.

* * * * *